(12) United States Patent
Amiri et al.

(10) Patent No.: US 12,432,881 B2
(45) Date of Patent: Sep. 30, 2025

(54) COMPACT FORM FACTOR COOLING ASSEMBLY RETENTION SYSTEM

(71) Applicant: Intel Corporation, Santa Clara, CA (US)

(72) Inventors: Shahin Amiri, Richmond Hill (CA); Mirui Wang, Oshawa (CA); Saman Nasirahmadi, Newmarket (CA); Ali Kalantarian, Richmond Hill (CA); Tejas Shah, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 672 days.

(21) Appl. No.: 17/711,007

(22) Filed: Mar. 31, 2022

(65) Prior Publication Data
US 2023/0320036 A1   Oct. 5, 2023

(51) Int. Cl.
*H05K 7/20* (2006.01)
*F16B 5/02* (2006.01)
*H05K 1/02* (2006.01)

(52) U.S. Cl.
CPC ............ *H05K 7/2039* (2013.01); *F16B 5/02* (2013.01); *H05K 1/0204* (2013.01); *H05K 7/20136* (2013.01)

(58) Field of Classification Search
CPC ............ H05K 7/2039; H05K 7/20136; H05K 1/0204; F16B 5/02
See application file for complete search history.

(56) References Cited

U.S. PATENT DOCUMENTS

| | | | | |
|---|---|---|---|---|
| 6,084,178 A | * | 7/2000 | Cromwell | H05K 9/0032 174/16.3 |
| 6,101,089 A | * | 8/2000 | Seto | H05K 7/142 361/800 |
| 6,639,800 B1 | * | 10/2003 | Eyman | H01L 23/4006 174/548 |
| 2012/0085527 A1 | * | 4/2012 | Pfaffinger | H05K 7/20445 165/185 |

* cited by examiner

*Primary Examiner* — Mukundbhai G Patel
(74) *Attorney, Agent, or Firm* — Compass IP Law PC

(57) ABSTRACT

An apparatus is described. The apparatus includes a bolt to be inserted through a first hole in a cooling mass, a second hole in a planar mechanical element and a third hole in an electronic circuit board when the first, second and third holes are aligned. The apparatus includes a first spring element to be coupled to the cooling mass and the bolt. The first spring element is to be deformed from its nominal shape when the bolt is fastened to the electronic circuit board to draw the base of the cooling mass toward the electronic circuit board. The second spring element is to be coupled to the planar mechanical element and the bolt. The second spring element is to be deformed from its nominal shape to draw the planar mechanical element toward the electronic circuit board.

20 Claims, 29 Drawing Sheets

GRAPHICS PROCESSOR COMMAND FORMAT
900

GRAPHICS PROCESSOR COMMAND SEQUENCE
910

COMPACT FORM FACTOR COOLING ASSEMBLY RETENTION SYSTEM

FIELD OF INVENTION

The field of invention pertains to the electrical and mechanical arts, and, more specifically, to a compact form factor cooling assembly retention system.

BACKGROUND

Thermal engineers face challenges, especially with respect to high performance data center computing, as both computers and networks continue to pack higher and higher levels of performance into smaller and smaller packages. Creative cooling solutions are therefore being designed to keep pace with the thermal requirements of such aggressively designed systems.

FIGURES

Figure 14A:
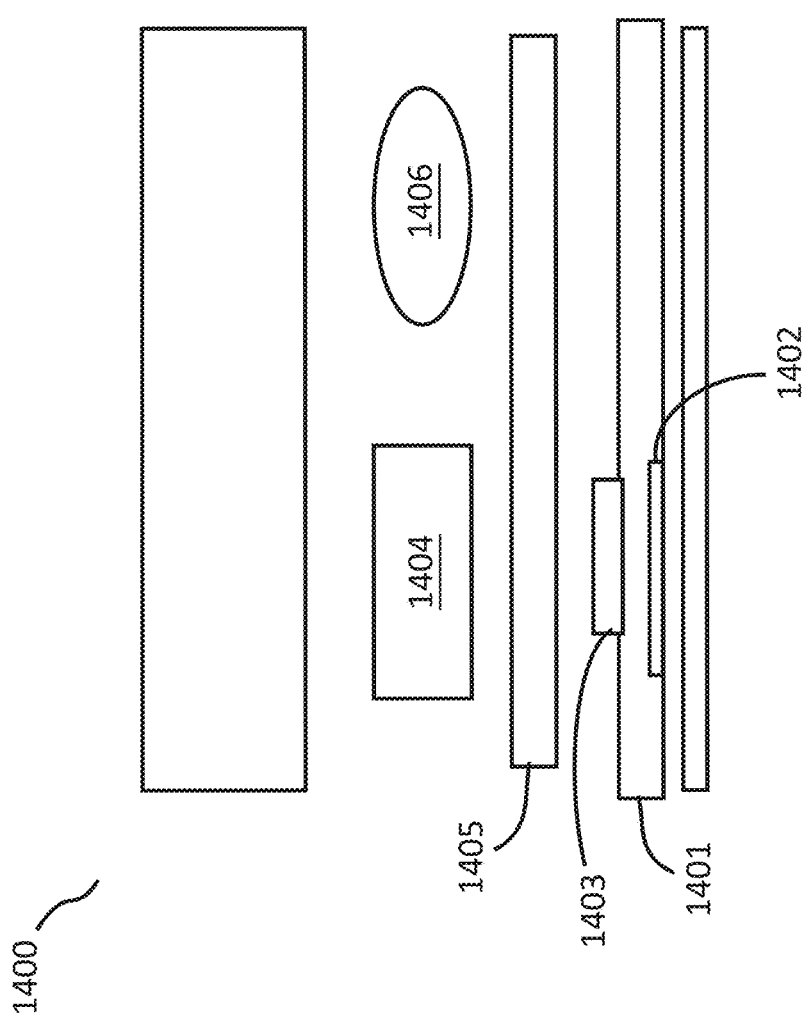
Figure 14B:
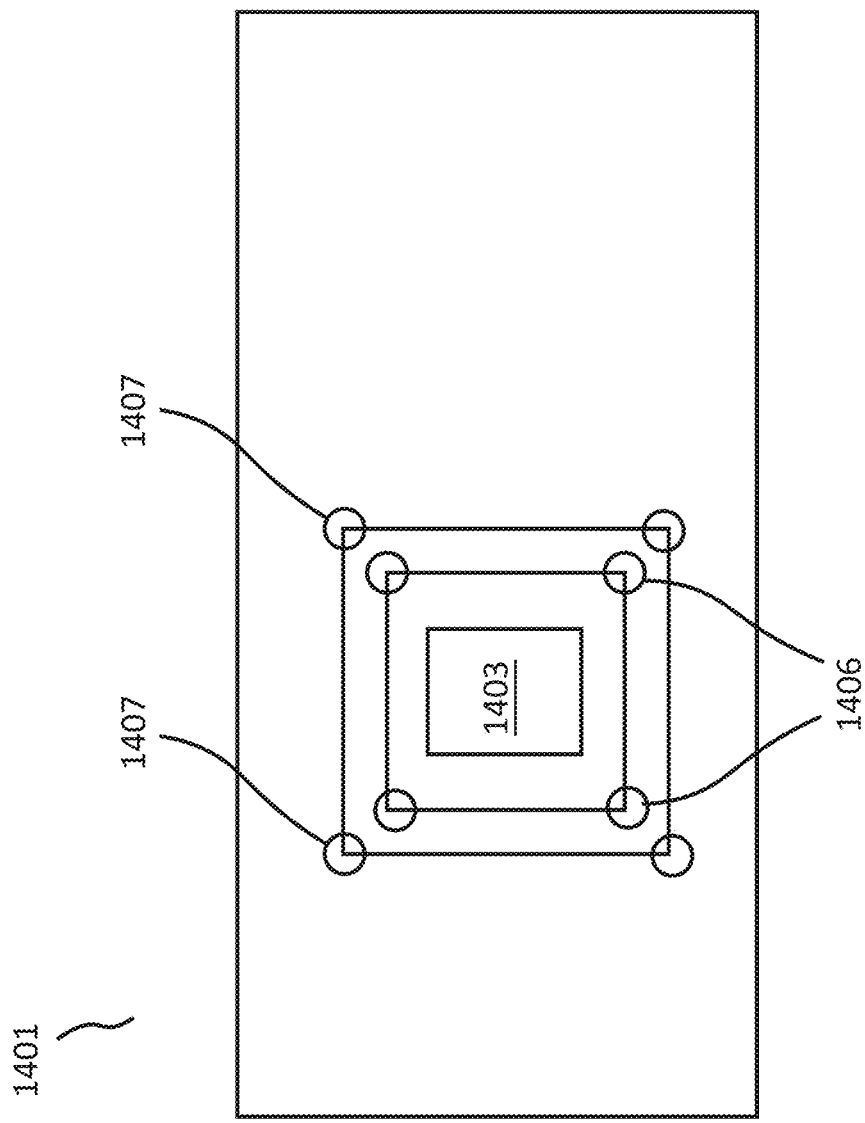
Figure 15:
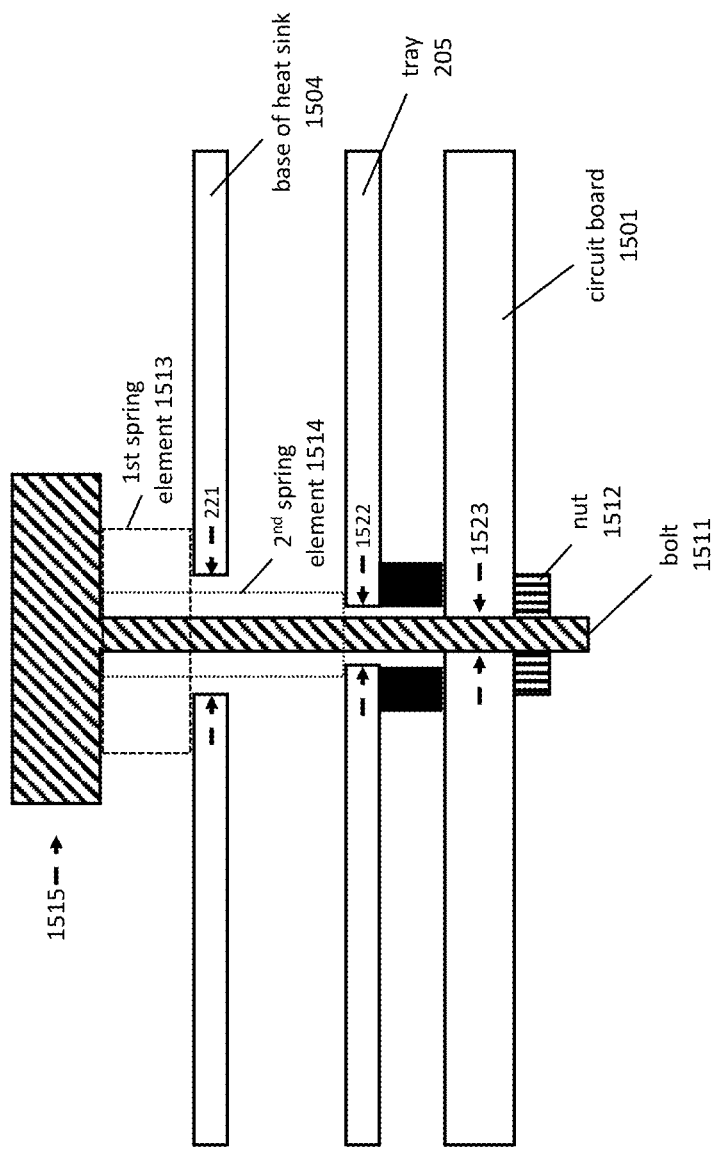
Figure 16:
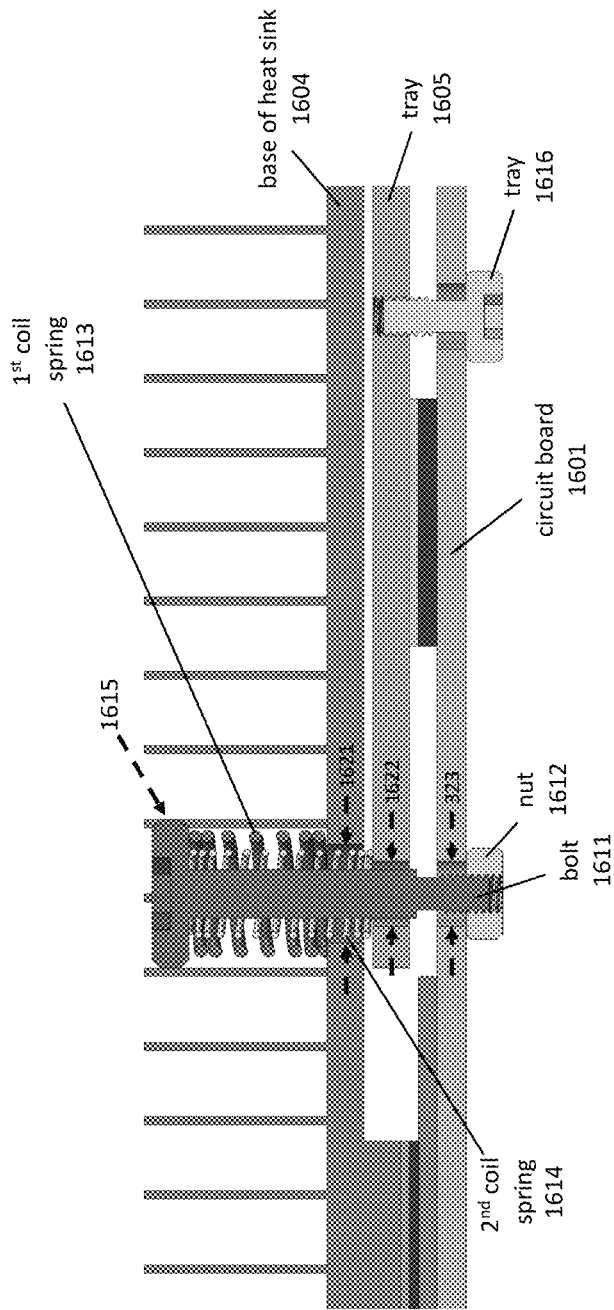
Figure 17:
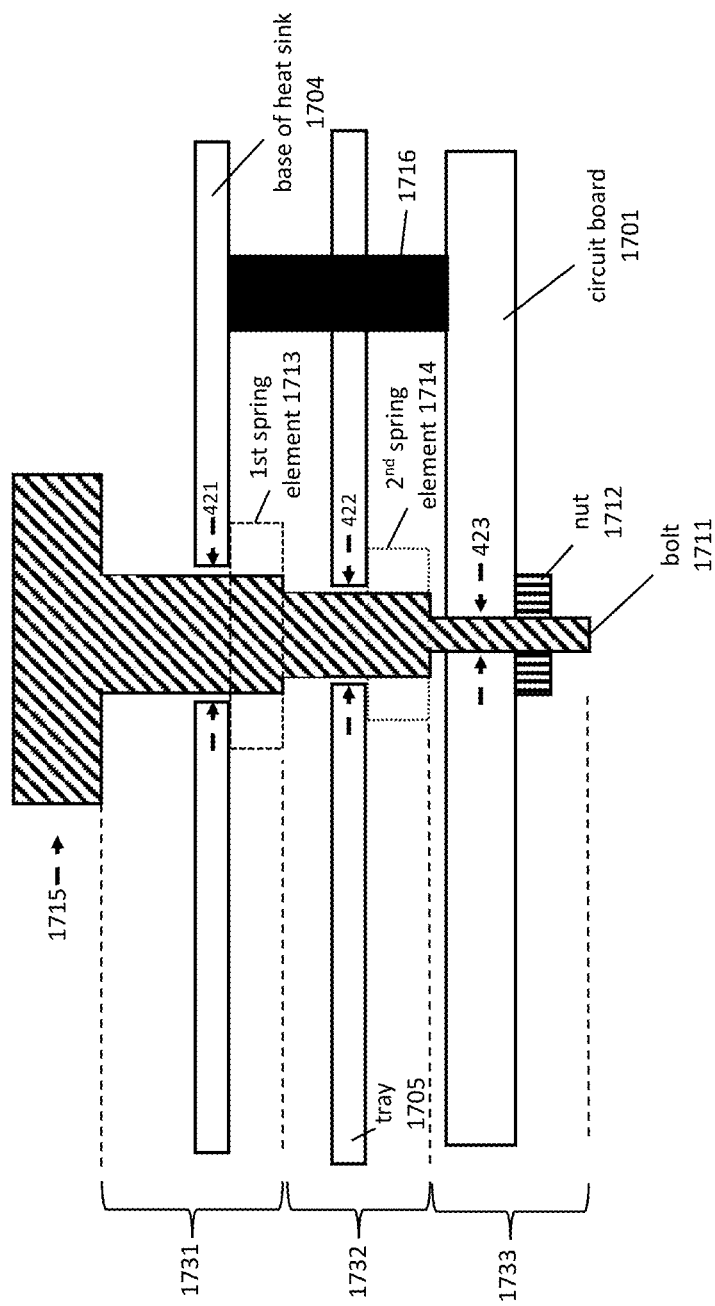

FIGS. 14a and 14b pertain to a prior art add-in card;

FIG. 15 shows improved point of attachment hardware;

FIG. 16 shows an embodiment of the approach of FIG. 15;

FIG. 17 shows another improved point of attachment hardware.

DETAILED DESCRIPTION

System Overview

Figure 1:
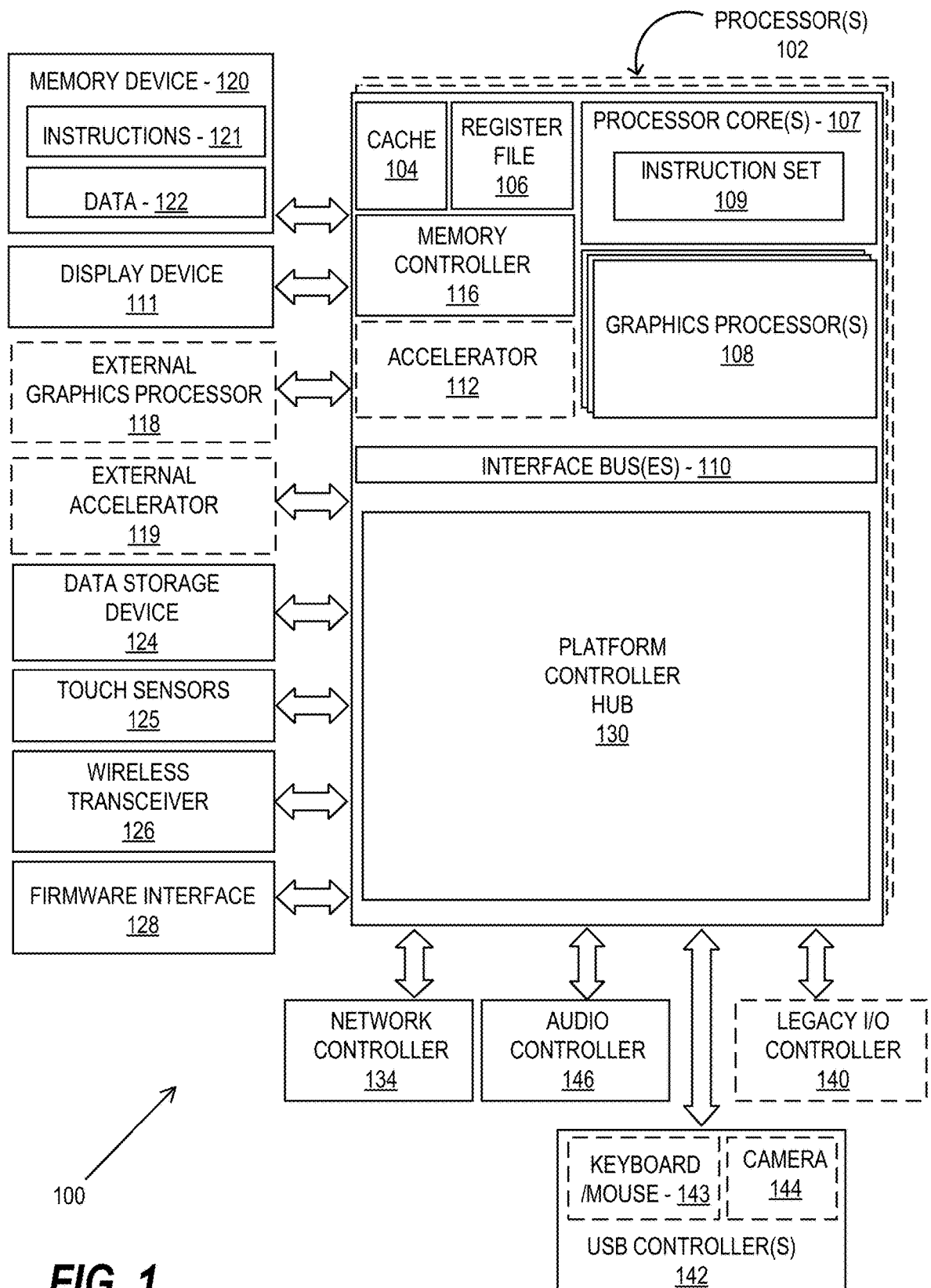
FIG. 1 is a block diagram of a processing system, according to an embodiment.

FIG. 1 is a block diagram of a processing system 100, according to an embodiment. Processing system 100 may be used in a single processor desktop system, a multiprocessor workstation system, or a server system having a large number of processors 102 or processor cores 107. In one embodiment, the processing system 100 is a processing platform incorporated within a system-on-a-chip (SoC) integrated circuit for use in mobile, handheld, or embedded devices such as within Internet-of-things (IoT) devices with wired or wireless connectivity to a local or wide area network.

In one embodiment, processing system 100 can include, couple with, or be integrated within: a server-based gaming platform; a game console, including a game and media console; a mobile gaming console, a handheld game console, or an online game console. In some embodiments the processing system 100 is part of a mobile phone, smart phone, tablet computing device or mobile Internet-connected device such as a laptop with low internal storage capacity. Processing system 100 can also include, couple with, or be integrated within: a wearable device, such as a smart watch wearable device; smart eyewear or clothing enhanced with augmented reality (AR) or virtual reality (VR) features to provide visual, audio or tactile outputs to supplement real world visual, audio or tactile experiences or otherwise provide text, audio, graphics, video, holographic images or video, or tactile feedback; other augmented reality (AR) device; or other virtual reality (VR) device. In some embodiments, the processing system 100 includes or is part of a television or set top box device. In one embodiment, processing system 100 can include, couple with, or be integrated within a self-driving vehicle such as a bus, tractor trailer, car, motor or electric power cycle, plane, or glider (or any combination thereof). The self-driving vehicle may use processing system 100 to process the environment sensed around the vehicle.

In some embodiments, the one or more processors 102 each include one or more processor cores 107 to process instructions which, when executed, perform operations for system or user software. In some embodiments, at least one of the one or more processor cores 107 is configured to process a specific instruction set 109. In some embodiments, instruction set 109 may facilitate Complex Instruction Set Computing (CISC), Reduced Instruction Set Computing (RISC), or computing via a Very Long Instruction Word (VLIW). One or more processor cores 107 may process a different instruction set 109, which may include instructions to facilitate the emulation of other instruction sets. Processor core 107 may also include other processing devices, such as a Digital Signal Processor (DSP).

In some embodiments, the processor 102 includes cache memory 104. Depending on the architecture, the processor 102 can have a single internal cache or multiple levels of internal cache. In some embodiments, the cache memory is shared among various components of the processor 102. In some embodiments, the processor 102 also uses an external cache (e.g., a Level-3 (L3) cache or Last Level Cache (LLC)) (not shown), which may be shared among processor cores 107 using known cache coherency techniques. A register file 106 can be additionally included in processor 102 and may include different types of registers for storing different types of data (e.g., integer registers, floating point registers, status registers, and an instruction pointer register). Some registers may be general-purpose registers, while other registers may be specific to the design of the processor 102.

In some embodiments, one or more processor(s) 102 are coupled with one or more interface bus(es) 110 to transmit communication signals such as address, data, or control signals between processor 102 and other components in the processing system 100. The interface bus 110, in one embodiment, can be a processor bus, such as a version of the Direct Media Interface (DMI) bus. However, processor busses are not limited to the DMI bus, and may include one or more Peripheral Component Interconnect buses (e.g., PCI, PCI express), memory busses, or other types of interface busses. In one embodiment the processor(s) 102 include a memory controller 116 and a platform controller hub 130. The memory controller 116 facilitates communication between a memory device and other components of the processing system 100, while the platform controller hub (PCH) 130 provides connections to I/O devices via a local I/O bus.

The memory device 120 can be a dynamic random-access memory (DRAM) device, a static random-access memory (SRAM) device, flash memory device, phase-change memory device, or some other memory device having suitable performance to serve as process memory. In one embodiment the memory device 120 can operate as system memory for the processing system 100, to store data 122 and instructions 121 for use when the one or more processors 102 executes an application or process. The memory controller 116 also couples with an optional external graphics processor 118, which may communicate with the one or more graphics processors 108 in processors 102 to perform graphics and media operations. In some embodiments, graphics, media, and or compute operations may be assisted by an accelerator 112 which is a coprocessor that can be configured to perform a specialized set of graphics, media, or compute operations. For example, in one embodiment the accelerator 112 is a matrix multiplication accelerator used to optimize machine learning or compute operations. In one embodiment the accelerator 112 is a ray-tracing accelerator that can be used to perform ray-tracing operations in concert with the graphics processor 108. In one embodiment, an external accelerator 119 may be used in place of or in concert with the accelerator 112.

In some embodiments a display device 111 can connect to the processor(s) 102. The display device 111 can be one or more of an internal display device, as in a mobile electronic device or a laptop device or an external display device attached via a display interface (e.g., DisplayPort, etc.). In one embodiment the display device 111 can be a head mounted display (HMD) such as a stereoscopic display device for use in virtual reality (VR) applications or augmented reality (AR) applications.

In some embodiments the platform controller hub 130 enables peripherals to connect to memory device 120 and processor 102 via a high-speed I/O bus. The I/O peripherals include, but are not limited to, an audio controller 146, a network controller 134, a firmware interface 128, a wireless transceiver 126, touch sensors 125, a data storage device 124 (e.g., non-volatile memory, volatile memory, hard disk drive, flash memory, NAND, 3D NAND, 3D XPoint, etc.). The data storage device 124 can connect via a storage interface (e.g., SATA) or via a peripheral bus, such as a Peripheral Component Interconnect bus (e.g., PCI, PCI express). The touch sensors 125 can include touch screen sensors, pressure sensors, or fingerprint sensors. The wireless transceiver 126 can be a Wi-Fi transceiver, a Bluetooth transceiver, or a mobile network transceiver such as a 3G, 4G, 5G, or Long-Term Evolution (LTE) transceiver. The firmware interface 128 enables communication with system firmware, and can be, for example, a unified extensible firmware interface (UEFI). The network controller 134 can enable a network connection to a wired network. In some embodiments, a high-performance network controller (not shown) couples with the interface bus 110. The audio controller 146, in one embodiment, is a multi-channel high-definition audio controller. In one embodiment the processing system 100 includes an optional legacy I/O controller 140 for coupling legacy (e.g., Personal System 2 (PS/2)) devices to the system. The platform controller hub 130 can also connect to one or more Universal Serial Bus (USB) controllers 142 connect input devices, such as keyboard and mouse 143 combinations, a camera 144, or other USB input devices.

It will be appreciated that the processing system 100 shown is exemplary and not limiting, as other types of data processing systems that are differently configured may also be used. For example, an instance of the memory controller 116 and platform controller hub 130 may be integrated into a discreet external graphics processor, such as the external graphics processor 118. In one embodiment the platform controller hub 130 and/or memory controller 116 may be external to the one or more processor(s) 102 and reside in a system chipset that is in communication with the processor(s) 102.

For example, circuit boards ("sleds") can be used on which components such as CPUs, memory, and other components are placed are designed for increased thermal performance. In some examples, processing components such as the processors are located on a top side of a sled while near memory, such as DIMMs, are located on a bottom side of the sled. As a result of the enhanced airflow provided by this design, the components may operate at higher frequencies and power levels than in typical systems, thereby increasing performance. Furthermore, the sleds are configured to blindly mate with power and data communication cables in a rack, thereby enhancing their ability to be quickly removed, upgraded, reinstalled, and/or replaced. Similarly, individual components located on the sleds, such as processors, accelerators, memory, and data storage drives, are configured to be easily upgraded due to their increased spacing from each other. In the illustrative embodiment, the components additionally include hardware attestation features to prove their authenticity.

A data center can utilize a single network architecture ("fabric") that supports multiple other network architectures including Ethernet and Omni-Path. The sleds can be coupled to switches via optical fibers, which provide higher bandwidth and lower latency than typical twisted pair cabling (e.g., Category 5, Category 5e, Category 6, etc.). Due to the high bandwidth, low latency interconnections and network architecture, the data center may, in use, pool resources, such as memory, accelerators (e.g., GPUs, graphics accelerators, FPGAs, ASICs, neural network and/or artificial intelligence accelerators, etc.), and data storage drives that are physically disaggregated, and provide them to compute resources (e.g., processors) on an as needed basis, enabling the compute resources to access the pooled resources as if they were local.

A power supply or source can provide voltage and/or current to processing system 100 or any component or system described herein. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

FIGS. 2A-2D illustrate computing systems and graphics processors provided by embodiments described herein. The elements of FIGS. 2A-2D having the same reference numbers (or names) as the elements of any other figure herein can operate or function in any manner similar to that described elsewhere herein, but are not limited to such.

Figure 2A:
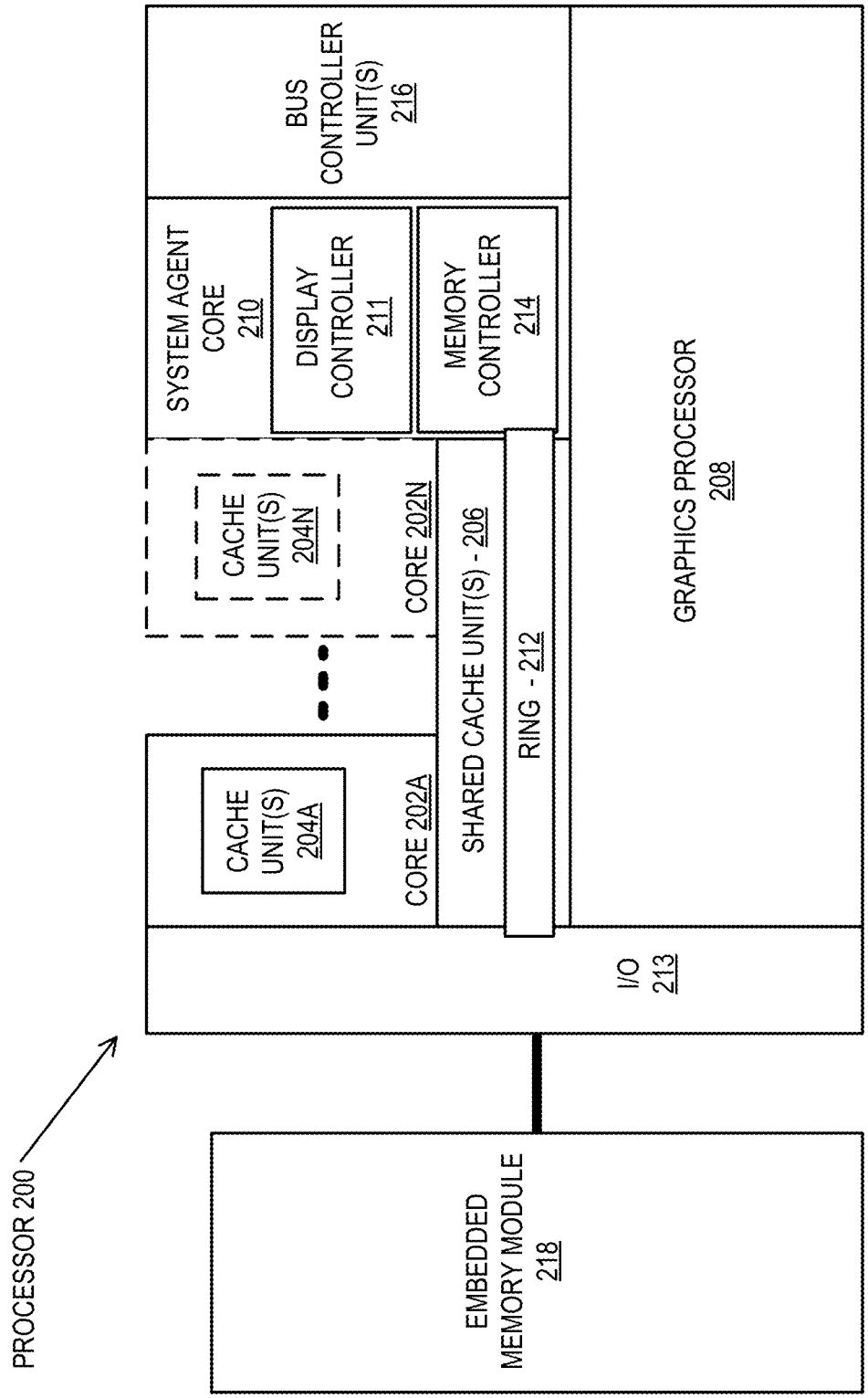
FIG. 2A is a block diagram of an embodiment of a processor having one or more processor cores, an integrated memory controller, and an integrated graphics processor.

FIG. 2A is a block diagram of an embodiment of a processor 200 having one or more processor cores 202A-202N, an integrated memory controller 214, and an integrated graphics processor 208. Processor 200 can include additional cores up to and including additional core 202N represented by the dashed lined boxes. Each of processor cores 202A-202N includes one or more internal cache units 204A-204N. In some embodiments each processor core also has access to one or more shared cached units 206. The internal cache units 204A-204N and shared cache units 206 represent a cache memory hierarchy within the processor 200. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 206 and 204A-204N.

In some embodiments, processor 200 may also include a set of one or more bus controller units 216 and a system agent core 210. The one or more bus controller units 216 manage a set of peripheral buses, such as one or more PCI or PCI express busses. System agent core 210 provides management functionality for the various processor components. In some embodiments, system agent core 210 includes one or more integrated memory controllers 214 to manage access to various external memory devices (not shown).

In some embodiments, one or more of the processor cores 202A-202N include support for simultaneous multi-threading. In such embodiment, the system agent core 210 includes components for coordinating and operating cores 202A-202N during multi-threaded processing. System agent core 210 may additionally include a power control unit (PCU), which includes logic and components to regulate the power state of processor cores 202A-202N and graphics processor 208.

In some embodiments, processor 200 additionally includes graphics processor 208 to execute graphics processing operations. In some embodiments, the graphics processor 208 couples with the set of shared cache units 206, and the system agent core 210, including the one or more integrated memory controllers 214. In some embodiments, the system agent core 210 also includes a display controller 211 to drive graphics processor output to one or more coupled displays. In some embodiments, display controller 211 may also be a separate module coupled with the graphics processor via at least one interconnect, or may be integrated within the graphics processor 208.

In some embodiments, a ring-based interconnect 212 is used to couple the internal components of the processor 200. However, an alternative interconnect unit may be used, such as a point-to-point interconnect, a switched interconnect, a mesh interconnect, or other techniques, including techniques well known in the art. In some embodiments, graphics processor 208 couples with the ring-based interconnect 212 via an I/O link 213.

The exemplary I/O link 213 represents at least one of multiple varieties of I/O interconnects, including an on package I/O interconnect which facilitates communication between various processor components and a high-performance embedded memory module 218, such as an eDRAM module or a high-bandwidth memory (HBM) module. In some embodiments, each of the processor cores 202A-202N and graphics processor 208 can use the embedded memory module 218 as a shared Last Level Cache.

In some embodiments, processor cores 202A-202N are homogenous cores executing the same instruction set architecture. In another embodiment, processor cores 202A-202N are heterogeneous in terms of instruction set architecture (ISA), where one or more of processor cores 202A-202N execute a first instruction set, while at least one of the other cores executes a subset of the first instruction set or a different instruction set. In one embodiment, processor cores 202A-202N are heterogeneous in terms of microarchitecture, where one or more cores having a relatively higher power consumption couple with one or more power cores having a lower power consumption. In one embodiment, processor cores 202A-202N are heterogeneous in terms of computational capability. Additionally, processor 200 can be implemented on one or more chips or as an SoC integrated circuit having the illustrated components, in addition to other components.

Figure 2B:
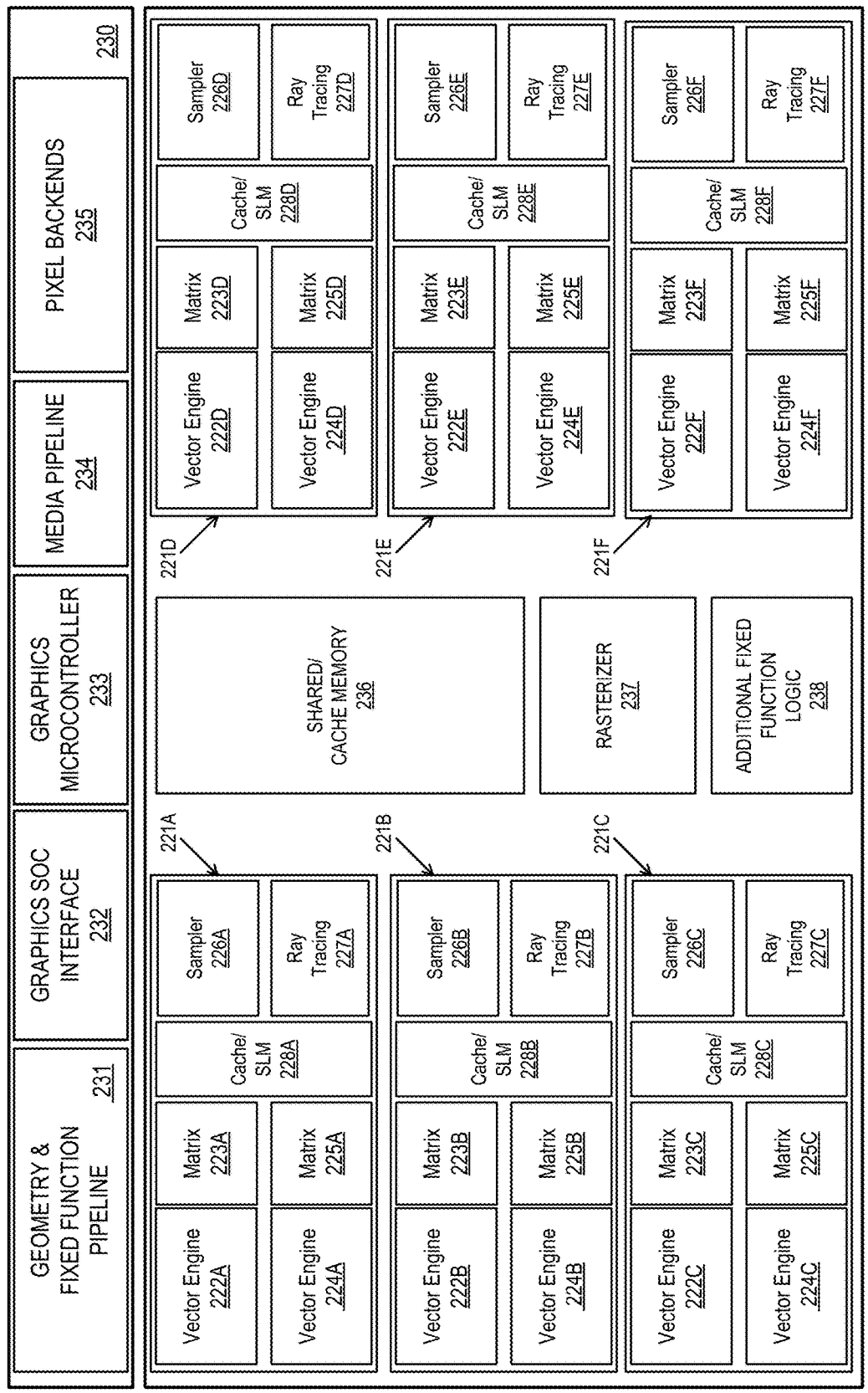
FIG. 2B is a block diagram of hardware logic of a graphics processor core block, according to some embodiments described herein.

FIG. 2B is a block diagram of hardware logic of a graphics processor core block 219, according to some embodiments described herein. In some embodiments, elements of FIG. 2B having the same reference numbers (or names) as the elements of any other figure herein may operate or function in a manner similar to that described elsewhere herein. The graphics processor core block 219 is exemplary of one partition of a graphics processor. The graphics processor core block 219 can be included within the integrated graphics processor 208 of FIG. 2A or a discrete graphics processor, parallel processor, and/or compute accelerator. A graphics processor as described herein may include multiple graphics core blocks based on target power and performance envelopes. Each graphics processor core block 219 can include a function block 230 coupled with multiple graphics cores 221A-221F that include modular blocks of fixed function logic and general-purpose programmable logic. The graphics processor core block 219 also includes shared/cache memory 236 that is accessible by all graphics cores 221A-221F, rasterizer logic 237, and additional fixed function logic 238.

In some embodiments, the function block 230 includes a geometry/fixed function pipeline 231 that can be shared by all graphics cores in the graphics processor core block 219. In various embodiments, the geometry/fixed function pipeline 231 includes a 3D geometry pipeline a video front-end unit, a thread spawner and global thread dispatcher, and a unified return buffer manager, which manages unified return buffers. In one embodiment the function block 230 also includes a graphics SoC interface 232, a graphics microcontroller 233, and a media pipeline 234. The graphics SoC interface 232 provides an interface between the graphics processor core block 219 and other core blocks within a graphics processor or compute accelerator SoC. The graphics microcontroller 233 is a programmable sub-processor that is configurable to manage various functions of the graphics processor core block 219, including thread dispatch, scheduling, and pre-emption. The media pipeline 234 includes logic to facilitate the decoding, encoding, pre-processing, and/or post-processing of multimedia data, including image and video data. The media pipeline 234 implement media operations via requests to compute or sampling logic within the graphics cores 221-221F. One or more pixel backends 235 can also be included within the function block 230. The pixel backends 235 include a cache memory to store pixel color values and can perform blend operations and lossless color compression of rendered pixel data.

In one embodiment the graphics SoC interface 232 enables the graphics processor core block 219 to communicate with general-purpose application processor cores (e.g., CPUs) and/or other components within an SoC or a system host CPU that is coupled with the SoC via a peripheral interface. The graphics SoC interface 232 also enables communication with off-chip memory hierarchy elements such as a shared last level cache memory, system RAM, and/or embedded on-chip or on-package DRAM. The SoC interface 232 can also enable communication with fixed function devices within the SoC, such as camera imaging pipelines, and enables the use of and/or implements global memory atomics that may be shared between the graphics processor core block 219 and CPUs within the SoC. The graphics SoC interface 232 can also implement power management controls for the graphics processor core block 219 and enable an interface between a clock domain of the graphics processor core block 219 and other clock domains within the SoC. In one embodiment the graphics SoC interface 232 enables receipt of command buffers from a command streamer and global thread dispatcher that are configured to provide commands and instructions to each of one or more graphics cores within a graphics processor. The commands and instructions can be dispatched to the media pipeline 234 when media operations are to be performed, the geometry and fixed function pipeline 231 when graphics processing operations are to be performed. When compute operations are to be performed, compute dispatch logic can dispatch the commands to the graphics cores 221A-221F, bypassing the geometry and media pipelines.

The graphics microcontroller 233 can be configured to perform various scheduling and management tasks for the graphics processor core block 219. In one embodiment the graphics microcontroller 233 can perform graphics and/or compute workload scheduling on the various vector engines 222A-222F, 224A-224F and matrix engines 223A-223F, 225A-225F within the graphics cores 221A-221F. In this scheduling model, host software executing on a CPU core of an SoC including the graphics processor core block 219 can submit workloads one of multiple graphics processor doorbells, which invokes a scheduling operation on the appropriate graphics engine. Scheduling operations include determining which workload to run next, submitting a workload to a command streamer, pre-empting existing workloads running on an engine, monitoring progress of a workload, and notifying host software when a workload is complete. In one embodiment the graphics microcontroller 233 can also facilitate low-power or idle states for the graphics processor core block 219, providing the graphics processor core block 219 with the ability to save and restore registers within the graphics processor core block 219 across low-power state transitions independently from the operating system and/or graphics driver software on the system.

The graphics processor core block 219 may have greater than or fewer than the illustrated graphics cores 221A-221F, up to N modular graphics cores. For each set of N graphics cores, the graphics processor core block 219 can also include shared/cache memory 236, which can be configured as shared memory or cache memory, rasterizer logic 237, and additional fixed function logic 238 to accelerate various graphics and compute processing operations.

Within each graphics cores 221A-221F is set of execution resources that may be used to perform graphics, media, and compute operations in response to requests by graphics pipeline, media pipeline, or shader programs. The graphics cores 221A-221F include multiple vector engines 222A-222F, 224A-224F, matrix acceleration units 223A-223F, 225A-225D, cache/shared local memory (SLM), a sampler 226A-226F, and a ray tracing unit 227A-227F.

The vector engines 222A-222F, 224A-224F are general-purpose graphics processing units capable of performing floating-point and integer/fixed-point logic operations in service of a graphics, media, or compute operation, including graphics, media, or compute/GPGPU programs. The vector engines 222A-222F, 224A-224F can operate at variable vector widths using SIMD, SIMT, or SIMT+SIMD execution modes. The matrix acceleration units 223A-223F, 225A-225D include matrix-matrix and matrix-vector acceleration logic that improves performance on matrix operations, particularly low and mixed precision (e.g., INT8, FP16, BF16) matrix operations used for machine learning. In one embodiment, each of the matrix acceleration units 223A-223F, 225A-225D includes one or more systolic arrays of processing elements that can perform concurrent matrix multiply or dot product operations on matrix elements.

The sampler 226A-226F can read media or texture data into memory and can sample data differently based on a configured sampler state and the texture/media format that is being read. Threads executing on the vector engines 222A-222F, 224A-224F or matrix acceleration units 223A-223F, 225A-225D can make use of the cache/SLM 228A-228F within each execution core. The cache/SLM 228A-228F can be configured as cache memory or as a pool of shared memory that is local to each of the respective graphics cores 221A-221F. The ray tracing units 227A-227F within the graphics cores 221A-221F include ray traversal/intersection circuitry for performing ray traversal using bounding volume hierarchies (BVHs) and identifying intersections between rays and primitives enclosed within the BVH volumes. In one embodiment the ray tracing units 227A-227F include circuitry for performing depth testing and culling (e.g., using a depth buffer or similar arrangement). In one implementation, the ray tracing units 227A-227F perform traversal and intersection operations in concert with image denoising, at least a portion of which may be performed using an associated matrix acceleration unit 223A-223F, 225A-225D.

Figure 2C:
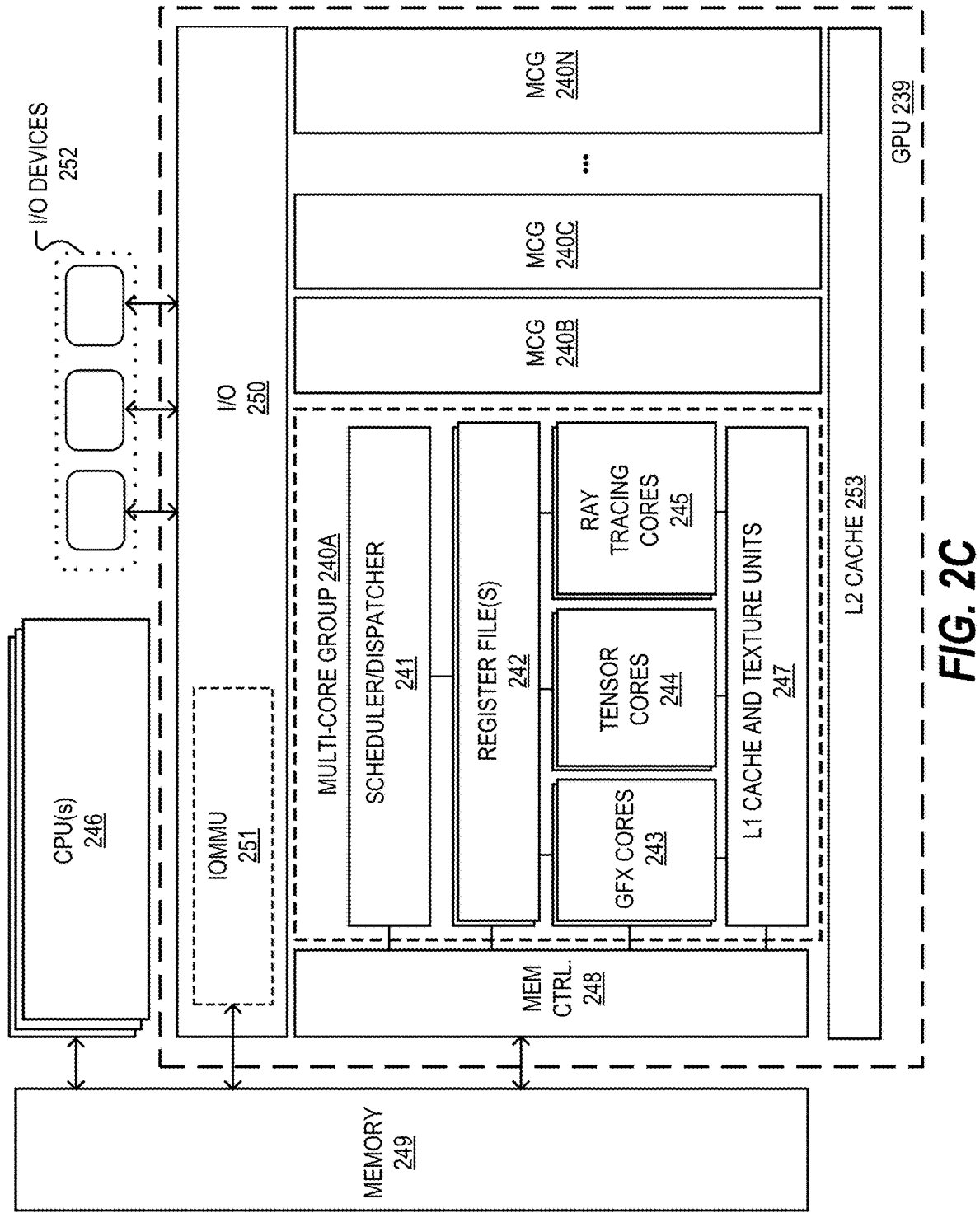
FIG. 2C illustrates a graphics processing unit (GPU) that includes dedicated sets of graphics processing resources arranged into multi-core groups.

FIG. 2C illustrates a graphics processing unit (GPU) 239 that includes dedicated sets of graphics processing resources arranged into multi-core groups 240A-240N. The details of multi-core group 240A are illustrated. Multi-core groups 240B-240N may be equipped with the same or similar sets of graphics processing resources.

As illustrated, a multi-core group 240A may include a set of graphics cores 243, a set of tensor cores 244, and a set of ray tracing cores 245. A scheduler/dispatcher 241 schedules and dispatches the graphics threads for execution on the various cores 243, 244, 245. In one embodiment the tensor cores 244 are sparse tensor cores with hardware to enable multiplication operations having a zero-value input to be bypassed. The graphics cores 243 of the GPU 239 of FIG. 2C differ in hierarchical abstraction level relative to the graphics cores 221A-221F of FIG. 2B, which are analogous to the multi-core groups 240A-240N of FIG. 2C. The graphics cores 243, tensor cores 244, and ray tracing cores 245 of FIG. 2C are analogous to, respectively, the vector engines 222A-222F, 224A-224F, matrix engines 223A-223F, 225A-225F, and ray tracing units 227A-227F of FIG. 2B.

A set of register files 242 can store operand values used by the cores 243, 244, 245 when executing the graphics threads. These may include, for example, integer registers for storing integer values, floating point registers for storing floating point values, vector registers for storing packed data elements (integer and/or floating-point data elements) and tile registers for storing tensor/matrix values. In one embodiment, the tile registers are implemented as combined sets of vector registers.

One or more combined level 1 (L1) caches and shared memory units 247 store graphics data such as texture data, vertex data, pixel data, ray data, bounding volume data, etc., locally within each multi-core group 240A. One or more texture units 247 can also be used to perform texturing operations, such as texture mapping and sampling. A Level 2 (L2) cache 253 shared by all or a subset of the multi-core groups 240A-240N stores graphics data and/or instructions for multiple concurrent graphics threads. As illustrated, the L2 cache 253 may be shared across a plurality of multi-core groups 240A-240N. One or more memory controllers 248 couple the GPU 239 to a memory 249 which may be a system memory (e.g., DRAM) and/or a dedicated graphics memory (e.g., GDDR6 memory).

Input/output (I/O) circuitry 250 couples the GPU 239 to one or more I/O devices 252 such as digital signal processors (DSPs), network controllers, or user input devices. An on-chip interconnect may be used to couple the I/O devices 252 to the GPU 239 and memory 249. One or more I/O memory management units (IOMMUs) 251 of the I/O circuitry 250 couple the I/O devices 252 directly to the memory 249. In one embodiment, the IOMMU 251 manages multiple sets of page tables to map virtual addresses to physical addresses in memory 249. In this embodiment, the I/O devices 252, CPU(s) 246, and GPU 239 may share the same virtual address space.

In one implementation, the IOMMU 251 supports virtualization. In this case, it may manage a first set of page tables to map guest/graphics virtual addresses to guest/graphics physical addresses and a second set of page tables to map the guest/graphics physical addresses to system/host physical addresses (e.g., within memory 249). The base addresses of each of the first and second sets of page tables may be stored in control registers and swapped out on a context switch (e.g., so that the new context is provided with access to the relevant set of page tables). While not illustrated in FIG. 2C, each of the cores 243, 244, 245 and/or multi-core groups 240A-240N may include translation lookaside buffers (TLBs) to cache guest virtual to guest physical translations, guest physical to host physical translations, and guest virtual to host physical translations.

In one embodiment, the CPUs 246, GPU 239, and I/O devices 252 are integrated on a single semiconductor chip and/or chip package. The memory 249 may be integrated on the same chip or may be coupled to the memory controllers 248 via an off-chip interface. In one implementation, the memory 249 comprises GDDR6 memory which shares the same virtual address space as other physical system-level memories, although the underlying principles of the embodiments described herein are not limited to this specific implementation.

In one embodiment, the tensor cores 244 include a plurality of functional units specifically designed to perform matrix operations, which are the fundamental compute operation used to perform deep learning operations. For example, simultaneous matrix multiplication operations may be used for neural network training and inferencing. The tensor cores 244 may perform matrix processing using a variety of operand precisions including single precision floating-point (e.g., 32 bits), half-precision floating point (e.g., 16 bits), integer words (16 bits), bytes (8 bits), and half-bytes (4 bits). In one embodiment, a neural network implementation extracts features of each rendered scene, potentially combining details from multiple frames, to construct a high-quality final image.

In deep learning implementations, parallel matrix multiplication work may be scheduled for execution on the tensor cores 244. The training of neural networks, in particular, requires a significant number of matrix dot product operations. In order to process an inner-product formulation of an N×N×N matrix multiply, the tensor cores 244 may include at least N dot-product processing elements. Before the matrix multiply begins, one entire matrix is loaded into tile registers and at least one column of a second matrix is loaded each cycle for N cycles. Each cycle, there are N dot products that are processed.

Matrix elements may be stored at different precisions depending on the particular implementation, including 16-bit words, 8-bit bytes (e.g., INT8) and 4-bit half-bytes (e.g., INT4). Different precision modes may be specified for the tensor cores 244 to ensure that the most efficient precision is used for different workloads (e.g., such as inferencing workloads which can tolerate quantization to bytes and half-bytes).

In one embodiment, the ray tracing cores 245 accelerate ray tracing operations for both real-time ray tracing and non-real-time ray tracing implementations. In particular, the ray tracing cores 245 include ray traversal/intersection circuitry for performing ray traversal using bounding volume hierarchies (BVHs) and identifying intersections between rays and primitives enclosed within the BVH volumes. The ray tracing cores 245 may also include circuitry for performing depth testing and culling (e.g., using a Z buffer or similar arrangement). In one implementation, the ray tracing cores 245 perform traversal and intersection operations in concert with the image denoising techniques described herein, at least a portion of which may be executed on the tensor cores 244. For example, in one embodiment, the tensor cores 244 implement a deep learning neural network to perform denoising of frames generated by the ray tracing cores 245. However, the CPU(s) 246, graphics cores 243, and/or ray tracing cores 245 may also implement all or a portion of the denoising and/or deep learning algorithms.

In addition, as described above, a distributed approach to denoising may be employed in which the GPU 239 is in a computing device coupled to other computing devices over a network or high-speed interconnect. In this embodiment, the interconnected computing devices share neural network learning/training data to improve the speed with which the overall system learns to perform denoising for different types of image frames and/or different graphics applications.

In one embodiment, the ray tracing cores 245 process all BVH traversal and ray-primitive intersections, saving the graphics cores 243 from being overloaded with thousands of instructions per ray. In one embodiment, each ray tracing core 245 includes a first set of specialized circuitry for performing bounding box tests (e.g., for traversal operations) and a second set of specialized circuitry for performing the ray-triangle intersection tests (e.g., intersecting rays which have been traversed). Thus, in one embodiment, the multi-core group 240A can simply launch a ray probe, and the ray tracing cores 245 independently perform ray traversal and intersection and return hit data (e.g., a hit, no hit, multiple hits, etc.) to the thread context. The other cores 243, 244 are freed to perform other graphics or compute work while the ray tracing cores 245 perform the traversal and intersection operations.

In one embodiment, each ray tracing core 245 includes a traversal unit to perform BVH testing operations and an intersection unit which performs ray-primitive intersection tests. The intersection unit generates a "hit", "no hit", or "multiple hit" response, which it provides to the appropriate thread. During the traversal and intersection operations, the execution resources of the other cores (e.g., graphics cores 243 and tensor cores 244) are freed to perform other forms of graphics work.

In one particular embodiment described below, a hybrid rasterization/ray tracing approach is used in which work is distributed between the graphics cores 243 and ray tracing cores 245.

In one embodiment, the ray tracing cores 245 (and/or other cores 243, 244) include hardware support for a ray tracing instruction set such as Microsoft's DirectX Ray Tracing (DXR) which includes a DispatchRays command, as well as ray-generation, closest-hit, any-hit, and miss shaders, which enable the assignment of unique sets of shaders and textures for each object. Another ray tracing platform which may be supported by the ray tracing cores 245, graphics cores 243 and tensor cores 244 is Vulkan 1.1.85. Note, however, that the underlying principles of the embodiments described herein are not limited to any particular ray tracing ISA.

In general, the various cores 245, 244, 243 may support a ray tracing instruction set that includes instructions/functions for ray generation, closest hit, any hit, ray-primitive intersection, per-primitive and hierarchical bounding box construction, miss, visit, and exceptions. More specifically, one embodiment includes ray tracing instructions to perform the following functions:

Ray Generation—Ray generation instructions may be executed for each pixel, sample, or other user-defined work assignment.

Closest Hit—A closest hit instruction may be executed to locate the closest intersection point of a ray with primitives within a scene.

Any Hit—An any hit instruction identifies multiple intersections between a ray and primitives within a scene, potentially to identify a new closest intersection point.

Intersection—An intersection instruction performs a ray-primitive intersection test and outputs a result.

Per-primitive Bounding box Construction—This instruction builds a bounding box around a given primitive or group of primitives (e.g., when building a new BVH or other acceleration data structure).

Miss—Indicates that a ray misses all geometry within a scene, or specified region of a scene.

Visit—Indicates the child volumes a ray will traverse.

Exceptions—Includes various types of exception handlers (e.g., invoked for various error conditions).

In one embodiment the ray tracing cores 245 may be adapted to accelerate general-purpose compute operations that can be accelerated using computational techniques that are analogous to ray intersection tests. A compute framework can be provided that enables shader programs to be compiled into low level instructions and/or primitives that perform general-purpose compute operations via the ray tracing cores. Exemplary computational problems that can benefit from compute operations performed on the ray tracing cores 245 include computations involving beam, wave, ray, or particle propagation within a coordinate space. Interactions associated with that propagation can be computed relative to a geometry or mesh within the coordinate space. For example, computations associated with electromagnetic signal propagation through an environment can be accelerated via the use of instructions or primitives that are executed via the ray tracing cores. Diffraction and reflection of the signals by objects in the environment can be computed as direct ray-tracing analogies.

Ray tracing cores 245 can also be used to perform computations that are not directly analogous to ray tracing. For example, mesh projection, mesh refinement, and volume sampling computations can be accelerated using the ray tracing cores 245. Generic coordinate space calculations, such as nearest neighbor calculations can also be performed. For example, the set of points near a given point can be discovered by defining a bounding box in the coordinate space around the point. BVH and ray probe logic within the ray tracing cores 245 can then be used to determine the set of point intersections within the bounding box. The intersections constitute the origin point and the nearest neighbors to that origin point. Computations that are performed using the ray tracing cores 245 can be performed in parallel with computations performed on the graphics cores 243 and tensor cores 244. A shader compiler can be configured to compile a compute shader or other general-purpose graphics processing program into low level primitives that can be parallelized across the graphics cores 243, tensor cores 244, and ray tracing cores 245.

Figure 2D:
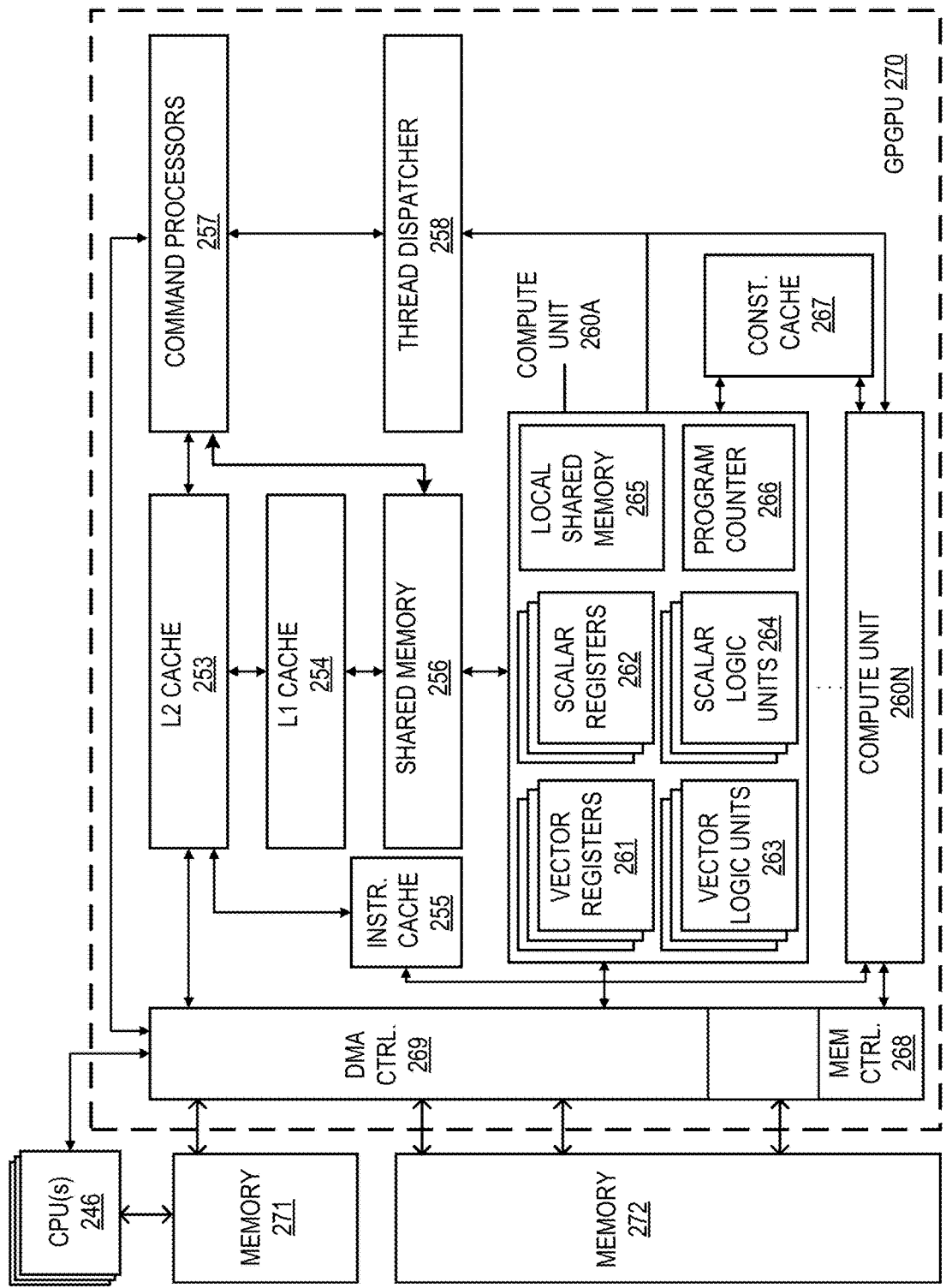
FIG. 2D is a block diagram of general-purpose graphics processing unit (GPGPU) that can be configured as a graphics processor and/or compute accelerator, according to embodiments described herein.

FIG. 2D is a block diagram of general-purpose graphics processing unit (GPGPU) 270 that can be configured as a graphics processor and/or compute accelerator, according to embodiments described herein. The GPGPU 270 can interconnect with host processors (e.g., one or more CPU(s) 246) and memory 271, 272 via one or more system and/or memory busses. In one embodiment the memory 271 is system memory that may be shared with the one or more CPU(s) 246, while memory 272 is device memory that is dedicated to the GPGPU 270. In one embodiment, components within the GPGPU 270 and memory 272 may be mapped into memory addresses that are accessible to the one or more CPU(s) 246. Access to memory 271 and 272 may be facilitated via a memory controller 268. In one embodiment the memory controller 268 includes an internal direct memory access (DMA) controller 269 or can include logic to perform operations that would otherwise be performed by a DMA controller.

The GPGPU 270 includes multiple cache memories, including an L2 cache 253, L1 cache 254, an instruction cache 255, and shared memory 256, at least a portion of which may also be partitioned as a cache memory. The GPGPU 270 also includes multiple compute units 260A-260N, which represent a hierarchical abstraction level analogous to the graphics cores 221A-221F of FIG. 2B and the multi-core groups 240A-240N of FIG. 2C. Each compute unit 260A-260N includes a set of vector registers 261, scalar registers 262, vector logic units 263, and scalar logic units 264. The compute units 260A-260N can also include local shared memory 265 and a program counter 266. The compute units 260A-260N can couple with a constant cache 267, which can be used to store constant data, which is data that will not change during the run of kernel or shader program that executes on the GPGPU 270. In one embodiment the constant cache 267 is a scalar data cache and cached data can be fetched directly into the scalar registers 262.

During operation, the one or more CPU(s) 246 can write commands into registers or memory in the GPGPU 270 that has been mapped into an accessible address space. The command processors 257 can read the commands from registers or memory and determine how those commands will be processed within the GPGPU 270. A thread dispatcher 258 can then be used to dispatch threads to the compute units 260A-260N to perform those commands. Each compute unit 260A-260N can execute threads independently of the other compute units. Additionally, each compute unit 260A-260N can be independently configured for conditional computation and can conditionally output the results of computation to memory. The command processors 257 can interrupt the one or more CPU(s) 246 when the submitted commands are complete.

Figure 3A:
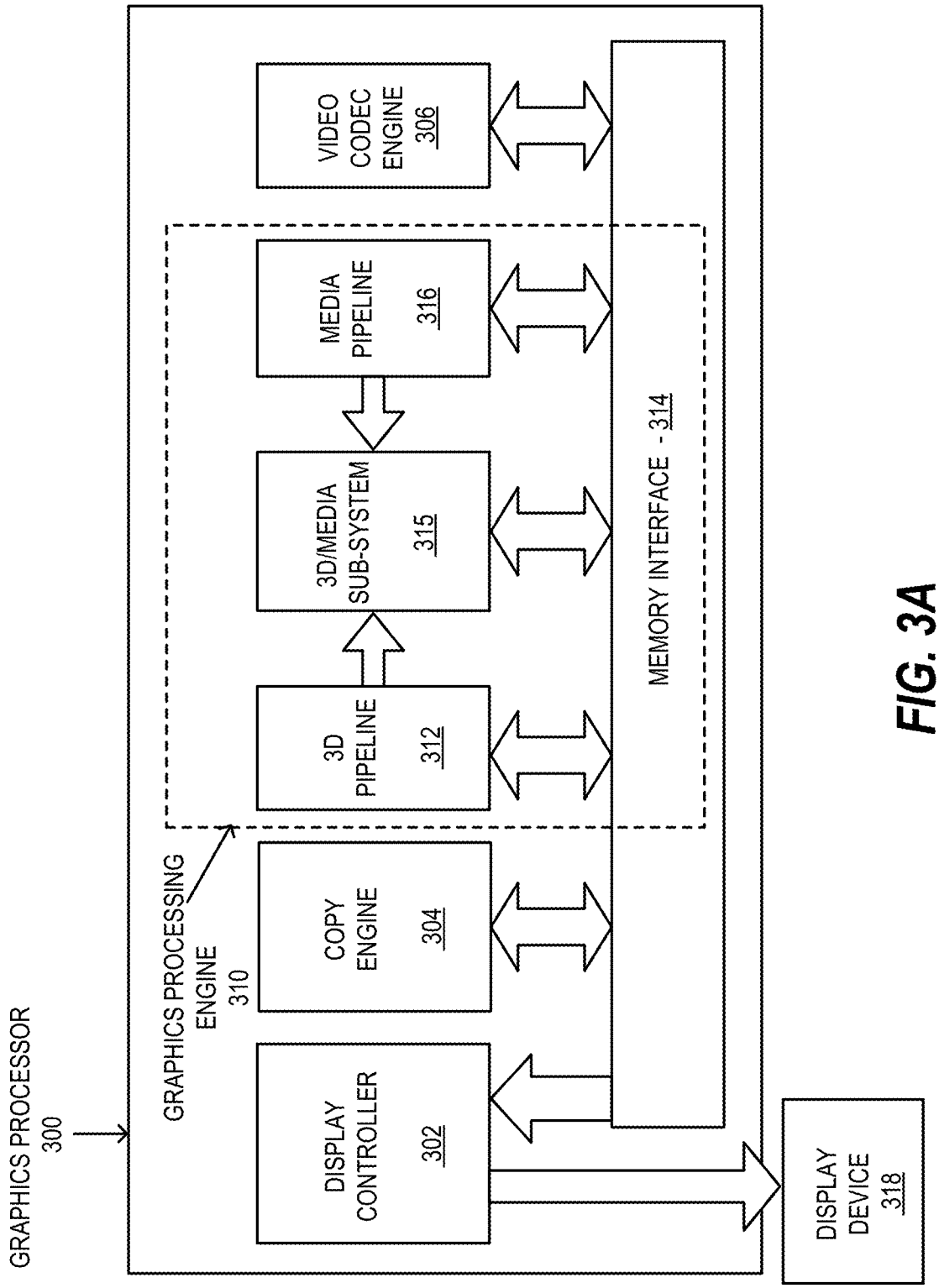
FIG. 3A is a block diagram of a graphics processor, which may be a discrete graphics processing unit, or may be a graphics processor integrated with a plurality of processing cores, or other semiconductor devices such as, but not limited to, memory devices or network interfaces.
Figure 3B:
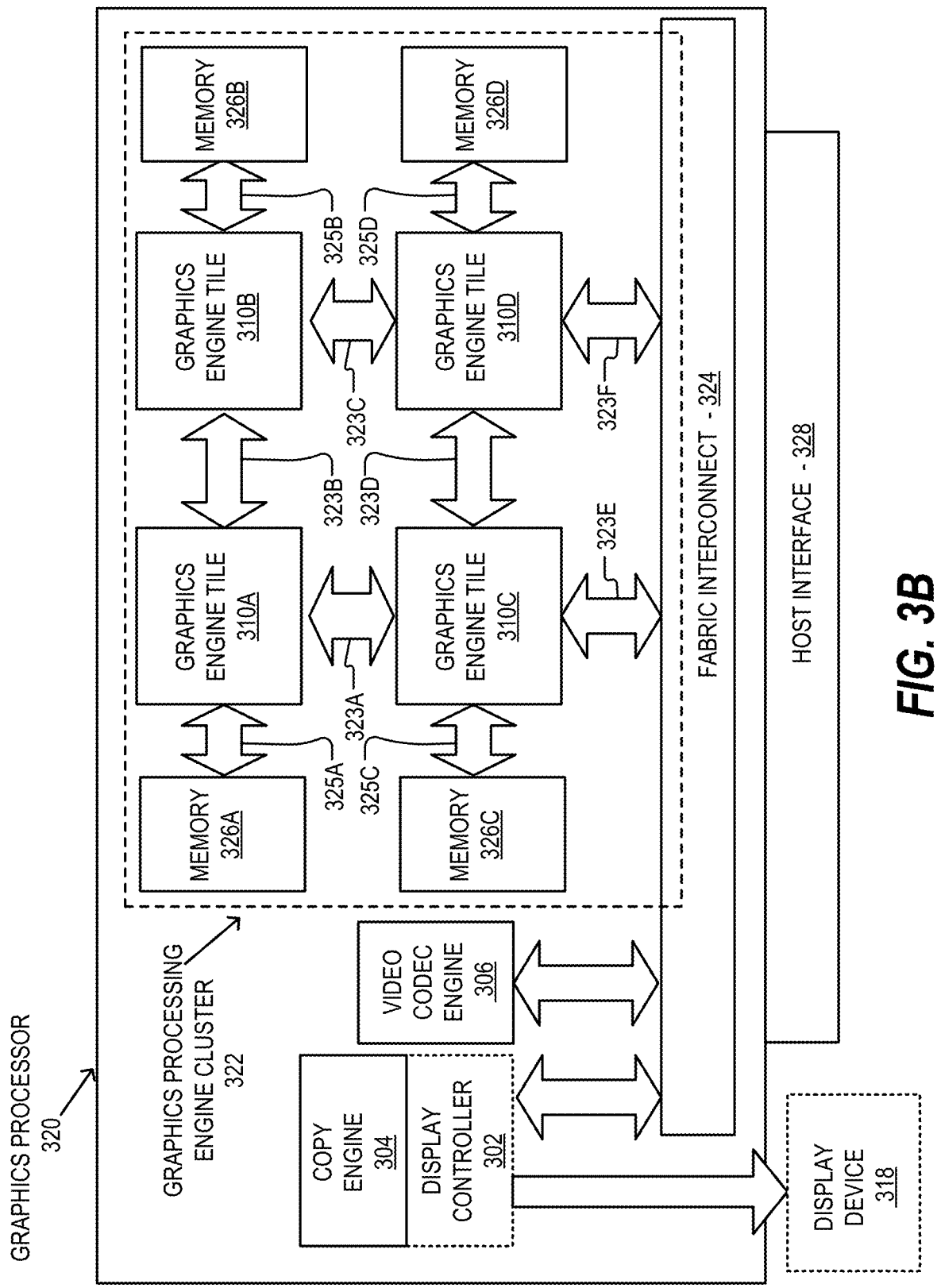
FIG. 3B illustrates a graphics processor having a tiled architecture, according to embodiments described herein.
Figure 3C:
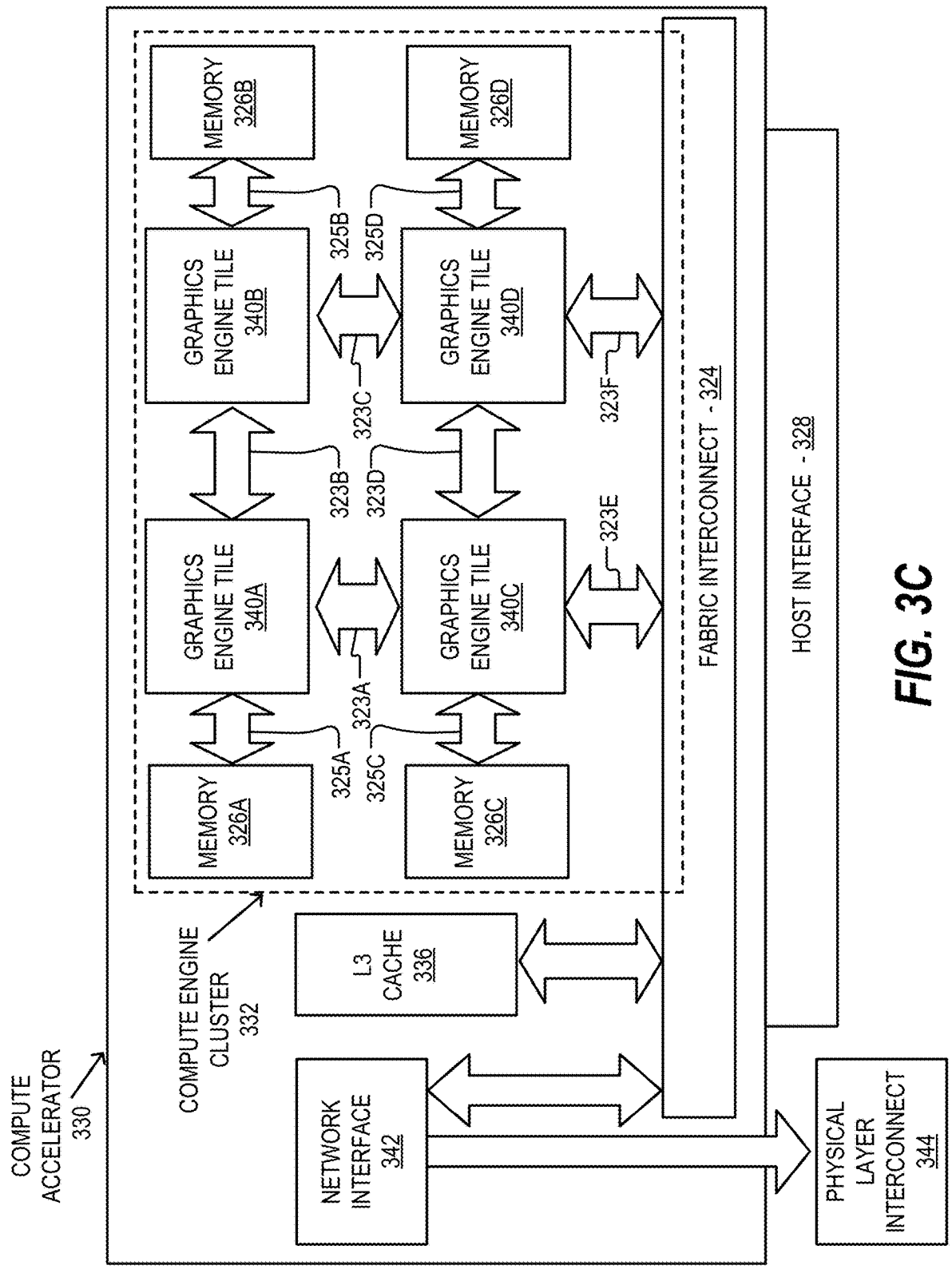
FIG. 3C illustrates a compute accelerator, according to embodiments described herein.

FIGS. 3A-3C illustrate block diagrams of additional graphics processor and compute accelerator architectures provided by embodiments described herein. The elements of FIGS. 3A-3C having the same reference numbers (or names) as the elements of any other figure herein can operate or function in any manner similar to that described elsewhere herein, but are not limited to such.

FIG. 3A is a block diagram of a graphics processor 300, which may be a discrete graphics processing unit, or may be a graphics processor integrated with a plurality of processing cores, or other semiconductor devices such as, but not limited to, memory devices or network interfaces. In some embodiments, the graphics processor communicates via a memory mapped I/O interface to registers on the graphics processor and with commands placed into the processor memory. In some embodiments, graphics processor 300 includes a memory interface 314 to access memory. Memory interface 314 can be an interface to local memory, one or more internal caches, one or more shared external caches, and/or to system memory.

In some embodiments, graphics processor 300 also includes a display controller 302 to drive display output data to a display device 318. Display controller 302 includes hardware for one or more overlay planes for the display and composition of multiple layers of video or user interface elements. The display device 318 can be an internal or external display device. In one embodiment the display device 318 is a head mounted display device, such as a virtual reality (VR) display device or an augmented reality (AR) display device. In some embodiments, graphics processor 300 includes a video codec engine 306 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, H.265/HEVC, Alliance for Open Media (AOMedia) VP8, VP9, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 300 includes a block image transfer (BLIT) engine 304 to perform two-dimensional (2D) rasterizer operations including, for example, bit-boundary block transfers. However, in one embodiment, 2D graphics operations are performed using one or more components of graphics processing engine (GPE) 310. In some embodiments, GPE 310 is a compute engine for performing graphics operations, including three-dimensional (3D) graphics operations and media operations.

In some embodiments, GPE 310 includes a 3D pipeline 312 for performing 3D operations, such as rendering three-dimensional images and scenes using processing functions that act upon 3D primitive shapes (e.g., rectangle, triangle, etc.). The 3D pipeline 312 includes programmable and fixed function elements that perform various tasks within the element and/or spawn execution threads to a 3D/Media subsystem 315. While 3D pipeline 312 can be used to perform media operations, an embodiment of GPE 310 also includes a media pipeline 316 that is specifically used to perform media operations, such as video post-processing and image enhancement.

In some embodiments, media pipeline 316 includes fixed function or programmable logic units to perform one or more specialized media operations, such as video decode acceleration, video de-interlacing, and video encode acceleration in place of, or on behalf of video codec engine 306. In some embodiments, media pipeline 316 additionally includes a thread spawning unit to spawn threads for execution on 3D/Media subsystem 315. The spawned threads perform computations for the media operations on one or more graphics cores included in 3D/Media subsystem 315.

In some embodiments, 3D/Media subsystem 315 includes logic for executing threads spawned by 3D pipeline 312 and media pipeline 316. In one embodiment, the pipelines send thread execution requests to 3D/Media subsystem 315, which includes thread dispatch logic for arbitrating and dispatching the various requests to available thread execution resources. The execution resources include an array of graphics cores to process the 3D and media threads. In some embodiments, 3D/Media subsystem 315 includes one or more internal caches for thread instructions and data. In some embodiments, the subsystem also includes shared memory, including registers and addressable memory, to share data between threads and to store output data.

FIG. 3B illustrates a graphics processor 320 having a tiled architecture, according to embodiments described herein. In one embodiment the graphics processor 320 includes a graphics processing engine cluster 322 having multiple instances of the graphics processing engine 310 of FIG. 3A within a graphics engine tile 310A-310D. Each graphics engine tile 310A-310D can be interconnected via a set of tile interconnects 323A-323F. Each graphics engine tile 310A-310D can also be connected to a memory module or memory device 326A-326D via memory interconnects 325A-325D. The memory devices 326A-326D can use any graphics memory technology. For example, the memory devices 326A-326D may be graphics double data rate (GDDR) memory. The memory devices 326A-326D, in one embodiment, are HBM modules that can be on-die with their respective graphics engine tile 310A-310D. In one embodiment the memory devices 326A-326D are stacked memory devices that can be stacked on top of their respective graphics engine tile 310A-310D. In one embodiment, each graphics engine tile 310A-310D and associated memory 326A-326D reside on separate chiplets, which are bonded to a base die or base substrate, as described on further detail in FIGS. 11B-11D.

The graphics processor 320 may be configured with a non-uniform memory access (NUMA) systemin which memory devices 326A-326D are coupled with associated graphics engine tiles 310A-310D. A given memory device may be accessed by graphics engine tiles other than the tile to which it is directly connected. However, access latency to the memory devices 326A-326D may be lowest when accessing a local tile. In one embodiment, a cache coherent NUMA (ccNUMA) system is enabled that uses the tile interconnects 323A-323F to enable communication between cache controllers within the graphics engine tiles 310A-310D to maintain a consistent memory image when more than one cache stores the same memory location.

The graphics processing engine cluster 322 can connect with an on-chip or on-package fabric interconnect 324. In one embodiment the fabric interconnect 324 includes a network processor, network on a chip (NoC), or another switching processor to enable the fabric interconnect 324 to act as a packet switched fabric interconnect that switches data packets between components of the graphics processor 320. The fabric interconnect 324 can enable communication between graphics engine tiles 310A-310D and components such as the video codec engine 306 and one or more copy engines 304. The copy engines 304 can be used to move data out of, into, and between the memory devices 326A-326D and memory that is external to the graphics processor 320 (e.g., system memory). The fabric interconnect 324 can also couple with one or more of the tile interconnects 323A-323F to facilitate or enhance the interconnection between the graphics engine tiles 310A-310D. The fabric interconnect 324 is also configurable to interconnect multiple instances of the graphics processor 320 (e.g., via the host interface 328), enabling tile-to-tile communication between graphics engine tiles 310A-310D of multiple GPUs. In one embodiment, the graphics engine tiles 310A-310D of multiple GPUs can be presented to a host system as a single logical device.

The graphics processor 320 may optionally include a display controller 302 to enable a connection with the display device 318. The graphics processor may also be configured as a graphics or compute accelerator. In the accelerator configuration, the display controller 302 and display device 318 may be omitted.

The graphics processor 320 can connect to a host system via a host interface 328. The host interface 328 can enable communication between the graphics processor 320, system memory, and/or other system components. The host interface 328 can be, for example a PCI express bus or another type of host system interface. For example, the host interface 328 may be an NVLink or NVSwitch interface. The host interface 328 and fabric interconnect 324 can cooperate to enable multiple instances of the graphics processor 320 to act as single logical device. Cooperation between the host interface 328 and fabric interconnect 324 can also enable the individual graphics engine tiles 310A-310D to be presented to the host system as distinct logical graphics devices.

FIG. 3C illustrates a compute accelerator 330, according to embodiments described herein. The compute accelerator 330 can include architectural similarities with the graphics processor 320 of FIG. 3B and is optimized for compute acceleration. A compute engine cluster 332 can include a set of compute engine tiles 340A-340D that include execution logic that is optimized for parallel or vector-based general-purpose compute operations. In some embodiments, the compute engine tiles 340A-340D do not include fixed function graphics processing logic, although in one embodiment one or more of the compute engine tiles 340A-340D can include logic to perform media acceleration. The compute engine tiles 340A-340D can connect to memory 326A-326D via memory interconnects 325A-325D. The memory 326A-326D and memory interconnects 325A-325D may be similar technology as in graphics processor 320 or can be different. The graphics compute engine tiles 340A-340D can also be interconnected via a set of tile interconnects 323A-323F and may be connected with and/or interconnected by a fabric interconnect 324. Cross-tile communications can be facilitated via the fabric interconnect 324. The fabric interconnect 324 (e.g., via the host interface 328) can also facilitate communication between compute engine tiles 340A-340D of multiple instances of the compute accelerator 330. In one embodiment the compute accelerator 330 includes a large L3 cache 336 that can be configured as a device-wide cache. The compute accelerator 330 can also connect to a host processor and memory via a host interface 328 in a similar manner as the graphics processor 320 of FIG. 3B.

The compute accelerator 330 can also include an integrated network interface 342. In one embodiment the network interface 342 includes a network processor and controller logic that enables the compute engine cluster 332 to communicate over a physical layer interconnect 344 without requiring data to traverse memory of a host system. In one embodiment, one of the compute engine tiles 340A-340D is replaced by network processor logic and data to be transmitted or received via the physical layer interconnect 344 may be transmitted directly to or from memory 326A-326D. Multiple instances of the compute accelerator 330 may be joined via the physical layer interconnect 344 into a single logical device. Alternatively, the various compute engine tiles 340A-340D may be presented as distinct network accessible compute accelerator devices.

Graphics Processing Engine

Figure 4:
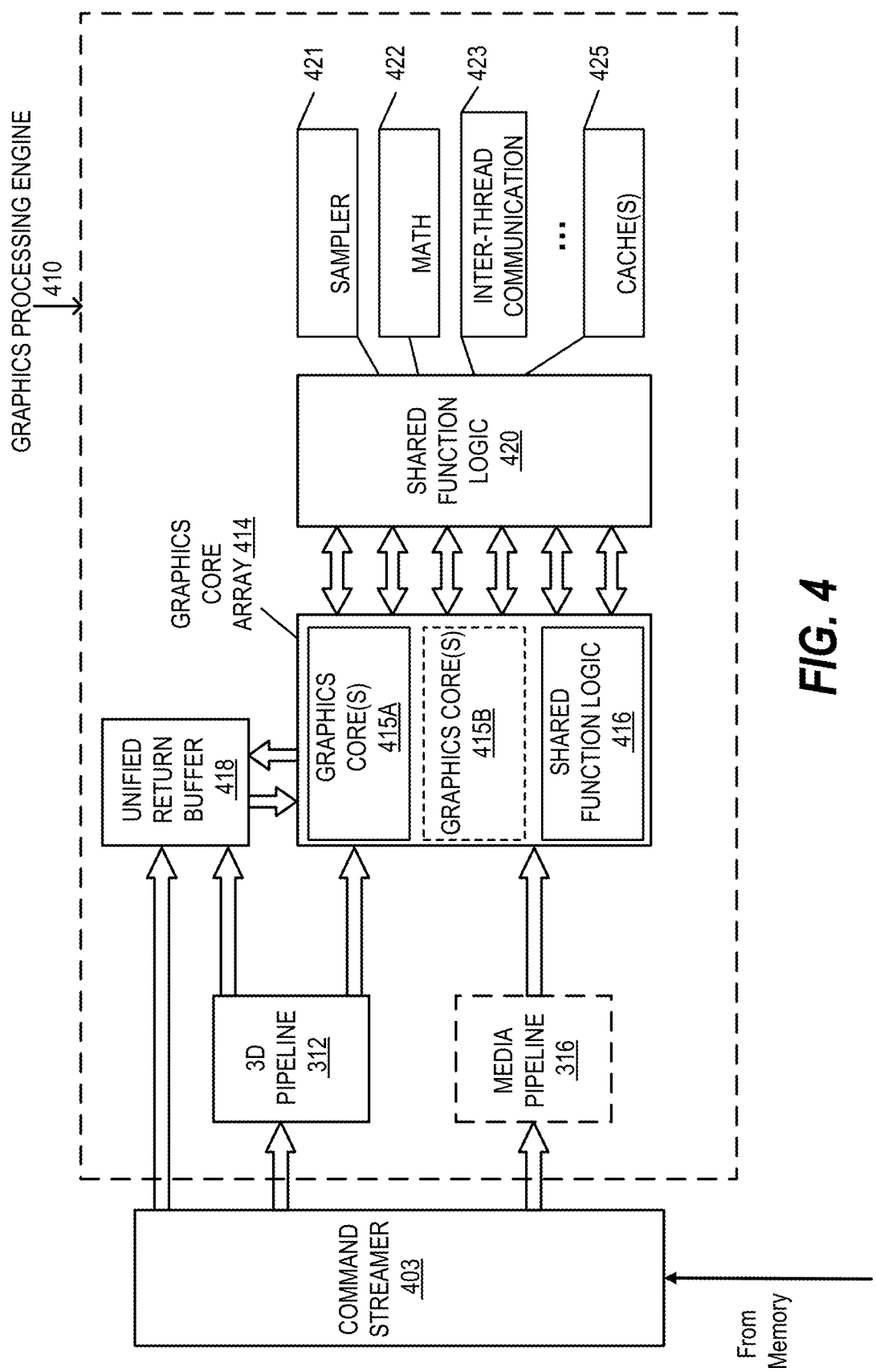
FIG. 4 is a block diagram of a graphics processing engine of a graphics processor in accordance with some embodiments.

FIG. 4 is a block diagram of a graphics processing engine 410 of a graphics processor in accordance with some embodiments. In one embodiment, the graphics processing engine (GPE) 410 is a version of the GPE 310 shown in FIG. 3A and may also represent a graphics engine tile 310A-310D of FIG. 3B. Elements of FIG. 4 having the same reference numbers (or names) as the elements of any other figure herein can operate or function in any manner similar to that described elsewhere herein, but are not limited to such. For example, the 3D pipeline 312 and media pipeline 316 of FIG. 3A are illustrated. The media pipeline 316 is optional in some embodiments of the GPE 410 and may not be explicitly included within the GPE 410. For example and in at least one embodiment, a separate media and/or image processor is coupled to the GPE 410.

In some embodiments, GPE 410 couples with or includes a command streamer 403, which provides a command stream to the 3D pipeline 312 and/or media pipelines 316. Alternatively or additionally, the command streamer 403 may be directly coupled to a unified return buffer 418. The unified return buffer 418 may be communicatively coupled to a graphics core cluster 414. In some embodiments, command streamer 403 is coupled with memory, which can be system memory, or one or more of internal cache memory and shared cache memory. In some embodiments, command streamer 403 receives commands from the memory and sends the commands to 3D pipeline 312 and/or media pipeline 316. The commands are directives fetched from a ring buffer, which stores commands for the 3D pipeline 312 and media pipeline 316. In one embodiment, the ring buffer can additionally include batch command buffers storing batches of multiple commands. The commands for the 3D pipeline 312 can also include references to data stored in memory, such as but not limited to vertex and geometry data for the 3D pipeline 312 and/or image data and memory objects for the media pipeline 316. The 3D pipeline 312 and media pipeline 316 process the commands and data by performing operations via logic within the respective pipelines or by dispatching one or more execution threads to a graphics core cluster 414. In one embodiment the graphics core cluster 414 include one or more blocks of graphics cores (e.g., graphics core block 415A, graphics core block 415B), each block including one or more graphics cores. Each graphics core includes a set of graphics execution resources that includes general-purpose and graphics specific execution logic to perform graphics and compute operations, as well as fixed function texture processing and/or machine learning and artificial intelligence acceleration logic, such as matrix or AI acceleration logic.

In various embodiments the 3D pipeline 312 can include fixed function and programmable logic to process one or more shader programs, such as vertex shaders, geometry shaders, pixel shaders, fragment shaders, compute shaders, or other shader and/or GPGPU programs, by processing the instructions and dispatching execution threads to the graphics core cluster 414. The graphics core cluster 414 provides a unified block of execution resources for use in processing these shader programs. Multi-purpose execution logic within the graphics core blocks 415A-415B of the graphics core cluster 414 includes support for various 3D API shader languages and can execute multiple simultaneous execution threads associated with multiple shaders.

In some embodiments, the graphics core cluster 414 includes execution logic to perform media functions, such as video and/or image processing. In one embodiment, the graphics cores include general-purpose logic that is programmable to perform parallel general-purpose computational operations, in addition to graphics processing operations. The general-purpose logic can perform processing operations in parallel or in conjunction with general-purpose logic within the processor core(s) 107 of FIG. 1 or core 202A-202N as in FIG. 2A.

Output data generated by threads executing on the graphics core cluster 414 can output data to memory in a unified return buffer (URB) 418. The URB 418 can store data for multiple threads. In some embodiments the URB 418 may be used to send data between different threads executing on the graphics core cluster 414. In some embodiments the URB 418 may additionally be used for synchronization between threads on the graphics core array and fixed function logic within the shared function logic 420.

In some embodiments, graphics core cluster 414 is scalable, such that the cluster includes a variable number of graphics cores, each having a variable number of graphics cores based on the target power and performance level of GPE 410. In one embodiment the execution resources are dynamically scalable, such that execution resources may be enabled or disabled as needed.

The graphics core cluster 414 couples with shared function logic 420 that includes multiple resources that are shared between the graphics cores in the graphics core array. The shared functions within the shared function logic 420 are hardware logic units that provide specialized supplemental functionality to the graphics core cluster 414. In various embodiments, shared function logic 420 may include, but is not limited to sampler 421, math 422, and inter-thread communication (ITC) 423 logic. Additionally, some embodiments implement one or more cache(s) 425 within the shared function logic 420. The shared function logic 420 can implement the same or similar functionality as the additional fixed function logic 238 of FIG. 2B.

A shared function is implemented at least in a case where the demand for a given specialized function is insufficient for inclusion within the graphics core cluster 414. Instead, a single instantiation of that specialized function is implemented as a stand-alone entity in the shared function logic 420 and shared among the execution resources within the graphics core cluster 414. The precise set of functions that are shared between the graphics core cluster 414 and included within the graphics core cluster 414 varies across embodiments. In some embodiments, specific shared functions within the shared function logic 420 that are used extensively by the graphics core cluster 414 may be included within shared function logic 416 within the graphics core cluster 414. In various embodiments, the shared function logic 416 within the graphics core cluster 414 can include some or all logic within the shared function logic 420. In one embodiment, all logic elements within the shared function logic 420 may be duplicated within the shared function logic 416 of the graphics core cluster 414. In one embodiment the shared function logic 420 is excluded in favor of the shared function logic 416 within the graphics core cluster 414.

Graphics Processing Resources

Figure 5A:
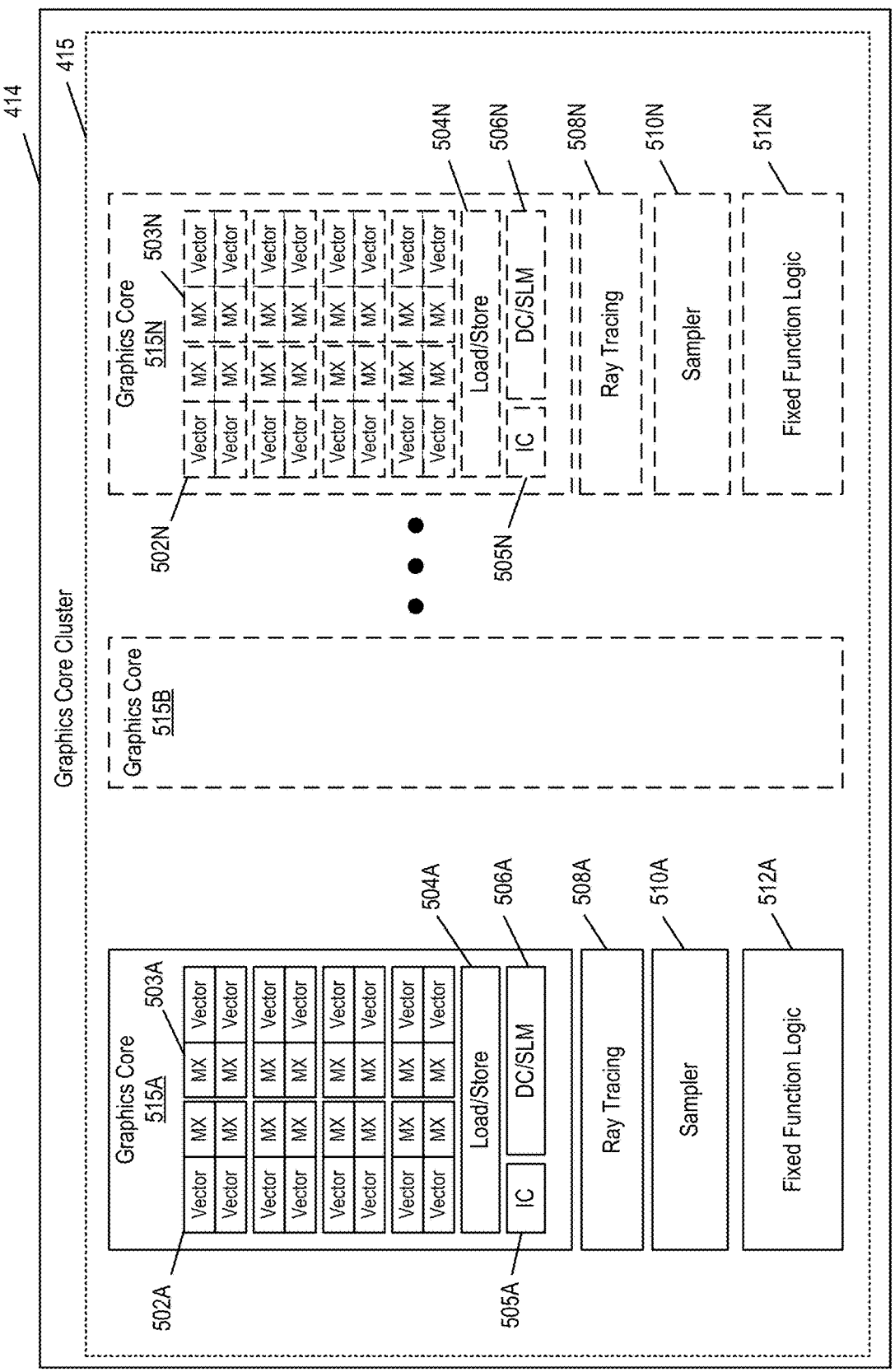
FIG. 5A illustrates graphics core cluster, according to an embodiment.
Figure 5B:
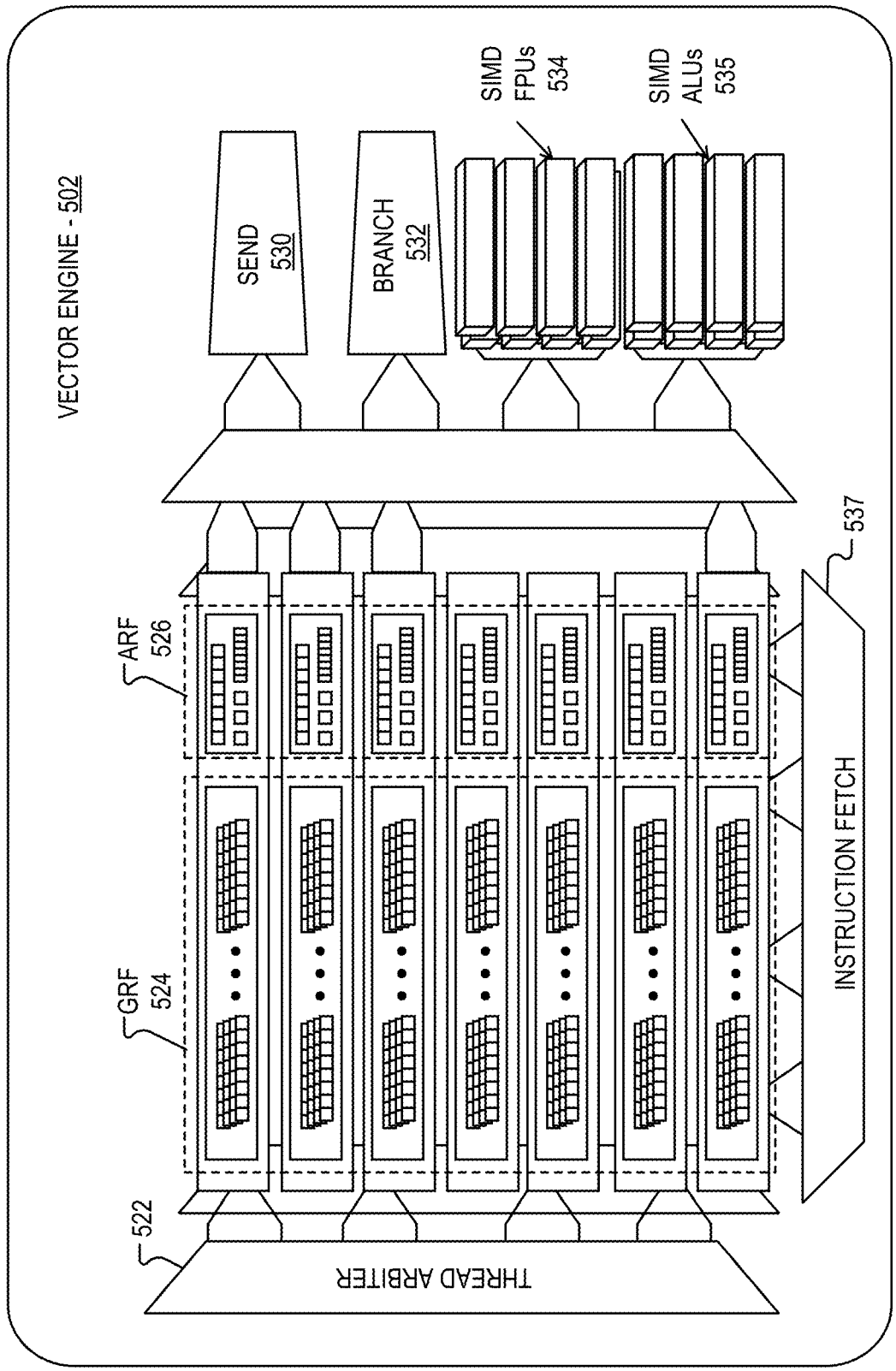
FIG. 5B illustrates a vector engine of a graphics core, according to an embodiment.
Figure 5C:
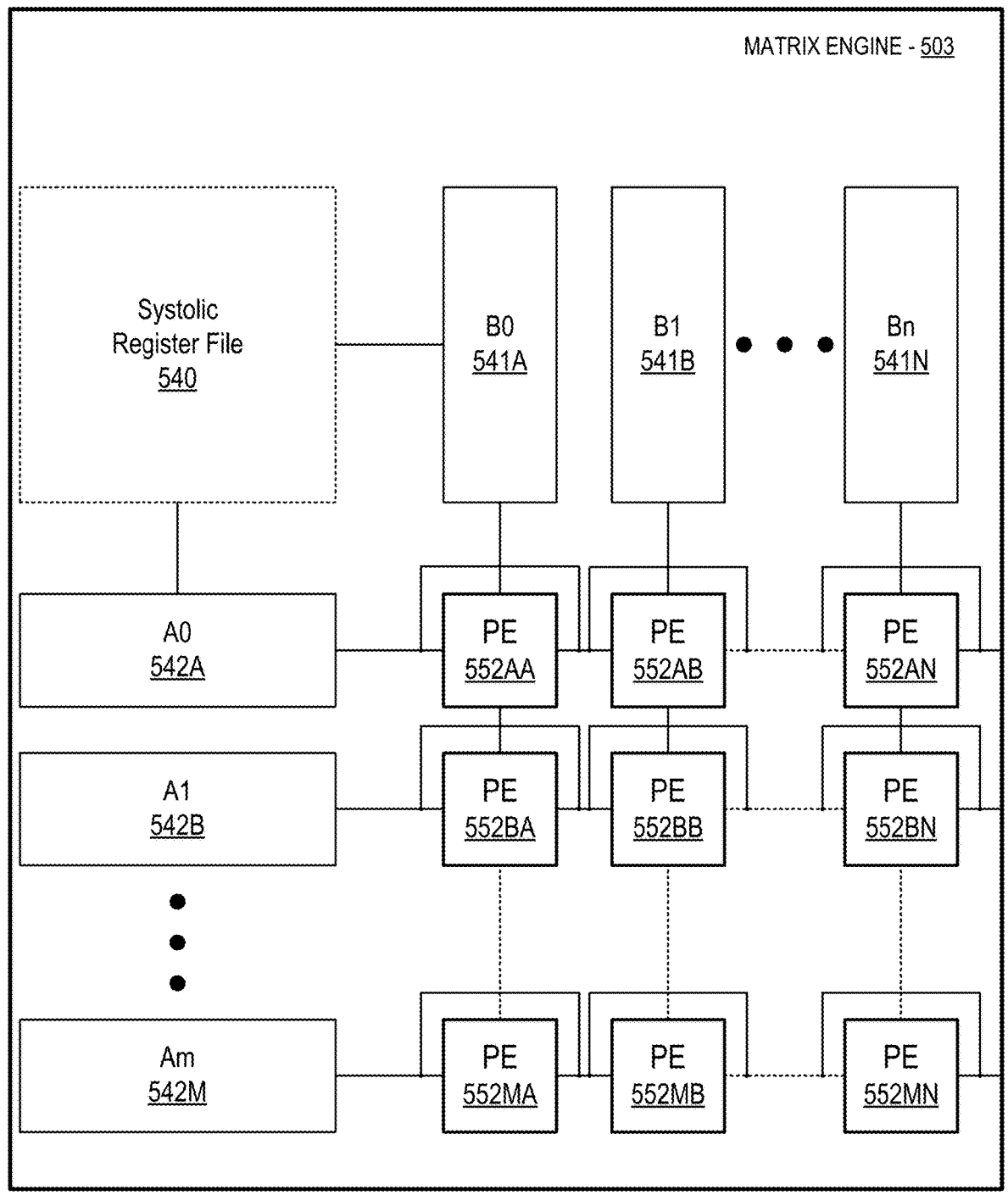
FIG. 5C illustrates a matrix engine of a graphics core, according to an embodiment.

FIG. 5A-5C illustrate execution logic including an array of processing elements employed in a graphics processor, according to embodiments described herein. FIG. 5A illustrates graphics core cluster, according to an embodiment. FIG. 5B illustrates a vector engine of a graphics core, according to an embodiment. FIG. 5C illustrates a matrix engine of a graphics core, according to an embodiment. Elements of FIG. 5A-5C having the same reference numbers as the elements of any other figure herein may operate or function in any manner similar to that described elsewhere herein, but are not limited as such. For example, the elements of FIG. 5A-5C can be considered in the context of the graphics processor core block 219 of FIG. 2B, and/or the graphics core blocks 415A-415B of FIG. 4. In one embodiment, the elements of FIG. 5A-5C have similar functionality to equivalent components of the graphics processor 208 of FIG. 2A, the GPU 239 of FIG. 2C or the GPGPU 270 of FIG. 2D.

As shown in FIG. 5A, in one embodiment the graphics core cluster 414 includes a graphics core block 415, which may be graphics core block 415A or graphics core block 415B of FIG. 4. The graphics core block 415 can include any number of graphics cores (e.g., graphics core 515A, graphics core 515B, through graphics core 515N). Multiple instances of the graphics core block 415 may be included. In one embodiment the elements of the graphics cores 515A-515N have similar or equivalent functionality as the elements of the graphics cores 221A-221F of FIG. 2B. In such embodiment, the graphics cores 515A-515N each include circuitry including but not limited to vector engines 502A-502N, matrix engines 503A-503N, memory load/store units 504A-504N, instruction caches 505A-505N, data caches/shared local memory 506A-506N, ray tracing units 508A-508N, samplers 510A-2710N. The circuitry of the graphics cores 515A-515N can additionally include fixed function logic 512A-512N. The number of vector engines 502A-502N and matrix engines 503A-503N within the graphics cores 515A-515N of a design can vary based on the workload, performance, and power targets for the design.

With reference to graphics core 515A, the vector engine 502A and matrix engine 503A are configurable to perform parallel compute operations on data in a variety of integer and floating-point data formats based on instructions associated with shader programs. Each vector engine 502A and matrix engine 503A can act as a programmable general-purpose computational unit that is capable of executing multiple simultaneous hardware threads while processing multiple data elements in parallel for each thread. The vector engine 502A and matrix engine 503A support the processing of variable width vectors at various SIMD widths, including but not limited to SIMD8, SIMD16, and SIMD32. Input data elements can be stored as a packed data type in a register and the vector engine 502A and matrix engine 503A can process the various elements based on the data size of the elements. For example, when operating on a 256-bit wide vector, the 256 bits of the vector are stored in a register and the vector is processed as four separate 64-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, different vector widths and register sizes are possible. In one embodiment, the vector engine 502A and matrix engine 503A are also configurable for SIMT operation on warps or thread groups of various sizes (e.g., 8, 16, or 32 threads).

Continuing with graphics core 515A, the memory load/store unit 504A services memory access requests that are issued by the vector engine 502A, matrix engine 503A, and/or other components of the graphics core 515A that have access to memory. The memory access request can be processed by the memory load/store unit 504A to load or store the requested data to or from cache or memory into a register file associated with the vector engine 502A and/or matrix engine 503A. The memory load/store unit 504A can also perform prefetching operations. In one embodiment, the memory load/store unit 504A is configured to provide SIMT scatter/gather prefetching or block prefetching for data stored in memory 610, from memory that is local to other tiles via the tile interconnect 608, or from system memory. Prefetching can be performed to a specific L1 cache (e.g., data cache/shared local memory 506A), the L2 cache 604 or the L3 cache 606. In one embodiment, a prefetch to the L3 cache 606 automatically results in the data being stored in the L2 cache 604.

The instruction cache 505A stores instructions to be executed by the graphics core 515A. In one embodiment, the graphics core 515A also includes instruction fetch and prefetch circuitry that fetches or prefetches instructions into the instruction cache 505A. The graphics core 515A also includes instruction decode logic to decode instructions within the instruction cache 505A. The data cache/shared local memory 506A can be configured as a data cache that is managed by a cache controller that implements a cache replacement policy and/or configured as explicitly managed shared memory. The ray tracing unit 508A includes circuitry to accelerate ray tracing operations. The sampler 510A provides texture sampling for 3D operations and media sampling for media operations. The fixed function logic 512A includes fixed function circuitry that is shared between the various instances of the vector engine 502A and matrix engine 503A. Graphics cores 515B-515N can operate in a similar manner as graphics core 515A.

Functionality of the instruction caches 505A-505N, data caches/shared local memory 506A-506N, ray tracing units 508A-508N, samplers 510A-2710N, and fixed function logic 512A-512N corresponds with equivalent functionality in the graphics processor architectures described herein. For example, the instruction caches 505A-505N can operate in a similar manner as instruction cache 255 of FIG. 2D. The data caches/shared local memory 506A-506N, ray tracing units 508A-508N, and samplers 510A-2710N can operate in a similar manner as the cache/SLM 228A-228F, ray tracing units 227A-227F, and samplers 226A-226F of FIG. 2B. The fixed function logic 512A-512N can include elements of the geometry/fixed function pipeline 231 and/or additional fixed function logic 238 of FIG. 2B. In one embodiment, the ray tracing units 508A-508N include circuitry to perform ray tracing acceleration operations performed by the ray tracing cores 245 of FIG. 2C.

As shown in FIG. 5B, in one embodiment the vector engine 502 includes an instruction fetch unit 537, a general register file array (GRF) 524, an architectural register file array (ARF) 526, a thread arbiter 522, a send unit 530, a branch unit 532, a set of SIMD floating point units (FPUs) 534, and in one embodiment a set of integer SIMD ALUs 535. The GRF 524 and ARF 526 includes the set of general register files and architecture register files associated with each hardware thread that may be active in the vector engine 502. In one embodiment, per thread architectural state is maintained in the ARF 526, while data used during thread execution is stored in the GRF 524. The execution state of each thread, including the instruction pointers for each thread, can be held in thread-specific registers in the ARF 526.

In one embodiment the vector engine 502 has an architecture that is a combination of Simultaneous Multi-Threading (SMT) and fine-grained Interleaved Multi-Threading (IMT). The architecture has a modular configuration that can be fine-tuned at design time based on a target number of simultaneous threads and number of registers per graphics core, where graphics core resources are divided across logic used to execute multiple simultaneous threads. The number of logical threads that may be executed by the vector engine 502 is not limited to the number of hardware threads, and multiple logical threads can be assigned to each hardware thread.

In one embodiment, the vector engine 502 can co-issue multiple instructions, which may each be different instructions. The thread arbiter 522 can dispatch the instructions to one of the send unit 530, branch unit 532, or SIMD FPU(s) 534 for execution. Each execution thread can access 128 general-purpose registers within the GRF 524, where each register can store 32 bytes, accessible as a variable width vector of 32-bit data elements. In one embodiment, each thread has access to 4 Kbytes within the GRF 524, although embodiments are not so limited, and greater or fewer register resources may be provided in other embodiments. In one embodiment the vector engine 502 is partitioned into seven hardware threads that can independently perform computational operations, although the number of threads per vector engine 502 can also vary according to embodiments. For example, in one embodiment up to 16 hardware threads are supported. In an embodiment in which seven threads may access 4 Kbytes, the GRF 524 can store a total of 28 Kbytes. Where 16 threads may access 4 Kbytes, the GRF 524 can store a total of 64 Kbytes. Flexible addressing modes can permit registers to be addressed together to build effectively wider registers or to represent strided rectangular block data structures.

In one embodiment, memory operations, sampler operations, and other longer-latency system communications are dispatched via "send" instructions that are executed by the message passing send unit 530. In one embodiment, branch instructions are dispatched to a dedicated branch unit 532 to facilitate SIMD divergence and eventual convergence.

In one embodiment the vector engine 502 includes one or more SIMD floating point units (FPU(s)) 534 to perform floating-point operations. In one embodiment, the FPU(s) 534 also support integer computation. In one embodiment the FPU(s) 534 can execute up to M number of 32-bit floating-point (or integer) operations, or execute up to 2M 16-bit integer or 16-bit floating-point operations. In one embodiment, at least one of the FPU(s) provides extended math capability to support high-throughput transcendental math functions and double precision 64-bit floating-point. In some embodiments, a set of 8-bit integer SIMD ALUs 535 are also present and may be specifically optimized to perform operations associated with machine learning computations. In one embodiment, the SIMD ALUs are replaced by an additional set of SIMD FPUs 534 that are configurable to perform integer and floating-point operations. In one embodiment, the SIMD FPUs 534 and SIMD ALUs 535 are configurable to execute SIMT programs. In one embodiment, combined SIMD+SIMT operation is supported.

In one embodiment, arrays of multiple instances of the vector engine 502 can be instantiated in a graphics core. For scalability, product architects can choose the exact number of vector engines per graphics core grouping. In one embodiment the vector engine 502 can execute instructions across a plurality of execution channels. In a further embodiment, each thread executed on the vector engine 502 is executed on a different channel.

As shown in FIG. 5C, in one embodiment the matrix engine 503 includes an array of processing elements that are configured to perform tensor operations including vector/matrix and matrix/matrix operations, such as but not limited to matrix multiply and/or dot product operations. The matrix engine 503 is configured with M rows and N columns of processing elements (PE 552AA-PE 552MN) that include multiplier and adder circuits organized in a pipelined fashion. In one embodiment, the processing elements 552AA-PE 552MN make up the physical pipeline stages of an N wide and M deep systolic array that can be used to perform vector/matrix or matrix/matrix operations in a data-parallel manner, including matrix multiply, fused multiply-add, dot product or other general matrix-matrix multiplication (GEMM) operations. In one embodiment the matrix engine 503 supports 16-bit floating point operations, as well as 8-bit, 4-bit, 2-bit, and binary integer operations. The matrix engine 503 can also be configured to accelerate specific machine learning operations. In such embodiments, the matrix engine 503 can be configured with support for the bfloat (brain floating point) 16-bit floating point format or a tensor float 32-bit floating point format (TF32) that have different numbers of mantissa and exponent bits relative to Institute of Electrical and Electronics Engineers (IEEE) 754 formats.

In one embodiment, during each cycle, each stage can add the result of operations performed at that stage to the output of the previous stage. In other embodiments, the pattern of data movement between the processing elements 552AA-552MN after a set of computational cycles can vary based on the instruction or macro-operation being performed. For example, in one embodiment partial sum loopback is enabled and the processing elements may instead add the output of a current cycle with output generated in the previous cycle. In one embodiment, the final stage of the systolic array can be configured with a loopback to the initial stage of the systolic array. In such embodiment, the number of physical pipeline stages may be decoupled from the number of logical pipeline stages that are supported by the matrix engine 503. For example, where the processing elements 552AA-552MN are configured as a systolic array of M physical stages, a loopback from stage M to the initial pipeline stage can enable the processing elements 552AA-PE552MN to operate as a systolic array of, for example, 2M, 3M, 4M, etc., logical pipeline stages.

In one embodiment, the matrix engine 503 includes memory 541A-541N, 542A-542M to store input data in the form of row and column data for input matrices. Memory 542A-542M is configurable to store row elements (A0-Am) of a first input matrix and memory 541A-541N is configurable to store column elements (B0-Bn) of a second input matrix. The row and column elements are provided as input to the processing elements 552AA-552MN for processing. In one embodiment, row and column elements of the input matrices can be stored in a systolic register file 540 within the matrix engine 503 before those elements are provided to the memory 541A-541N, 542A-542M. In one embodiment, the systolic register file 540 is excluded and the memory 541A-541N, 542A-542M is loaded from registers in an associated vector engine (e.g., GRF 524 of vector engine 502 of FIG. 5B) or other memory of the graphics core that includes the matrix engine 503 (e.g., data cache/shared local memory 506A for matrix engine 503A of FIG. 5A). Results generated by the processing elements 552AA-552MN are then output to an output buffer and/or written to a register file (e.g., systolic register file 540, GRF 524, data cache/shared local memory 506A-506N) for further processing by other functional units of the graphics processor or for output to memory.

In some embodiments, the matrix engine 503 is configured with support for input sparsity, where multiplication operations for sparse regions of input data can be bypassed by skipping multiply operations that have a zero-value operand. In one embodiment, the processing elements 552AA-552MN are configured to skip the performance of certain operations that have zero value input. In one embodiment, sparsity within input matrices can be detected and operations having known zero output values can be bypassed before being submitted to the processing elements 552AA-552MN. The loading of zero value operands into the processing elements can be bypassed and the processing elements 552AA-552MN can be configured to perform multiplications on the non-zero value input elements. The matrix engine 503 can also be configured with support for output sparsity, such that operations with results that are pre-determined to be zero are bypassed. For input sparsity and/or output sparsity, in one embodiment, metadata is provided to the processing elements 552AA-552MN to indicate, for a processing cycle, which processing elements and/or data channels are to be active during that cycle.

In one embodiment, the matrix engine 503 includes hardware to enable operations on sparse data having a compressed representation of a sparse matrix that stores non-zero values and metadata that identifies the positions of the non-zero values within the matrix. Exemplary compressed representations include but are not limited to compressed tensor representations such as compressed sparse row (CSR), compressed sparse column (CSC), compressed sparse fiber (CSF) representations. Support for compressed representations enable operations to be performed on input in a compressed tensor format without requiring the compressed representation to be decompressed or decoded. In such embodiment, operations can be performed only on non-zero input values and the resulting non-zero output values can be mapped into an output matrix. In some embodiments, hardware support is also provided for machine-specific lossless data compression formats that are used when transmitting data within hardware or across system busses. Such data may be retained in a compressed format for sparse input data and the matrix engine 503 can used the compression metadata for the compressed data to enable operations to be performed on only non-zero values, or to enable blocks of zero data input to be bypassed for multiply operations.

In various embodiments, input data can be provided by a programmer in a compressed tensor representation, or a codec can compress input data into the compressed tensor representation or another sparse data encoding. In addition to support for compressed tensor representations, streaming compression of sparse input data can be performed before the data is provided to the processing elements 552AA-552MN. In one embodiment, compression is performed on data written to a cache memory associated with the graphics core cluster 414, with the compression being performed with an encoding that is supported by the matrix engine 503. In one embodiment, the matrix engine 503 includes support for input having structured sparsity in which a pre-determined level or pattern of sparsity is imposed on input data. This data may be compressed to a known compression ratio, with the compressed data being processed by the processing elements 552AA-552MN according to metadata associated with the compressed data.

Figure 6:
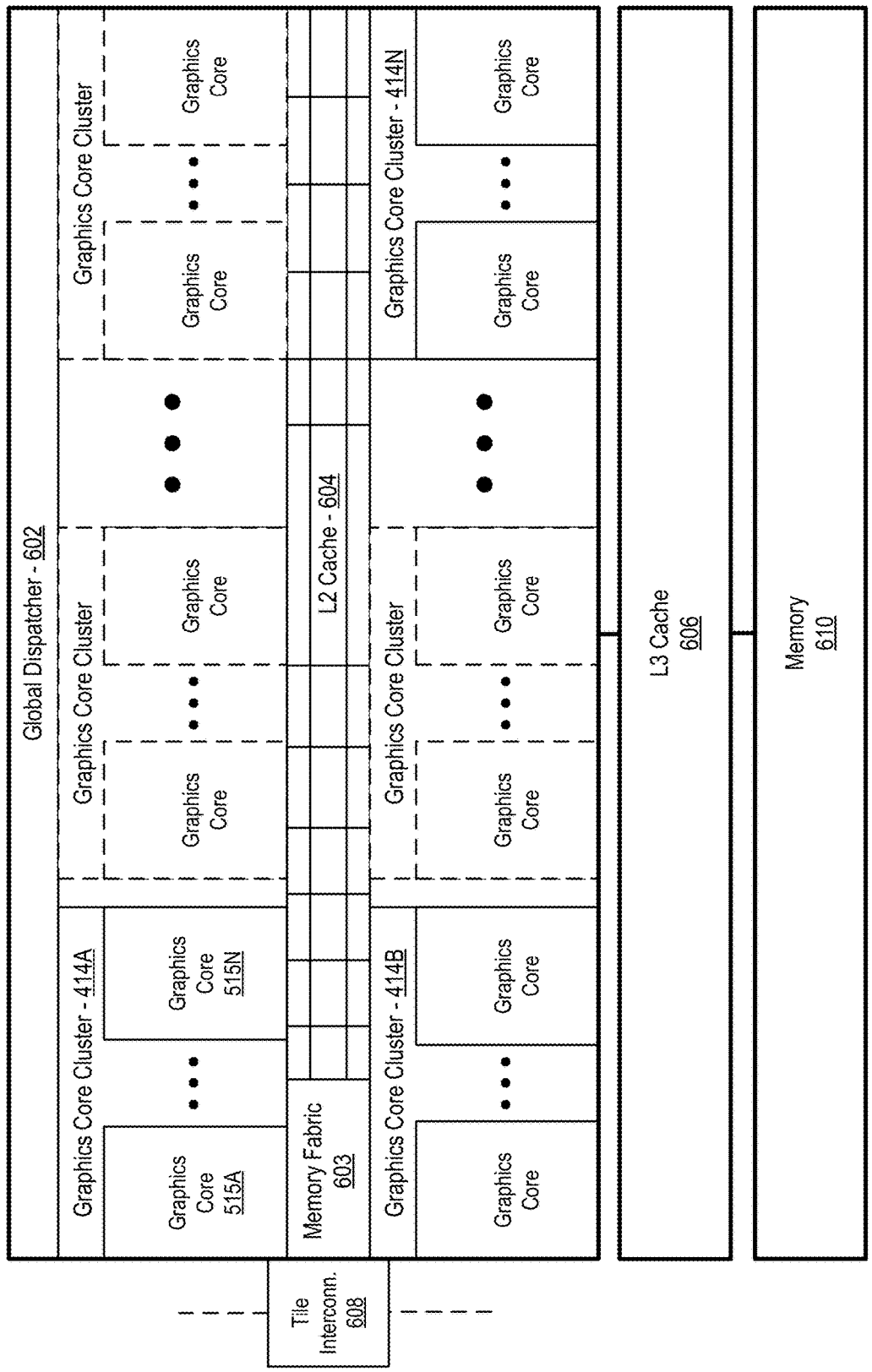
FIG. 6 illustrates a tile of a multi-tile processor, according to an embodiment.

FIG. 6 illustrates a tile 600 of a multi-tile processor, according to an embodiment. In one embodiment, the tile 600 is representative of one of the graphics engine tiles 310A-310D of FIG. 3B or compute engine tiles 340A-340D of FIG. 3C. The tile 600 of the multi-tile graphics processor includes an array of graphics core clusters (e.g., graphics core cluster 414A, graphics core cluster 414B, through graphics core cluster 414N), with each graphics core cluster having an array of graphics cores 515A-515N. The tile 600 also includes a global dispatcher 602 to dispatch threads to processing resources of the tile 600.

The tile 600 can include or couple with an L3 cache 606 and memory 610. In various embodiments, the L3 cache 606 may be excluded or the tile 600 can include additional levels of cache, such as an L4 cache. In one embodiment, each instance of the tile 600 in the multi-tile graphics processor has an associated memory 610, such as in FIG. 3B and FIG. 3C. In one embodiment, a multi-tile processor can be configured as a multi-chip module in which the L3 cache 606 and/or memory 610 reside on separate chiplets than the graphics core clusters 414A-414N. In this context, a chiplet is an at least partially packaged integrated circuit that includes distinct units of logic that can be assembled with other chiplets into a larger package. For example, the L3 cache 606 can be included in a dedicated cache chiplet or can reside on the same chiplet as the graphics core clusters 414A-414N. In one embodiment, the L3 cache 606 can be included in an active base die or active interposer, as illustrated in FIG. 11C.

A memory fabric 603 enables communication among the graphics core clusters 414A-414N, L3 cache 606, and memory 610. An L2 cache 604 couples with the memory fabric 603 and is configurable to cache transactions performed via the memory fabric 603. A tile interconnect 608 enables communication with other tiles on the graphics processors and may be one of tile interconnects 323A-323F of FIGS. 3B and 3C. In embodiments in which the L3 cache 606 is excluded from the tile 600, the L2 cache 604 may be configured as a combined L2/L3 cache. The memory fabric 603 is configurable to route data to the L3 cache 606 or memory controllers associated with the memory 610 based on the presence or absence of the L3 cache 606 in a specific implementation. The L3 cache 606 can be configured as a per-tile cache that is dedicated to processing resources of the tile 600 or may be a partition of a GPU-wide L3 cache.

Figure 7:
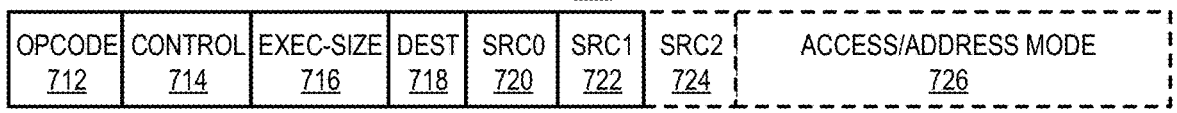
FIG. 7 is a block diagram illustrating graphics processor instruction formats according to some embodiments.
Figure 7:
Figure 7:
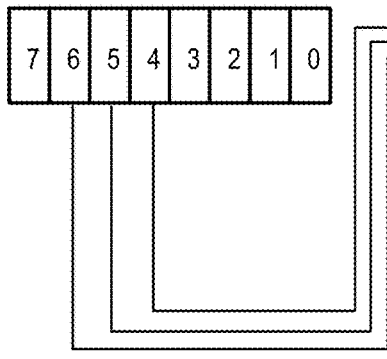

FIG. 7 is a block diagram illustrating graphics processor instruction formats 700 according to some embodiments. In one or more embodiment, the graphics processor cores support an instruction set having instructions in multiple formats. The solid lined boxes illustrate the components that are generally included in a graphics core instruction, while the dashed lines include components that are optional or that are only included in a sub-set of the instructions. In some embodiments, the graphics processor instruction format 700 described and illustrated are macro-instructions, in that they are instructions supplied to the graphics core, as opposed to micro-operations resulting from instruction decode once the instruction is processed. Thus, a single instruction may cause hardware to perform multiple micro-operations.

In some embodiments, the graphics processor natively supports instructions in a 128-bit instruction format 710. A 64-bit compacted instruction format 730 is available for some instructions based on the selected instruction, instruction options, and number of operands. The native 128-bit instruction format 710 provides access to all instruction options, while some options and operations are restricted in the 64-bit format 730. The native instructions available in the 64-bit format 730 vary by embodiment. In some embodiments, the instruction is compacted in part using a set of index values in an index field 713. The graphics core hardware references a set of compaction tables based on the index values and uses the compaction table outputs to reconstruct a native instruction in the 128-bit instruction format 710. Other sizes and formats of instruction can be used.

For each format, instruction opcode 712 defines the operation that the graphics core is to perform. The graphics cores execute each instruction in parallel across the multiple data elements of each operand. For example, in response to an add instruction the graphics core performs a simultaneous add operation across each color channel representing a texture element or picture element. By default, the graphics core performs each instruction across all data channels of the operands. In some embodiments, instruction control field 714 enables control over certain execution options, such as channels selection (e.g., predication) and data channel order (e.g., swizzle). For instructions in the 128-bit instruction format 710 an exec-size field 716 limits the number of data channels that will be executed in parallel. In some embodiments, exec-size field 716 is not available for use in the 64-bit compact instruction format 730.

Some graphics core instructions have up to three operands including two source operands, src0 720, src1 722, and one destination 718. In some embodiments, the graphics cores support dual destination instructions, where one of the destinations is implied. Data manipulation instructions can have a third source operand (e.g., SRC2 724), where the instruction opcode 712 determines the number of source operands. An instruction's last source operand can be an immediate (e.g., hard-coded) value passed with the instruction.

In some embodiments, the 128-bit instruction format 710 includes an access/address mode field 726 specifying, for example, whether direct register addressing mode or indirect register addressing mode is used. When direct register addressing mode is used, the register address of one or more operands is directly provided by bits in the instruction.

In some embodiments, the 128-bit instruction format 710 includes an access/address mode field 726, which specifies an address mode and/or an access mode for the instruction. In one embodiment the access mode is used to define a data access alignment for the instruction. Some embodiments support access modes including a 16-byte aligned access mode and a 1-byte aligned access mode, where the byte alignment of the access mode determines the access alignment of the instruction operands. For example, when in a first mode, the instruction may use byte-aligned addressing for source and destination operands and when in a second mode, the instruction may use 16-byte-aligned addressing for all source and destination operands.

In one embodiment, the address mode portion of the access/address mode field 726 determines whether the instruction is to use direct or indirect addressing. When direct register addressing mode is used bits in the instruction directly provide the register address of one or more operands. When indirect register addressing mode is used, the register address of one or more operands may be computed based on an address register value and an address immediate field in the instruction.

In some embodiments instructions are grouped based on opcode 712 bit-fields to simplify Opcode decode 740. For an 8-bit opcode, bits 4, 5, and 6 allow the graphics core to determine the type of opcode. The precise opcode grouping shown is merely an example. In some embodiments, a move and logic opcode group 742 includes data movement and logic instructions (e.g., move (mov), compare (cmp)). In some embodiments, move and logic group 742 shares the five most significant bits (MSB), where move (mov) instructions are in the form of 0000xxxxb and logic instructions are in the form of 0001xxxxb. A flow control instruction group 744 (e.g., call, jump (jmp)) includes instructions in the form of 0010xxxxb (e.g., 0x20). A miscellaneous instruction group 746 includes a mix of instructions, including synchronization instructions (e.g., wait, send) in the form of 0011xxxxb (e.g., 0x30). A parallel math instruction group 748 includes component-wise arithmetic instructions (e.g., add, multiply (mul)) in the form of 0100xxxxb (e.g., 0x40). The parallel math instruction group 748 performs the arithmetic operations in parallel across data channels. The vector math group 750 includes arithmetic instructions (e.g., dp4) in the form of 0101xxxxb (e.g., 0x50). The vector math group performs arithmetic such as dot product calculations on vector operands. The illustrated opcode decode 740, in one embodiment, can be used to determine which portion of a graphics core will be used to execute a decoded instruction. For example, some instructions may be designated as systolic instructions that will be performed by a systolic array. Other instructions, such as ray-tracing instructions (not shown) can be routed to a ray-tracing core or ray-tracing logic within a slice or partition of execution logic.

Graphics Pipeline

Figure 8:
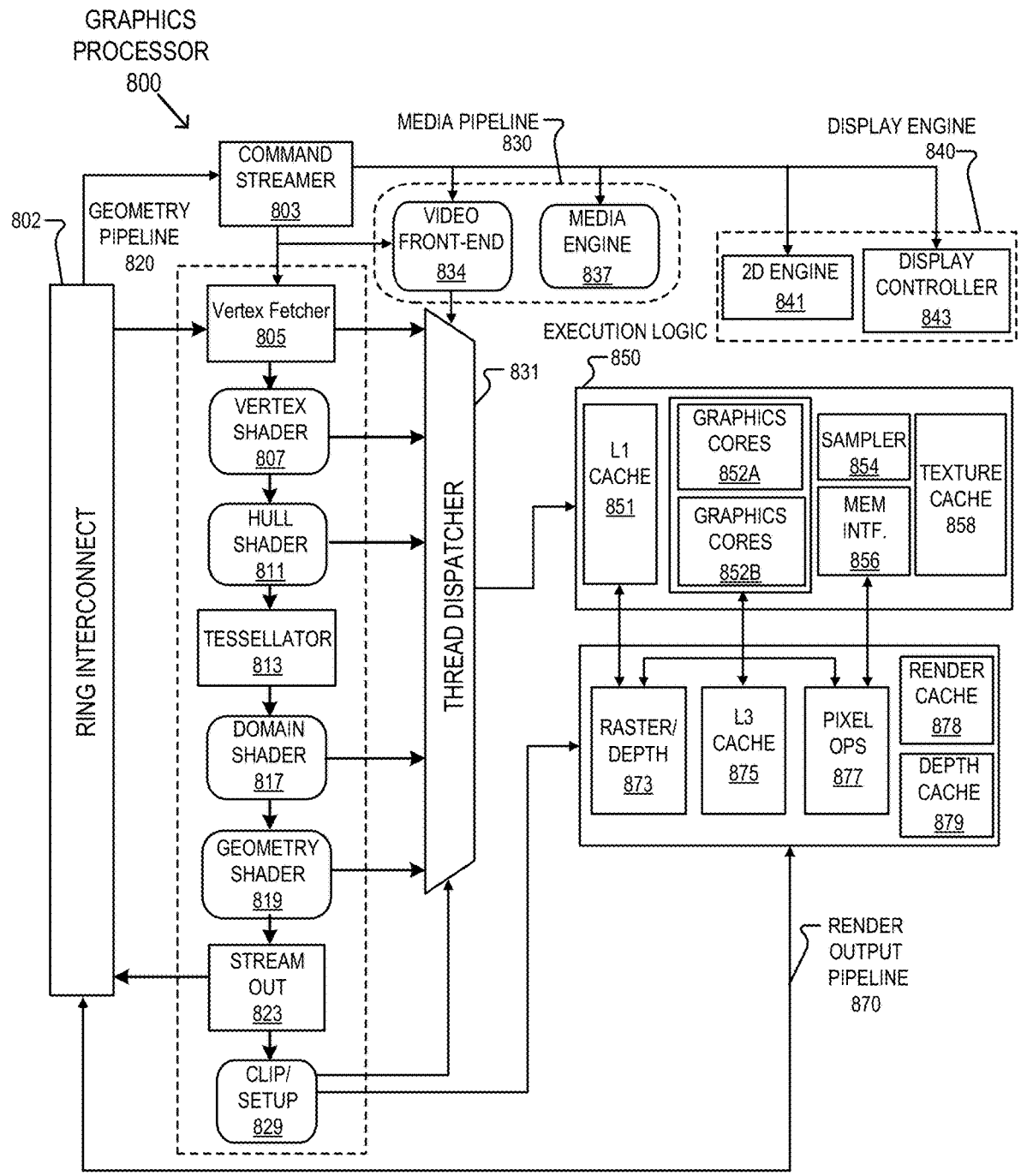
FIG. 8 is a block diagram of another embodiment of a graphics processor.

FIG. 8 is a block diagram of another embodiment of a graphics processor 800. Elements of FIG. 8 having the same reference numbers (or names) as the elements of any other figure herein can operate or function in any manner similar to that described elsewhere herein, but are not limited to such.

In some embodiments, graphics processor 800 includes a geometry pipeline 820, a media pipeline 830, a display engine 840, thread execution logic 850, and a render output pipeline 870. In some embodiments, graphics processor 800 is a graphics processor within a multi-core processing system that includes one or more general-purpose processing cores. The graphics processor is controlled by register writes to one or more control registers (not shown) or via commands issued to graphics processor 800 via a ring interconnect 802. In some embodiments, ring interconnect 802 couples graphics processor 800 to other processing components, such as other graphics processors or general-purpose processors. Commands from ring interconnect 802 are interpreted by a command streamer 803, which supplies instructions to individual components of the geometry pipeline 820 or the media pipeline 830.

In some embodiments, command streamer 803 directs the operation of a vertex fetcher 805 that reads vertex data from memory and executes vertex-processing commands provided by command streamer 803. In some embodiments, vertex fetcher 805 provides vertex data to a vertex shader 807, which performs coordinate space transformation and lighting operations to each vertex. In some embodiments, vertex fetcher 805 and vertex shader 807 execute vertex-processing instructions by dispatching execution threads to graphics cores 852A-852B via a thread dispatcher 831.

In some embodiments, graphics cores 852A-852B are an array of vector processors having an instruction set for performing graphics and media operations. In some embodiments, graphics cores 852A-852B have an attached L1 cache 851 that is specific for each array or shared between the arrays. The cache can be configured as a data cache, an instruction cache, or a single cache that is partitioned to contain data and instructions in different partitions.

In some embodiments, geometry pipeline 820 includes tessellation components to perform hardware-accelerated tessellation of 3D objects. In some embodiments, a programmable hull shader 811 configures the tessellation operations. A programmable domain shader 817 provides back-end evaluation of tessellation output. A tessellator 813 operates at the direction of hull shader 811 and contains special purpose logic to generate a set of detailed geometric objects based on a coarse geometric model that is provided as input to geometry pipeline 820. In some embodiments, if tessellation is not used, tessellation components (e.g., hull shader 811, tessellator 813, and domain shader 817) can be bypassed. The tessellation components can operate based on data received from the vertex shader 807.

In some embodiments, complete geometric objects can be processed by a geometry shader 819 via one or more threads dispatched to graphics cores 852A-852B or can proceed directly to the clipper 829. In some embodiments, the geometry shader operates on entire geometric objects, rather than vertices or patches of vertices as in previous stages of the graphics pipeline. If the tessellation is disabled the geometry shader 819 receives input from the vertex shader 807. In some embodiments, geometry shader 819 is programmable by a geometry shader program to perform geometry tessellation if the tessellation units are disabled.

Before rasterization, a clipper 829 processes vertex data. The clipper 829 may be a fixed function clipper or a programmable clipper having clipping and geometry shader functions. In some embodiments, a rasterizer and depth test component 873 in the render output pipeline 870 dispatches pixel shaders to convert the geometric objects into per pixel representations. In some embodiments, pixel shader logic is included in thread execution logic 850. In some embodiments, an application can bypass the rasterizer and depth test component 873 and access un-rasterized vertex data via a stream out unit 823.

The graphics processor 800 has an interconnect bus, interconnect fabric, or some other interconnect mechanism that allows data and message passing amongst the major components of the processor. In some embodiments, graphics cores 852A-852B and associated logic units (e.g., L1 cache 851, sampler 854, texture cache 858, etc.) interconnect via a data port 856 to perform memory access and communicate with render output pipeline components of the processor. In some embodiments, sampler 854, caches 851, 858 and graphics cores 852A-852B each have separate memory access paths. In one embodiment the texture cache 858 can also be configured as a sampler cache.

In some embodiments, render output pipeline 870 contains a rasterizer and depth test component 873 that converts vertex-based objects into an associated pixel-based representation. In some embodiments, the rasterizer logic includes a windower/masker unit to perform fixed function triangle and line rasterization. An associated render cache 878 and depth cache 879 are also available in some embodiments. A pixel operations component 877 performs pixel-based operations on the data, though in some instances, pixel operations associated with 2D operations (e.g., bit block image transfers with blending) are performed by the 2D engine 841, or substituted at display time by the display controller 843 using overlay display planes. In some embodiments, a shared L3 cache 875 is available to all graphics components, allowing the sharing of data without the use of main system memory.

In some embodiments, media pipeline 830 includes a media engine 837 and a video front-end 834. In some embodiments, video front-end 834 receives pipeline commands from the command streamer 803. In some embodiments, media pipeline 830 includes a separate command streamer. In some embodiments, video front-end 834 processes media commands before sending the command to the media engine 837. In some embodiments, media engine 837 includes thread spawning functionality to spawn threads for dispatch to thread execution logic 850 via thread dispatcher 831.

In some embodiments, graphics processor 800 includes a display engine 840. In some embodiments, display engine 840 is external to processor 800 and couples with the graphics processor via the ring interconnect 802, or some other interconnect bus or fabric. In some embodiments, display engine 840 includes a 2D engine 841 and a display controller 843. In some embodiments, display engine 840 contains special purpose logic capable of operating independently of the 3D pipeline. In some embodiments, display controller 843 couples with a display device (not shown), which may be a system integrated display device, as in a laptop computer, or an external display device attached via a display device connector.

In some embodiments, the geometry pipeline 820 and media pipeline 830 are configurable to perform operations based on multiple graphics and media programming interfaces and are not specific to any one application programming interface (API). In some embodiments, driver software for the graphics processor translates API calls that are specific to a particular graphics or media library into commands that can be processed by the graphics processor. In some embodiments, support is provided for the Open Graphics Library (OpenGL), Open Computing Language (OpenCL), and/or Vulkan graphics and compute API, all from the Khronos Group. In some embodiments, support may also be provided for the Direct3D library from the Microsoft Corporation. In some embodiments, a combination of these libraries may be supported. Support may also be provided for the Open Source Computer Vision Library (OpenCV). A future API with a compatible 3D pipeline would also be supported if a mapping can be made from the pipeline of the future API to the pipeline of the graphics processor.

Graphics Pipeline Programming

Figure 9A:
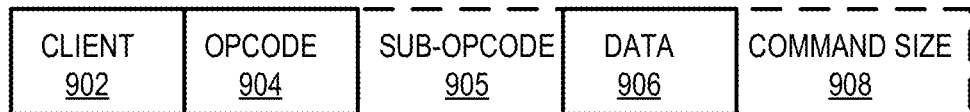
FIG. 9A is a block diagram illustrating a graphics processor command format that may be used to program graphics processing pipelines according to some embodiments.
Figure 9B:
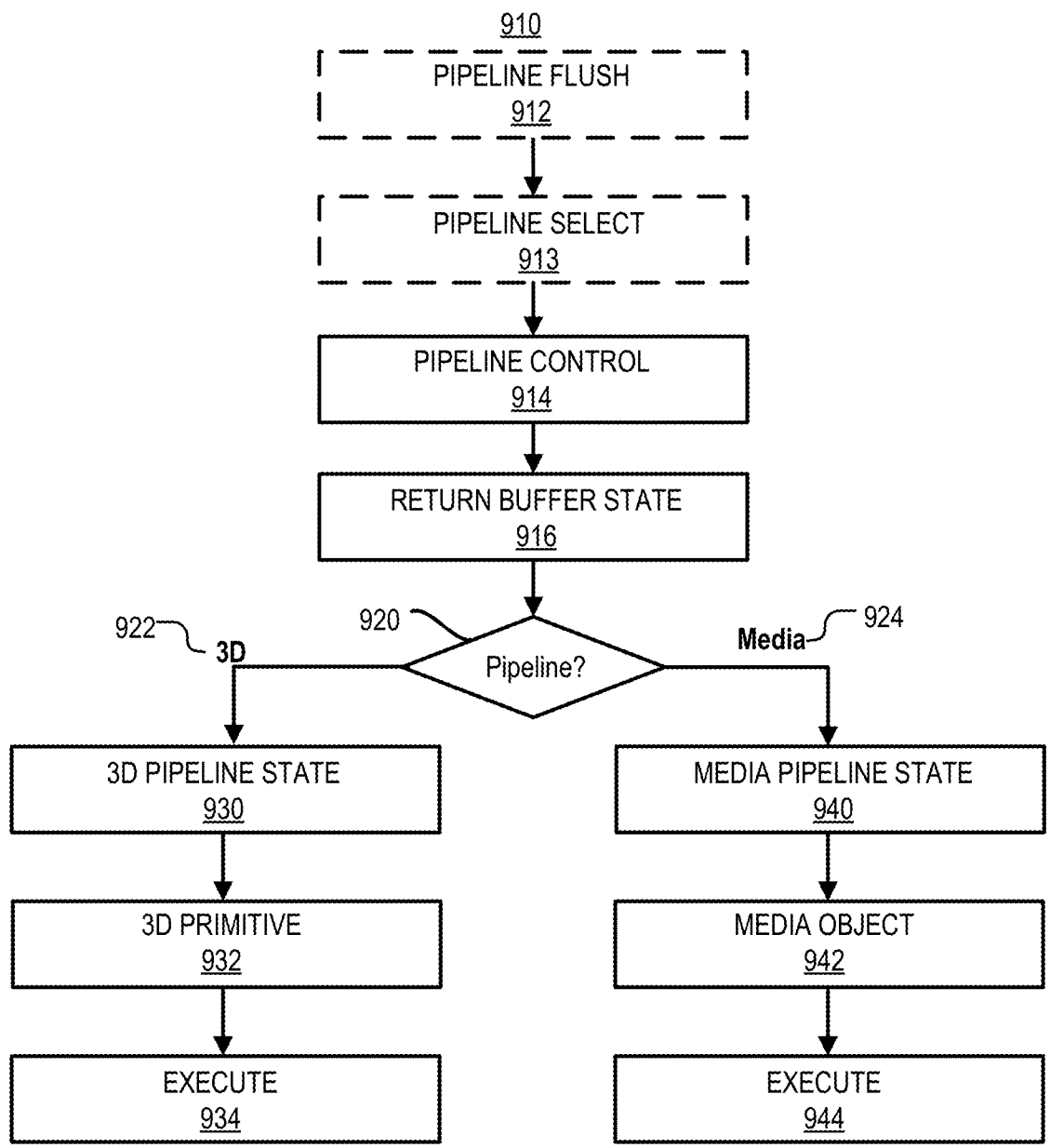
FIG. 9B is a block diagram illustrating a graphics processor command sequence according to an embodiment.

FIG. 9A is a block diagram illustrating a graphics processor command format 900 that may be used to program graphics processing pipelines according to some embodiments. FIG. 9B is a block diagram illustrating a graphics processor command sequence 910 according to an embodiment. The solid lined boxes in FIG. 9A illustrate the components that are generally included in a graphics command while the dashed lines include components that are optional or that are only included in a sub-set of the graphics commands. The exemplary graphics processor command format 900 of FIG. 9A includes data fields to identify a client 902, a command operation code (opcode) 904, and a data field 906 for the command. A sub-opcode 905 and a command size 908 are also included in some commands.

In some embodiments, client 902 specifies the client unit of the graphics device that processes the command data. In some embodiments, a graphics processor command parser examines the client field of each command to condition the further processing of the command and route the command data to the appropriate client unit. In some embodiments, the graphics processor client units include a memory interface unit, a render unit, a 2D unit, a 3D unit, and a media unit. Each client unit has a corresponding processing pipeline that processes the commands. Once the command is received by the client unit, the client unit reads the opcode 904 and, if present, sub-opcode 905 to determine the operation to perform. The client unit performs the command using information in data field 906. For some commands an explicit command size 908 is expected to specify the size of the command. In some embodiments, the command parser automatically determines the size of at least some of the commands based on the command opcode. In some embodiments commands are aligned via multiples of a double word. Other command formats can be used.

The flow diagram in FIG. 9B illustrates an exemplary graphics processor command sequence 910. In some embodiments, software or firmware of a data processing system that features an embodiment of a graphics processor uses a version of the command sequence shown to set up, execute, and terminate a set of graphics operations. A sample command sequence is shown and described for purposes of example only as embodiments are not limited to these specific commands or to this command sequence. Moreover, the commands may be issued as batch of commands in a command sequence, such that the graphics processor will process the sequence of commands in at least partially concurrence.

In some embodiments, the graphics processor command sequence 910 may begin with a pipeline flush command 912 to cause any active graphics pipeline to complete the currently pending commands for the pipeline. In some embodiments, the 3D pipeline 922 and the media pipeline 924 do not operate concurrently. The pipeline flush is performed to cause the active graphics pipeline to complete any pending commands. In response to a pipeline flush, the command parser for the graphics processor will pause command processing until the active drawing engines complete pending operations and the relevant read caches are invalidated. Optionally, any data in the render cache that is marked 'dirty' can be flushed to memory. In some embodiments, pipeline flush command 912 can be used for pipeline synchronization or before placing the graphics processor into a low power state.

In some embodiments, a pipeline select command 913 is used when a command sequence requires the graphics processor to explicitly switch between pipelines. In some embodiments, a pipeline select command 913 is required only once within an execution context before issuing pipeline commands unless the context is to issue commands for both pipelines. In some embodiments, a pipeline flush command 912 is required immediately before a pipeline switch via the pipeline select command 913.

In some embodiments, a pipeline control command 914 configures a graphics pipeline for operation and is used to program the 3D pipeline 922 and the media pipeline 924. In some embodiments, pipeline control command 914 configures the pipeline state for the active pipeline. In one embodiment, the pipeline control command 914 is used for pipeline synchronization and to clear data from one or more cache memories within the active pipeline before processing a batch of commands.

In some embodiments, commands related to the return buffer state 916 are used to configure a set of return buffers for the respective pipelines to write data. Some pipeline operations require the allocation, selection, or configuration of one or more return buffers into which the operations write intermediate data during processing. In some embodiments, the graphics processor also uses one or more return buffers to store output data and to perform cross thread communication. In some embodiments, the return buffer state 916 includes selecting the size and number of return buffers to use for a set of pipeline operations.

The remaining commands in the command sequence differ based on the active pipeline for operations. Based on a pipeline determination 920, the command sequence is tailored to the 3D pipeline 922 beginning with the 3D pipeline state 930 or the media pipeline 924 beginning at the media pipeline state 940.

The commands to configure the 3D pipeline state 930 include 3D state setting commands for vertex buffer state, vertex element state, constant color state, depth buffer state, and other state variables that are to be configured before 3D primitive commands are processed. The values of these commands are determined at least in part based on the particular 3D API in use. In some embodiments, 3D pipeline state 930 commands are also able to selectively disable or bypass certain pipeline elements if those elements will not be used.

In some embodiments, 3D primitive 932 command is used to submit 3D primitives to be processed by the 3D pipeline. Commands and associated parameters that are passed to the graphics processor via the 3D primitive 932 command are forwarded to the vertex fetch function in the graphics pipeline. The vertex fetch function uses the 3D primitive 932 command data to generate vertex data structures. The vertex data structures are stored in one or more return buffers. In some embodiments, 3D primitive 932 command is used to perform vertex operations on 3D primitives via vertex shaders. To process vertex shaders, 3D pipeline 922 dispatches shader programs to the graphics cores.

In some embodiments, 3D pipeline 922 is triggered via an execute 934 command or event. In some embodiments, a register write triggers command execution. In some embodiments execution is triggered via a 'go' or 'kick' command in the command sequence. In one embodiment, command execution is triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back-end operations may also be included for those operations.

In some embodiments, the graphics processor command sequence 910 follows the media pipeline 924 path when performing media operations. In general, the specific use and manner of programming for the media pipeline 924 depends on the media or compute operations to be performed. Specific media decode operations may be offloaded to the media pipeline during media decode. In some embodiments, the media pipeline can also be bypassed and media decode can be performed in whole or in part using resources provided by one or more general-purpose processing cores. In one embodiment, the media pipeline also includes elements for general-purpose graphics processor unit (GPGPU) operations, where the graphics processor is used to perform SIMD vector operations using computational shader programs that are not explicitly related to the rendering of graphics primitives.

In some embodiments, media pipeline 924 is configured in a similar manner as the 3D pipeline 922. A set of commands to configure the media pipeline state 940 are dispatched or placed into a command queue before the media object commands 942. In some embodiments, commands for the media pipeline state 940 include data to configure the media pipeline elements that will be used to process the media objects. This includes data to configure the video decode and video encode logic within the media pipeline, such as encode or decode format. In some embodiments, commands for the media pipeline state 940 also support the use of one or more pointers to "indirect" state elements that contain a batch of state settings.

In some embodiments, media object commands 942 supply pointers to media objects for processing by the media pipeline. The media objects include memory buffers containing video data to be processed. In some embodiments, all media pipeline states must be valid before issuing a media object command 942. Once the pipeline state is configured and media object commands 942 are queued, the media pipeline 924 is triggered via an execute command 944 or an equivalent execute event (e.g., register write). Output from media pipeline 924 may then be post processed by operations provided by the 3D pipeline 922 or the media pipeline 924. In some embodiments, GPGPU operations are configured and executed in a similar manner as media operations.

Graphics Software Architecture

Figure 10:
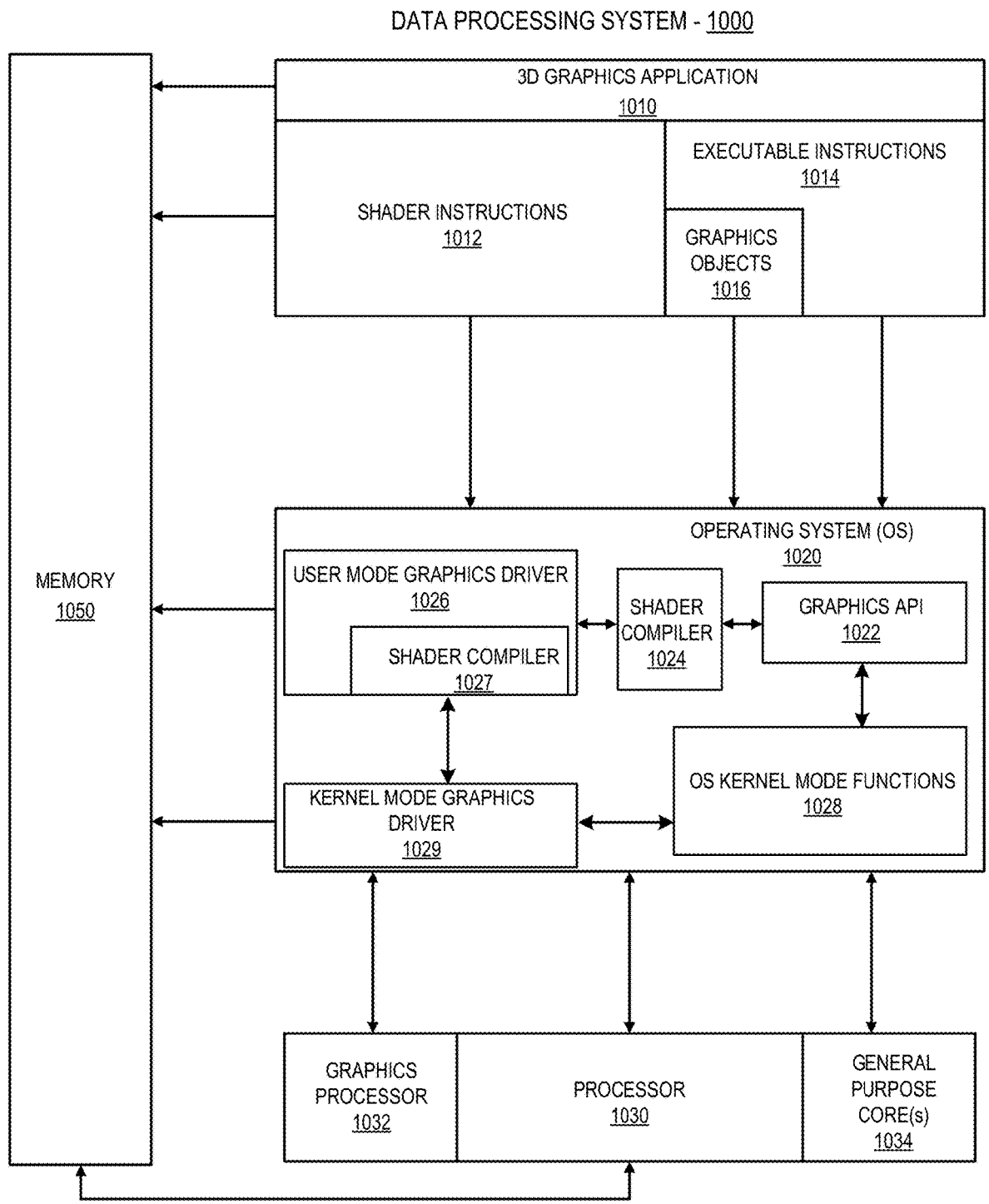
FIG. 10 illustrates an exemplary graphics software architecture for a data processing system according to some embodiments.

FIG. 10 illustrates an exemplary graphics software architecture for a data processing system 1000 according to some embodiments. In some embodiments, software architecture includes a 3D graphics application 1010, an operating system 1020, and at least one processor 1030. In some embodiments, processor 1030 includes a graphics processor 1032 and one or more general-purpose processor core(s) 1034. The graphics application 1010 and operating system 1020 each execute in the system memory 1050 of the data processing system.

In some embodiments, 3D graphics application 1010 contains one or more shader programs including shader instructions 1012. The shader language instructions may be in a high-level shader language, such as the High-Level Shader Language (HLSL) of Direct3D, the OpenGL Shader Language (GLSL), and so forth. The application also includes executable instructions 1014 in a machine language suitable for execution by the general-purpose processor core 1034. The application also includes graphics objects 1016 defined by vertex data.

In some embodiments, operating system 1020 is a Microsoft® Windows® operating system from the Microsoft Corporation, a proprietary UNIX-like operating system, or an open source UNIX-like operating system using a variant of the Linux kernel. The operating system 1020 can support a graphics API 1022 such as the Direct3D API, the OpenGL API, or the Vulkan API. When the Direct3D API is in use, the operating system 1020 uses a front-end shader compiler 1024 to compile any shader instructions 1012 in HLSL into a lower-level shader language. The compilation may be a just-in-time (JIT) compilation or the application can perform shader pre-compilation. In some embodiments, high-level shaders are compiled into low-level shaders during the compilation of the 3D graphics application 1010. In some embodiments, the shader instructions 1012 are provided in an intermediate form, such as a version of the Standard Portable Intermediate Representation (SPIR) used by the Vulkan API.

In some embodiments, user mode graphics driver 1026 contains a back-end shader compiler 1027 to convert the shader instructions 1012 into a hardware specific representation. When the OpenGL API is in use, shader instructions 1012 in the GLSL high-level language are passed to a user mode graphics driver 1026 for compilation. In some embodiments, user mode graphics driver 1026 uses operating system kernel mode functions 1028 to communicate with a kernel mode graphics driver 1029. In some embodiments, kernel mode graphics driver 1029 communicates with graphics processor 1032 to dispatch commands and instructions.

IP Core Implementations

One or more aspects of at least one embodiment may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP cores," are reusable units of logic for an integrated circuit that may be stored on a tangible, machine-readable medium as a hardware model that describes the structure of the integrated circuit. The hardware model may be supplied to various customers or manufacturing facilities, which load the hardware model on fabrication machines that manufacture the integrated circuit. The integrated circuit may be fabricated such that the circuit performs operations described in association with any of the embodiments described herein.

Figure 11A:
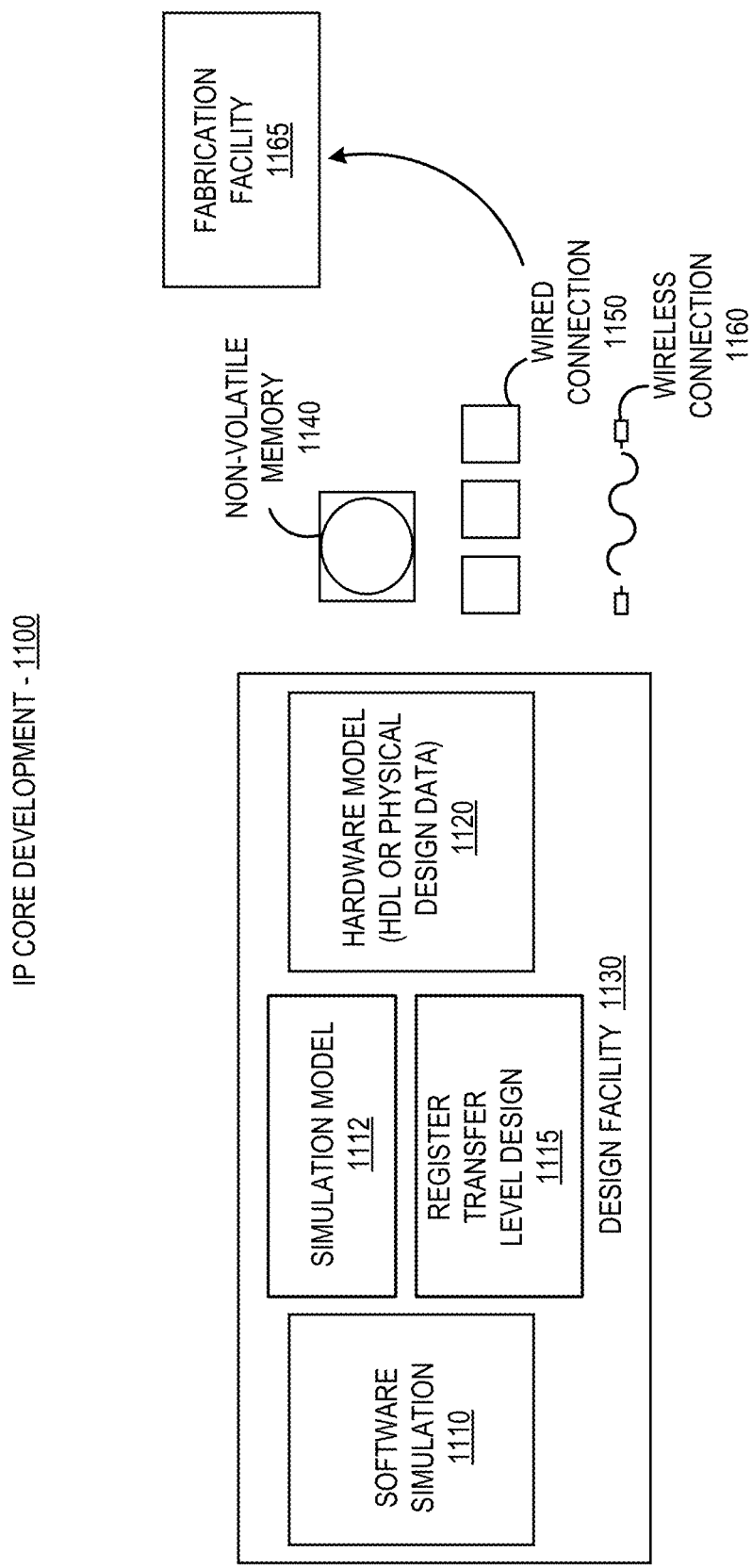
FIG. 11A is a block diagram illustrating an IP core development system that may be used to manufacture an integrated circuit to perform operations according to an embodiment.

FIG. 11A is a block diagram illustrating an IP core development system 1100 that may be used to manufacture an integrated circuit to perform operations according to an embodiment. The IP core development system 1100 may be used to generate modular, re-usable designs that can be incorporated into a larger design or used to construct an entire integrated circuit (e.g., an SOC integrated circuit). A design facility 1130 can generate a software simulation 1110 of an IP core design in a high-level programming language (e.g., C/C++). The software simulation 1110 can be used to design, test, and verify the behavior of the IP core using a simulation model 1112. The simulation model 1112 may include functional, behavioral, and/or timing simulations. A register transfer level (RTL) design 1115 can then be created or synthesized from the simulation model 1112. The RTL design 1115 is an abstraction of the behavior of the integrated circuit that models the flow of digital signals between hardware registers, including the associated logic performed using the modeled digital signals. In addition to an RTL design 1115, lower-level designs at the logic level or transistor level may also be created, designed, or synthesized. Thus, the particular details of the initial design and simulation may vary.

The RTL design 1115 or equivalent may be further synthesized by the design facility into a hardware model 1120, which may be in a hardware description language (HDL), or some other representation of physical design data. The HDL may be further simulated or tested to verify the IP core design. The IP core design can be stored for delivery to a $3^{rd}$ party fabrication facility 1165 using non-volatile memory 1140 (e.g., hard disk, flash memory, or any non-volatile storage medium). Alternatively, the IP core design may be transmitted (e.g., via the Internet) over a wired connection 1150 or wireless connection 1160. The fabrication facility 1165 may then fabricate an integrated circuit that is based at least in part on the IP core design. The fabricated integrated circuit can be configured to perform operations in accordance with at least one embodiment described herein.

Figure 11B:
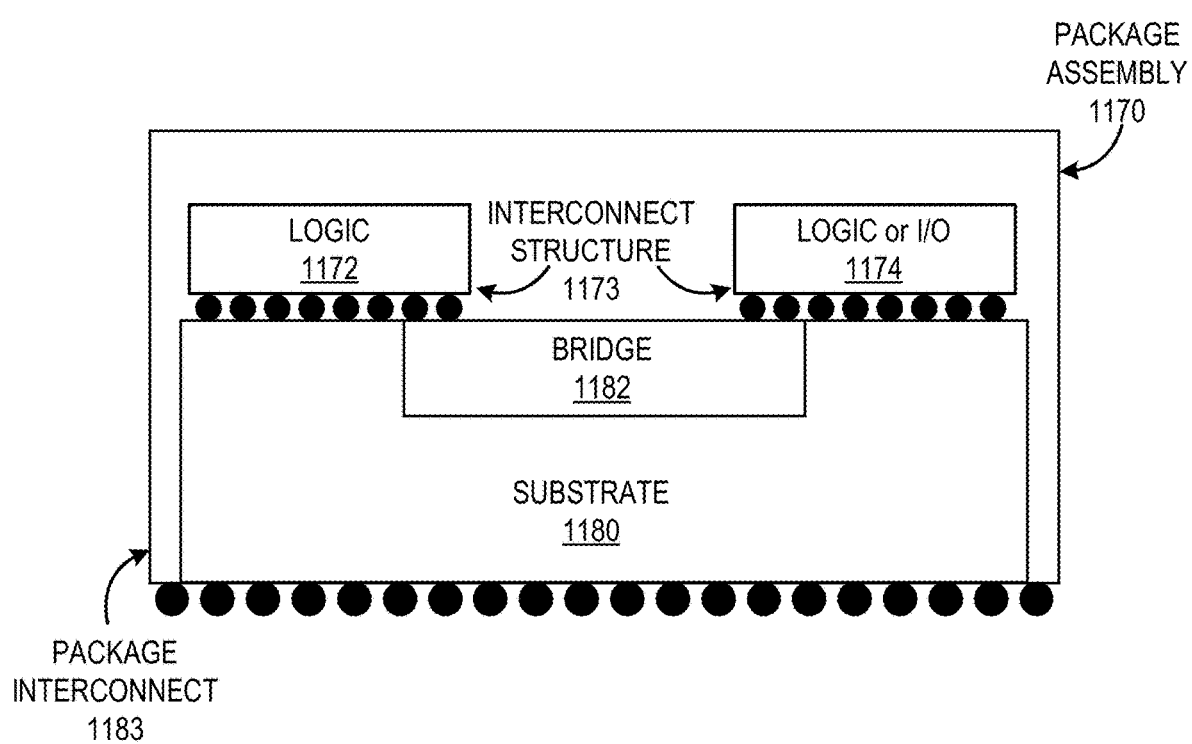
FIG. 11B illustrates a cross-section side view of an integrated circuit package assembly 1170, according to some embodiments described herein.
Figure 11C:
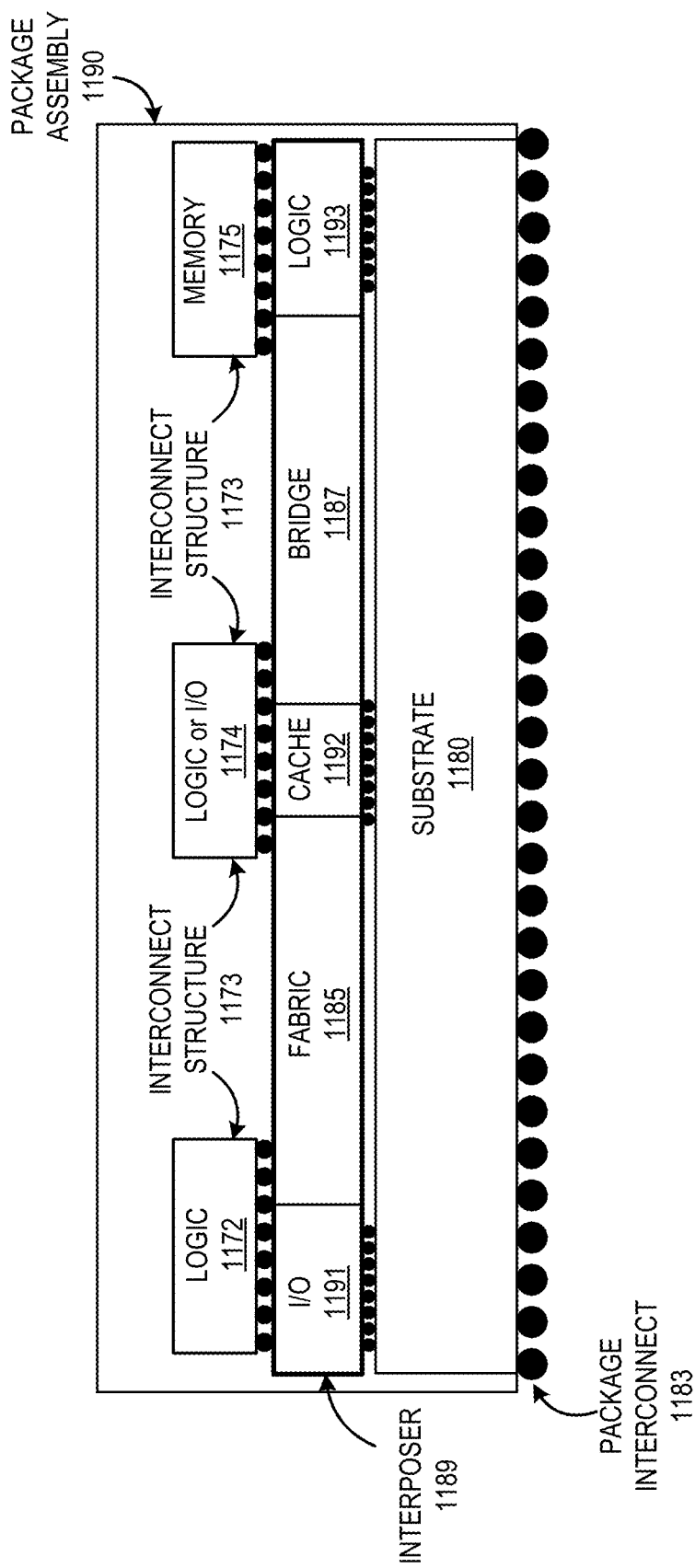
FIG. 11C illustrates a package assembly that includes multiple units of hardware logic chiplets connected to a substrate.

FIG. 11B illustrates a cross-section side view of an integrated circuit package assembly 1170, according to some embodiments described herein. The integrated circuit package assembly 1170 illustrates an implementation of one or more processor or accelerator devices as described herein. The package assembly 1170 includes multiple units of hardware logic 1172, 1174 connected to a substrate 1180. The logic 1172, 1174 may be implemented at least partly in configurable logic or fixed-functionality logic hardware, and can include one or more portions of any of the processor core(s), graphics processor(s), or other accelerator devices described herein. Each unit of logic 1172, 1174 can be implemented within a semiconductor die and coupled with the substrate 1180 via an interconnect structure 1173. The interconnect structure 1173 may be configured to route electrical signals between the logic 1172, 1174 and the substrate 1180, and can include interconnects such as, but not limited to bumps or pillars. In some embodiments, the interconnect structure 1173 may be configured to route electrical signals such as, for example, input/output (I/O) signals and/or power or ground signals associated with the operation of the logic 1172, 1174. In some embodiments, the substrate 1180 is an epoxy-based laminate substrate. The substrate 1180 may include other suitable types of substrates in other embodiments. The package assembly 1170 can be connected to other electrical devices via a package interconnect 1183. The package interconnect 1183 may be coupled to a surface of the substrate 1180 to route electrical signals to other electrical devices, such as a motherboard, other chipset, or multi-chip module.

In some embodiments, the units of logic 1172, 1174 are electrically coupled with a bridge 1182 that is configured to route electrical signals between the logic 1172, 1174. The bridge 1182 may be a dense interconnect structure that provides a route for electrical signals. The bridge 1182 may include a bridge substrate composed of glass or a suitable semiconductor material. Electrical routing features can be formed on the bridge substrate to provide a chip-to-chip connection between the logic 1172, 1174.

Although two units of logic 1172, 1174 and a bridge 1182 are illustrated, embodiments described herein may include more or fewer logic units on one or more dies. The one or more dies may be connected by zero or more bridges, as the bridge 1182 may be excluded when the logic is included on a single die. Alternatively, multiple dies or units of logic can be connected by one or more bridges. Additionally, multiple logic units, dies, and bridges can be connected together in other possible configurations, including three-dimensional configurations.

FIG. 11C illustrates a package assembly 1190 that includes multiple units of hardware logic chiplets connected to a substrate 1180. A graphics processing unit, parallel processor, and/or compute accelerator as described herein can be composed from diverse silicon chiplets that are separately manufactured. A diverse set of chiplets with different IP core logic can be assembled into a single device. Additionally, the chiplets can be integrated into a base die or base chiplet using active interposer technology. The concepts described herein enable the interconnection and communication between the different forms of IP within the GPU. IP cores can be manufactured using different process technologies and composed during manufacturing, which avoids the complexity of converging multiple IPs, especially on a large SoC with several flavors IPs, to the same manufacturing process. Enabling the use of multiple process technologies improves the time to market and provides a cost-effective way to create multiple product SKUs. Additionally, the disaggregated IPs are more amenable to being power gated independently, components that are not in use on a given workload can be powered off, reducing overall power consumption.

In various embodiments a package assembly 1190 can include components and chiplets that are interconnected by a fabric 1185 and/or one or more bridges 1187. The chiplets within the package assembly 1190 may have a 2.5D arrangement using Chip-on-Wafer-on-Substrate stacking in which multiple dies are stacked side-by-side on a silicon interposer 1189 that couples the chiplets with the substrate 1180. The substrate 1180 includes electrical connections to the package interconnect 1183. In one embodiment the silicon interposer 1189 is a passive interposer that includes through-silicon vias (TSVs) to electrically couple chiplets within the package assembly 1190 to the substrate 1180. In one embodiment, silicon interposer 1189 is an active interposer that includes embedded logic in addition to TSVs. In such embodiment, the chiplets within the package assembly 1190 are arranged using 3D face to face die stacking on top of the active interposer 1189. The active interposer 1189 can include hardware logic for I/O 1191, cache memory 1192, and other hardware logic 1193, in addition to interconnect fabric 1185 and a silicon bridge 1187. The fabric 1185 enables communication between the various logic chiplets 1172, 1174 and the logic 1191, 1193 within the active interposer 1189. The fabric 1185 may be an NoC interconnect or another form of packet switched fabric that switches data packets between components of the package assembly. For complex assemblies, the fabric 1185 may be a dedicated chiplet enables communication between the various hardware logic of the package assembly 1190.

Bridge structures 1187 within the active interposer 1189 may be used to facilitate a point-to-point interconnect between, for example, logic or I/O chiplets 1174 and memory chiplets 1175. In some implementations, bridge structures 1187 may also be embedded within the substrate 1180. The hardware logic chiplets can include special purpose hardware logic chiplets 1172, logic or I/O chiplets 1174, and/or memory chiplets 1175. The hardware logic chiplets 1172 and logic or I/O chiplets 1174 may be implemented at least partly in configurable logic or fixed-functionality logic hardware and can include one or more portions of any of the processor core(s), graphics processor(s), parallel processors, or other accelerator devices described herein. The memory chiplets 1175 can be DRAM (e.g., GDDR, HBM) memory or cache (SRAM) memory. Cache memory 1192 within the active interposer 1189 (or substrate 1180) can act as a global cache for the package assembly 1190, part of a distributed global cache, or as a dedicated cache for the fabric 1185.

Each chiplet can be fabricated as separate semiconductor die and coupled with a base die that is embedded within or coupled with the substrate 1180. The coupling with the substrate 1180 can be performed via an interconnect structure 1173. The interconnect structure 1173 may be configured to route electrical signals between the various chiplets and logic within the substrate 1180. The interconnect structure 1173 can include interconnects such as, but not limited to bumps or pillars. In some embodiments, the interconnect structure 1173 may be configured to route electrical signals such as, for example, input/output (I/O) signals and/or power or ground signals associated with the operation of the logic, I/O, and memory chiplets. In one embodiment, an additional interconnect structure couples the active interposer 1189 with the substrate 1180.

In some embodiments, the substrate 1180 is an epoxy-based laminate substrate. The substrate 1180 may include other suitable types of substrates in other embodiments. The package assembly 1190 can be connected to other electrical devices via a package interconnect 1183. The package interconnect 1183 may be coupled to a surface of the substrate 1180 to route electrical signals to other electrical devices, such as a motherboard, other chipset, or multi-chip module.

In some embodiments, a logic or I/O chiplet 1174 and a memory chiplet 1175 can be electrically coupled via a bridge 1187 that is configured to route electrical signals between the logic or I/O chiplet 1174 and a memory chiplet 1175. The bridge 1187 may be a dense interconnect structure that provides a route for electrical signals. The bridge 1187 may include a bridge substrate composed of glass or a suitable semiconductor material. Electrical routing features can be formed on the bridge substrate to provide a chip-to-chip connection between the logic or I/O chiplet 1174 and a memory chiplet 1175. The bridge 1187 may also be referred to as a silicon bridge or an interconnect bridge. For example, the bridge 1187, in some embodiments, is an Embedded Multi-die Interconnect Bridge (EMIB). In some embodiments, the bridge 1187 may simply be a direct connection from one chiplet to another chiplet.

Figure 11D:
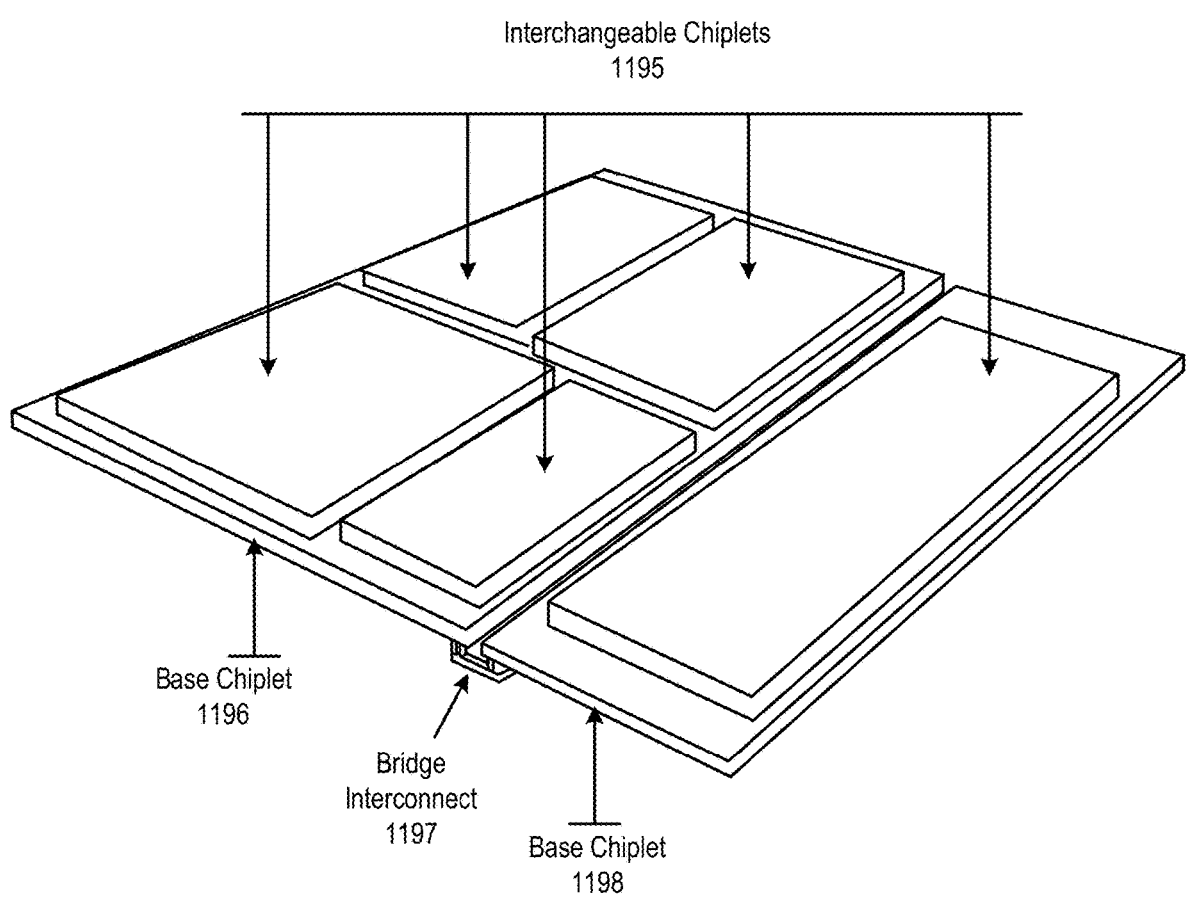
FIG. 11D illustrates a package assembly including interchangeable chiplets, according to an embodiment.

FIG. 11D illustrates a package assembly 1194 including interchangeable chiplets 1195, according to an embodiment. The interchangeable chiplets 1195 can be assembled into standardized slots on one or more base chiplets 1196, 1198. The base chiplets 1196, 1198 can be coupled via a bridge interconnect 1197, which can be similar to the other bridge interconnects described herein and may be, for example, an EMIB. Memory chiplets can also be connected to logic or I/O chiplets via a bridge interconnect. I/O and logic chiplets can communicate via an interconnect fabric. The base chiplets can each support one or more slots in a standardized format for one of logic or I/O or memory/cache.

In one embodiment, SRAM and power delivery circuits can be fabricated into one or more of the base chiplets 1196, 1198, which can be fabricated using a different process technology relative to the interchangeable chiplets 1195 that are stacked on top of the base chiplets. For example, the base chiplets 1196, 1198 can be fabricated using a larger process technology, while the interchangeable chiplets can be manufactured using a smaller process technology. One or more of the interchangeable chiplets 1195 may be memory (e.g., DRAM) chiplets. Different memory densities can be selected for the package assembly 1194 based on the power, and/or performance targeted for the product that uses the package assembly 1194. Additionally, logic chiplets with a different number of type of functional units can be selected at time of assembly based on the power, and/or performance targeted for the product. Additionally, chiplets containing IP logic cores of differing types can be inserted into the interchangeable chiplet slots, enabling hybrid processor designs that can mix and match different technology IP blocks.

Exemplary System on Chip Integrated Circuit

Figure 12:
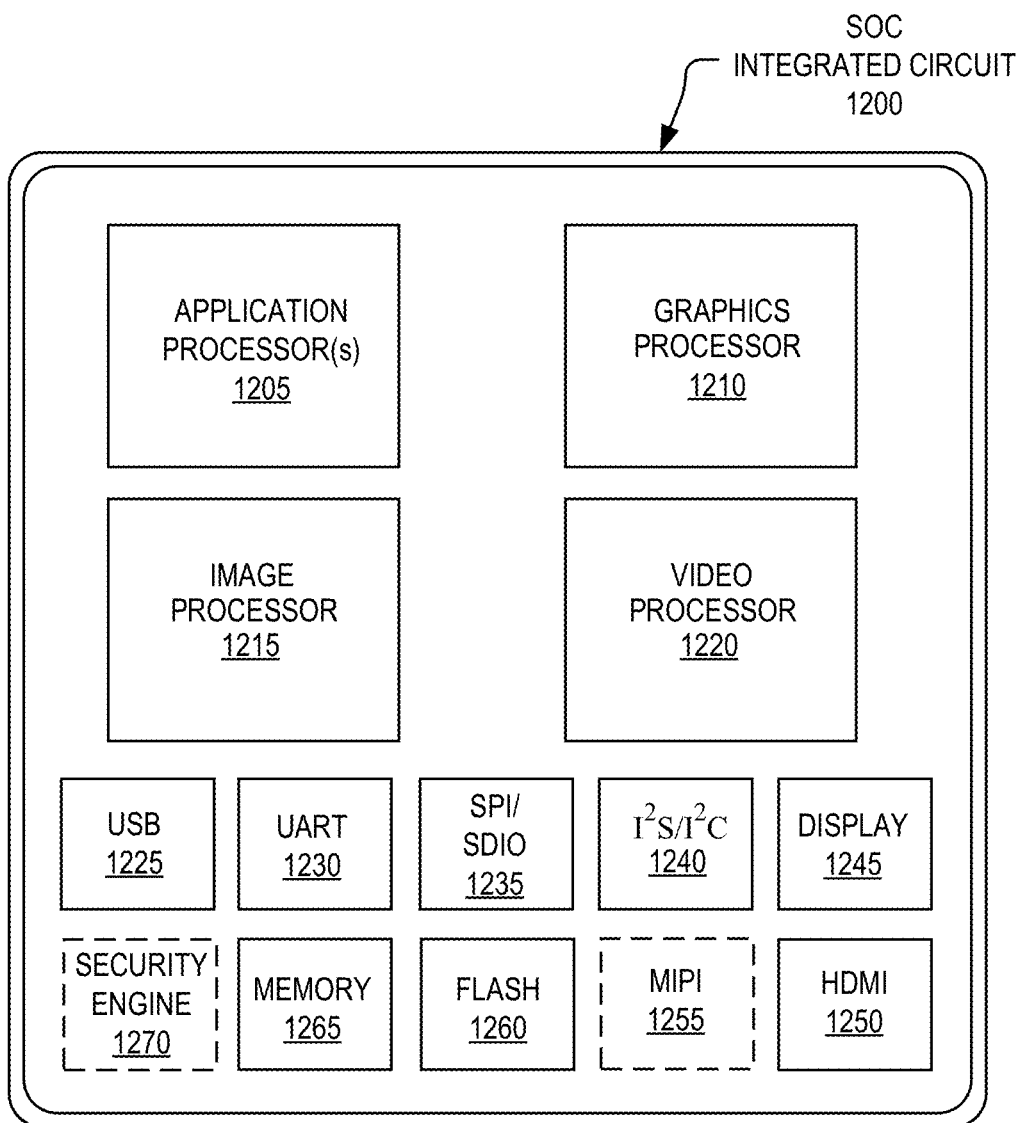
FIG. 12 is a block diagram illustrating an exemplary system on a chip integrated circuit that may be fabricated using one or more IP cores, according to an embodiment.
Figure 13A:
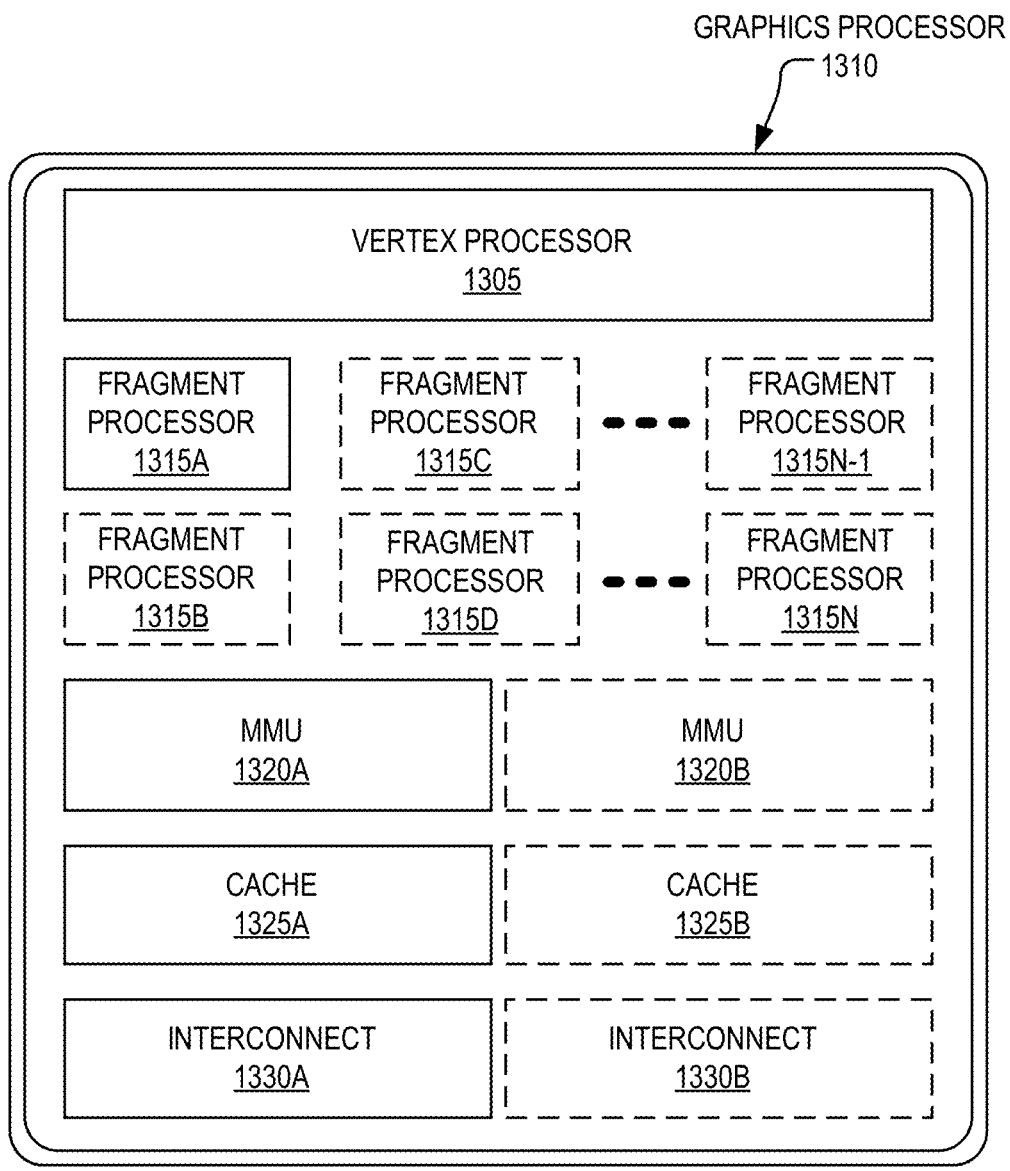
FIG. 13A illustrates an exemplary graphics processor of a system on a chip integrated circuit that may be fabricated using one or more IP cores, according to an embodiment.
Figure 13B:
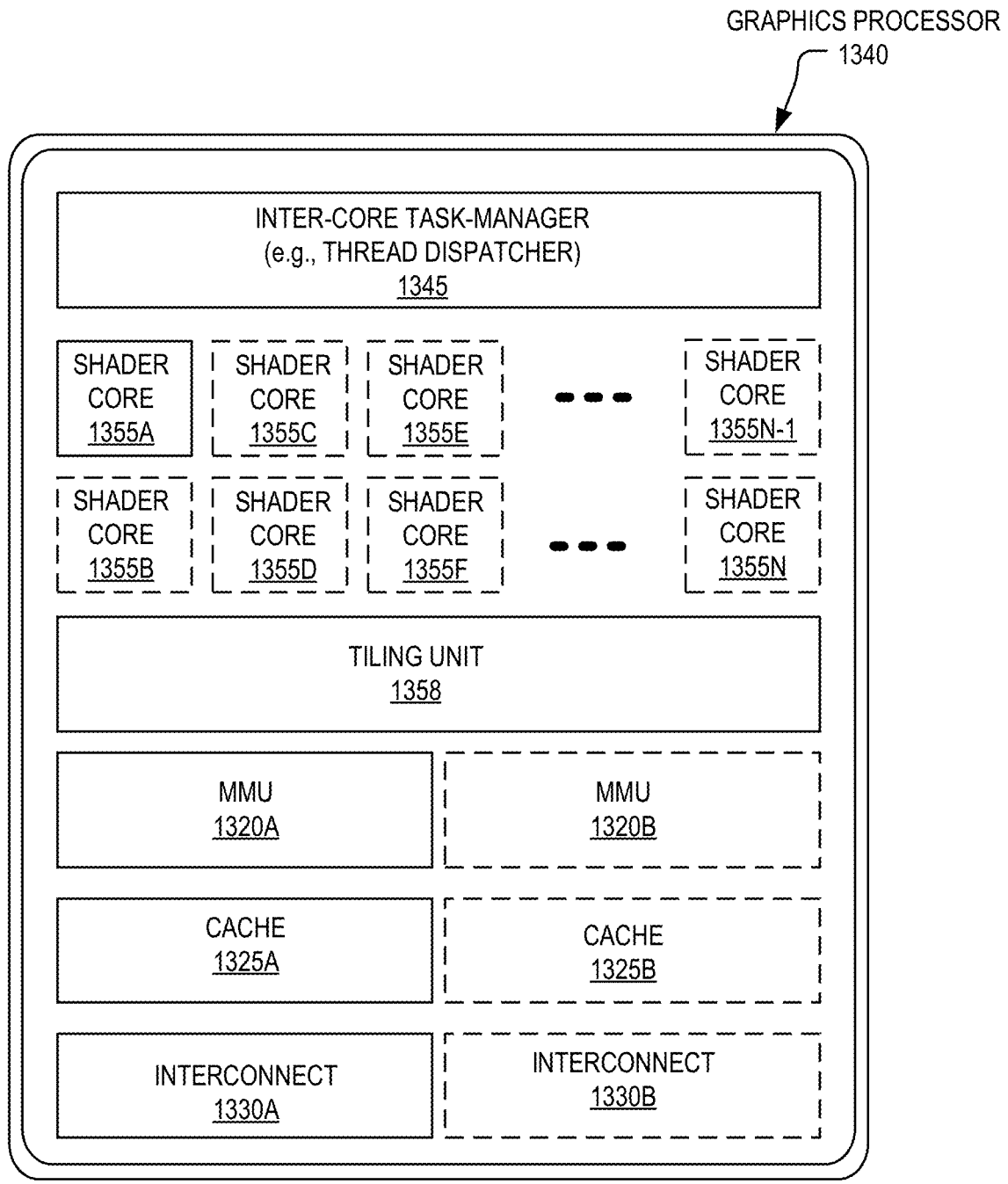
FIG. 13B illustrates an additional exemplary graphics processor 1340 of a system on a chip integrated circuit that may be fabricated using one or more IP cores, according to an embodiment.

FIGS. 12-13B illustrate exemplary integrated circuits and associated graphics processors that may be fabricated using one or more IP cores, according to various embodiments described herein. In addition to what is illustrated, other logic and circuits may be included, including additional graphics processors/cores, peripheral interface controllers, or general-purpose processor cores.

FIG. 12 is a block diagram illustrating an exemplary system on a chip integrated circuit 1200 that may be fabricated using one or more IP cores, according to an embodiment. Exemplary integrated circuit 1200 includes one or more application processor(s) 1205 (e.g., CPUs), at least one graphics processor 1210, and may additionally include an image processor 1215 and/or a video processor 1220, any of which may be a modular IP core from the same or multiple different design facilities. Integrated circuit 1200 includes peripheral or bus logic including a USB controller 1225, UART controller 1230, an SPI/SDIO controller 1235, and an I²S/I²C controller 1240. Additionally, the integrated circuit can include a display device 1245 coupled to one or more of a high-definition multimedia interface (HDMI) controller 1250 and a mobile industry processor interface (MIPI) display interface 1255. Storage may be provided by a flash memory subsystem 1260 including flash memory and a flash memory controller. Memory interface may be provided via a memory controller 1265 for access to SDRAM or SRAM memory devices. Some integrated circuits additionally include an embedded security engine 1270.

FIGS. 13A-13B are block diagrams illustrating exemplary graphics processors for use within an SoC, according to embodiments described herein. FIG. 13A illustrates an exemplary graphics processor 1310 of a system on a chip integrated circuit that may be fabricated using one or more IP cores, according to an embodiment. FIG. 13B illustrates an additional exemplary graphics processor 1340 of a system on a chip integrated circuit that may be fabricated using one or more IP cores, according to an embodiment. Graphics processor 1310 of FIG. 13A is an example of a low power graphics processor core. Graphics processor 1340 of FIG. 13B is an example of a higher performance graphics processor core. Each of graphics processor 1310 and graphics processor 1340 can be variants of the graphics processor 1210 of FIG. 12.

As shown in FIG. 13A, graphics processor 1310 includes a vertex processor 1305 and one or more fragment processor(s) 1315A-1315N (e.g., 1315A, 1315B, 1315C, 1315D, through 1315N-1, and 1315N). Graphics processor 1310 can execute different shader programs via separate logic, such that the vertex processor 1305 is optimized to execute operations for vertex shader programs, while the one or more fragment processor(s) 1315A-1315N execute fragment (e.g., pixel) shading operations for fragment or pixel shader programs. The vertex processor 1305 performs the vertex processing stage of the 3D graphics pipeline and generates primitives and vertex data. The fragment processor(s) 1315A-1315N use the primitive and vertex data generated by the vertex processor 1305 to produce a framebuffer that is displayed on a display device. In one embodiment, the fragment processor(s) 1315A-1315N are optimized to execute fragment shader programs as provided for in the OpenGL API, which may be used to perform similar operations as a pixel shader program as provided for in the Direct 3D API.

Graphics processor 1310 additionally includes one or more memory management units (MMUs) 1320A-1320B, cache(s) 1325A-1325B, and circuit interconnect(s) 1330A-1330B. The one or more MMU(s) 1320A-1320B provide for virtual to physical address mapping for the graphics processor 1310, including for the vertex processor 1305 and/or fragment processor(s) 1315A-1315N, which may reference vertex or image/texture data stored in memory, in addition to vertex or image/texture data stored in the one or more cache(s) 1325A-1325B. In one embodiment the one or more MMU(s) 1320A-1320B may be synchronized with other MMUs within the system, including one or more MMUs associated with the one or more application processor(s) 1205, image processor 1215, and/or video processor 1220 of FIG. 12, such that each processor 1205-1220 can participate in a shared or unified virtual memory system. The one or more circuit interconnect(s) 1330A-1330B enable graphics processor 1310 to interface with other IP cores within the SoC, either via an internal bus of the SoC or via a direct connection, according to embodiments.

As shown FIG. 13B, graphics processor 1340 includes the one or more MMU(s) 1320A-1320B, cache(s) 1325A-1325B, and circuit interconnect(s) 1330A-1330B of the graphics processor 1310 of FIG. 13A. Graphics processor 1340 includes one or more shader core(s) 1355A-1355N (e.g., 1355A, 1355B, 1355C, 1355D, 1355E, 1355F, through 1355N-1, and 1355N), which provides for a unified shader core architecture in which a single core or type or core can execute all types of programmable shader code, including shader program code to implement vertex shaders, fragment shaders, and/or compute shaders. The unified shader core architecture is also configurable to execute direct compiled high-level GPGPU programs (e.g., CUDA). The exact number of shader cores present can vary among embodiments and implementations. Additionally, graphics processor 1340 includes an inter-core task manager 1345, which acts as a thread dispatcher to dispatch execution threads to one or more shader cores 1355A-1355N and a tiling unit 1358 to accelerate tiling operations for tile-based rendering, in which rendering operations for a scene are subdivided in image space, for example to exploit local spatial coherence within a scene or to optimize use of internal caches.

Compact Form Factor Cooling Assembly Retention System

FIG. 14a shows an exploded view of a prior art add-in graphics card 1400. An add-in card 1400 includes a small form factor electronic circuit board 1401 (such as a printed circuit board (PCB). A connector 1402 (e.g., a PCIe connector) resides along an edge of the electronic circuit board 1401. The connector 1402 plugs into a corresponding connector of a larger circuit board such as the motherboard of a computer system (not shown in FIG. 14a).

Active electronic circuits (e.g., packaged semiconductor chips) are mounted to the board 1401 and electrically coupled to other circuits by way of signal wires that run through the circuit board 1401. One of these is a high performance chip (HPC) 103 that implements the primary functionality of the card 1400 (the particular HPC 1403 observed in FIGS. 14a,b is a graphics processing unit (GPU)).

The add-in card 1400 also includes an integrated cooling assembly to remove heat generated by the HPC 1403. The cooling assembly includes a heat sink 1404 and a tray 1405 that are separately mounted to the electronic circuit board 1401. The tray 1405 helps support the weight of heat sink 1404 and forms a housing and air-flow channel for a fan 1406 that blows ambient air through the fins of the heat sink 1404.

FIG. 14b shows a top down view of the electronic circuit board 1401. As observed in FIG. 14b, in the vicinity of the HPC 1403, there is a first set of four mounting holes 1406 for the heat sink 1404 and another set of four mounting holes 1407 for the tray 1405. Here, during assembly, nuts are placed on the underside of the electronic circuit board 1401 beneath each of the mounting holes 1406, 1407. Corresponding bolts for the heat sink 1404 and tray 1405 are inserted through the mounting holes 1406, 1407 and tightened to their corresponding nuts to individually secure the heat sink 1404 and tray 1405 to the electronic circuit board 1401. In order to effect spring loading, each mount also includes a spring that is compressed between the bolt head and the heat sink or tray (the spring tries to expand under compression which presses the heat sink and tray toward the electronic circuit board 1401).

A problem with the prior art add-in card 1400 is the existence of the eight mounting holes 1406, 1407 in the electronic circuit board 1401 in the vicinity of the HPC 1403. Each hole restricts the area of the electronic circuit board 1401 that is available for routing signal wires, power busses or other electrical wiring within the electronic circuit board 1401 to/from the HPC 1403.

More specifically, each of the mounting holes 1406, 1407 has a corresponding "keep out zone" (KOZ) within a set radius about the center of the hole that electrical wires within the electronic circuit board 1401 are prohibited from running through. The KOZ is enforced so that weight supporting structures can be integrated around the holes, and/or, damage to electrical wiring near the hole (as a consequence of the circuit board 1401 bending in response to the mounting of the heat sink 1404 and/or tray 1405) can be avoided.

With a KOZ around each of eight mounting holes 1406, 1407, significant area of the electronic circuit board 1401 near the HPC 1403 is unavailable for any electrical wiring structures.

A solution, observed in FIG. 15, is to use a same bolt 1511 for spring loaded attachment of both the tray 1505 and the heat sink 1504 to the electronic circuit board 1501. By using a same bolt 1511 to attach both the tray 1505 and the heat sink 1504 to the electronic circuit board 1501, the number of bolt-holes and corresponding KOZs are, e.g., halved as compared to the prior art approach.

For example, if the heat sink 1504 and the tray 1505 each include four different points of attachment to the electronic circuit board 1501 in the vicinity of the HPC, with the improved approach of FIG. 15, the four attachment points are vertically aligned as between the tray and the heat sink. FIG. 15 depicts one of these attachment points. Here, respective mounting holes 1521, 1522 in the heat sink base 1504 and tray 1505 are vertically aligned with one another and with a corresponding hole 1523 in the electronic circuit board 1501.

With all four of the tray's and heat sink's attachment points being vertically aligned as observed in FIG. 15, only four holes are formed in the electronic circuit board 1501 in the vicinity of the HPC (rather than eight as in the prior art approach). The reduction (from eight circuit board holes to four circuit board holes) increases the area of the electronic circuit board 1501 that is available for signal wiring in the vicinity of the HPC by an amount that is comparable to the surface area of a KOZ ($A_{KOZ}$) multiplied by the number of eliminated through holes in the electronic circuit board 1501 (e.g., $4A_{KOZ}$ in the above example).

Increasing the area of the electronic circuit board 1501 available for signal wiring in the vicinity of the HPC is particularly helpful considering that the number of input/outputs (I/Os) per HPC is expected to increase with future semiconductor chip manufacturing technologies (which drives more signal wires in the vicinity of the HPC) and the size and power dissipation per HPC is expected to increase with future semiconductor chip manufacturing technologies (which drives increasing attachment points to the electronic circuit board and/or larger KOZ surface areas in the vicinity of the HPC).

Here, an HPC includes GPUs but is not limited to GPUs. That is, any add-in card having any kind of HPC can employ the improved bolt approach described just above with respect to FIG. 15. As such, the HPC can be any of a GPU, system-on-chip (SOC), central processing unit (CPU), accelerator (XPU), data processing unit (DPU), infrastructure processing unit (IPU), neural network chip, inference engine chip, artificial intelligence engine chip, etc. Moreover, various embodiments can include more than one HPC (e.g., depending on the form factor size of the add-in card).

As described just above, the holes 1521, 1522, 1523 that are formed in the base of the heat sink 1504, the tray 1505 and the electronic circuit board 1501 are vertically aligned to accommodate only a single bolt 1511 at the attachment point to the electronic circuit board 1501 for both the heat sink 1504 and the tray 1505. Additionally, different respective spring elements 1513, 1514 are used to attach the base of the heat sink 1504 and the tray 1505 to the electronic circuit board 1501 in a spring loaded fashion (a first spring element 1513 provides spring loaded attachment to the electronic circuit board 1501 for the heat sink 1504, whereas, a second spring element 1514 provides spring loaded attachment to the electronic circuit board 1501 for the tray 1505).

Notably, both spring elements 1513, 1514 are compressed by the movement of the bolt head 1515 toward the circuit board 1501 as the nut 1512 is tightened and the bolt 1511 advances through the threads in the nut 1512. The compression of both spring elements 1513, 1514 by the bolt head 1515 and the vertical alignment of the holes 1522, 1523 in the heat sink 1504 and tray 1505 to accommodate the single bolt 1511 result in both spring elements 1513, 1514 residing in space between the bolt head 1515 and the base of the heat sink 1504.

Additionally, the spring element 1514 that couples to the tray 1505, runs through the hole 1521 that is formed in the base of the heat sink 1504 to accommodate the bolt 1511. Thus, the spring element 1514 that creates spring loaded attachment between the electronic circuit board 1501 and the tray 1505 extends through the hole 1521 that is formed in the base of the heat sink 1504 to accommodate the bolt 1511.

FIG. 16 shows an exemplary embodiment of the approach of FIG. 15. In the particular approach of FIG. 16, coil springs 1613, 1614, because of their cylindrical shape, are chosen as the spring elements for the heat sink 1604 and tray 1605 attachment, respectively. Specifically, the radius of a first coil spring 1613 for the heat sink 1604 attachment is larger than the radius of the hole 1621 in the heat sink 1604 that is formed to accommodate the bolt 1611. This arrangement causes the first coil spring 1613 to be compressed between the head of the bolt 1615 and the heat sink 1604 when the bolt 1611 is tightened to the electronic circuit board 1601 (the diameter of the first coil spring 1613 is wider than the hole opening 1621 in the heat sink 1604 and therefore cannot pass through the hole opening 1621).

By contrast, the radius of the second coil spring 1614 for the tray attachment is less than the radius of the hole 1621 in the heat sink 1604. As such, the second coil spring 1614 can pass through the hole 1621 in the heat sink 1604 and reach the tray 1605. At the same time, the radius of the second coil spring 1614 is greater than the hole 1622 in the tray 1605 that is formed to accommodate the bolt 1611. This arrangement causes the second coil spring 1614 to be compressed between the head of the bolt 1615 and the tray 1605 when the bolt 1611 is tightened to the electronic circuit board 1601 (the diameter of the second coil spring 1614 is larger than the hole opening 1622 in the tray 1605 and therefore cannot pass through the hole opening 1622).

The bolt 1611 is inserted in the inner open space of the second coil spring 1614 and runs through the holes 1621, 1622, 1633 in the heat sink 1604, tray 1605 and electronic circuit board 1601. The bolt 1611 is tightened with a nut 1612 on the back side of the electronic circuit board 1601 (the side of the electronic circuit board opposite the HPC and heat sink 1604). As the nut 1612 is tightened, the bolt head 1615 advances toward the heat sink 1604 and tray 1605. The advancement compresses the first coil spring 1613 between the bolt head 1615 and the heat sink 1604, and, compresses the second coil spring 1614 between the bolt head 1615 and the tray 1605.

The compression of the coil springs 1613, 1614 effects spring loading between the electronic circuit board 1601 and the heat sink 1604 and the electronic circuit board 1601 and the tray 1605. That is, the first coil spring 1613 resists the compression by attempting to expand outward which drives the heat sink 1604 toward the electronic circuit board 1601 thereby actively driving their mechanical coupling. Likewise, the second coil spring 1614 resists the compression by attempting to expand outward which drives the tray 1605 toward the electronic circuit board 1601 thereby driving their mechanical coupling.

In various embodiments the tray is mounted on studs/posts that emanate from the surface of the PCB (not shown in FIG. 16). In the particular embodiment of FIG. 16, the tray is first mounted to the electronic circuit board 1601 with back side bolts 1616. The heat sink 1604 is then placed on the HPC and tray 1605. The second coil spring 1614 is inserted through the hole 1621 in the heat sink 1604 and approximately centered about the hole 1622 in the electronic circuit board 1601. The first coil spring 1613 is placed on the heat sink 1604 and approximately centered about the hole 1621 in the electronic circuit board 1601 and the second coil spring 1614. The bolt 1611 is then inserted into the open center region of the second coil spring 1614, through the holes 1621, 1622 and 1623 in the heat sink 1604, tray 1605 and electronic circuit board 1601 and then tightened with the back side nut 1612.

FIG. 17 shows another approach that employs similar concepts as the approach of FIG. 15 but where the loading force is exerted through expansion of the spring elements rather than compression.

As observed in FIG. 17, the bolt has three distinct regions of different diameter: 1) a first, upper region 1731 having widest diameter; 2) a second middle region 1732 having a medium diameter ("mid-diameter"); and, 3) a third lower region 1733 having a smallest diameter. The first and second spring elements 1713, 1714 are also fixed at one end to the underside of the heat sink base 1704 and the tray 1705, respectively. Here, for example, the heat sink base 1704 and tray 1705 each include a ring, clamp, strap, finger to secure the corresponding spring elements 1713, 1714 to the underside of the heat sink base 1704 and tray 1705.

During assembly, the bolt is inserted through the aligned holes 1721, 1722, 1723 in the heat sink base 1704, tray 1705 and electronic circuit board 1701. Here, during the insertion, region 1733 of the bolt 1711 passes straight through the spring elements 1713, 1714 and the holes 1721, 1722 in the heat sink base 1704 and tray 1705 because of its small diameter (the spring elements 1713, 1714 include holes, e.g., as with coil springs, but are not necessarily implemented as coil springs). Finally, the tip of region 1733 threads into nut 1712 because nut 1712 has a diameter that is comparable to (e.g., slightly smaller than) the diameter of region 1733.

With the tip of the bolt 1711 being threaded into the nut 1712, the nut 1712 is turned to advance the bolt 1711 further through the nut 1712 which, in turn, drives the bolt head 1715 closer to the printed circuit board 1701. Commensurate with the bolt 1711 being inserted through the holes 1721, 1722, 1723 and/or being threaded through the nut 1712, the mid-diameter region 1732 of the bolt 1711 engages with the second spring element 1714 and the larger diameter region 1731 of the bolt 1711 engages with the first spring element 1713.

Here, during insertion of the bolt, the mid diameter region 1732 of the bolt 1731 passes through the first spring element 1713 owing to an opening with the spring element that is larger than the diameter of the mid diameter region 1732. However, upon further insertion and/or threading, the leading edge of the mid diameter region 1732 is "caught" by a finger, tab, or other feature that extends inward within the opening of the second spring element 1714. Likewise, upon the further insertion and/or threading, the leading edge of the largest diameter region 1731 is "caught" by a finger, tab, or other feature that extends inward within the opening of the first spring element 1713.

Once the first and second spring elements 1713, 1714 are respectively caught by the widest and mid diameter regions 1731, 1732 of the bolt, further advancement of the bolt 1711 toward the electronic circuit board 1701 stretches/expands the spring elements 1713, 1714. That is, the widest diameter region 1731 of the bolt 1711 stretches the lower end of the first spring element 1713 toward the printed circuit board 1701 and the mid diameter region 1732 of the bolt 1711 stretches the lower end of the second spring element 1714 toward the printed circuit board 1701.

With the opposite ends of the spring elements 1713, 1714 being secured to the heat sink base 1704 and tray 1705, respectively, the stretching of the spring elements 1713, 1714 induces loading forces that pull the heat sink base 1704 and tray toward the electronic circuit board 1701 (the spring elements 1713, 1714 resists their stretching by pulling the heat sink base 1704 and tray 1705 toward the electronic circuit board. A post 1716 that emanates, e.g., from the tray 1705 or the printed circuit board 1701 (as depicted in FIG. 17) limits advancement of the heat sink base 1704 toward the circuit board 1701 in response to the tightening which results in expansion of the spring element 1713. A similar post (not shown) can emanate, e.g., from the circuit board 1701 to limit advancement of the tray 1705 toward the circuit board 1701 during tightening thereby resulting in expansion of spring element 1714.

As with the embodiment of FIG. 16, the spring elements 1713, 1714 in the approach of FIG. 17 can also employ coil springs. Here, smaller radius cylindrical regions of the bolt simply pass through larger radius cylindrical openings in the spring elements, where appropriate, consistent with the teachings just above. Note that the holes 1721, 1722 in the heat sink base 1704 and tray 1705 can have same diameter and need not have different diameter.

Note that is both the approach of FIG. 15 and the approach of FIG. 17 the spring elements are deformed from their nominal shape to effect the aforementioned spring loaded (in the approach of FIG. 15 the spring elements are compressed from their nominal shape whereas in the approach of FIG. 17 the spring elements are expanded from their nominal shape). Although embodiments above have stressed the use of coil springs for the spring elements, in other embodiments other types of springs can be used. Examples include leaf springs, torsion springs, and disc springs.

Note that other embodiments can combined the approaches of FIGS. 15 and 17 in a same solution. For example, in the approach of FIG. 17, the second spring element 1714 can be placed on top of the tray 1705 and be compressed by the same leading edge of the wide region 1731 of the bolt 1711 that catches the first spring element 1713. Thus, in this case, the first spring element exerts spring loading through expansion (as per the approach of FIG. 17) but the second spring element exerts spring loading through compression (as per the approach of FIG. 15).

The teachings above can also be applied to mechanical designs other than the specific mechanical design described above in which a tray resides between a heat sink base and an electronic circuit board. For example, in other embodiments the heat sink base is between the tray and the printed circuit board. In still other embodiments, the tray is replaced with some other kind of planar mechanical element that, e.g., is not necessarily used to support a fan or form an air flow channel between a fan and the heat sink and is instead used for some other supportive purpose (such as supporting another circuit board, etc.) or other purpose (e.g., a heat spreader that transfers heat from other chips besides the HPC to the heat sink).

The tray, therefore, can be generally described as a mechanical flooring element, or even more generally, a planar mechanical element. Likewise, the teachings above can be applied to other embodiments where the heat sink is replaced by another kind of cooling mass such as a cold plate for liquid cooled solutions or a vapor chamber for two phase cooling solutions.

In various embodiments the bolt can be replaced by a screw (e.g., by replacing the nut with solid plastic that the screw forms its own threads within). For ease of explanation, the "bolt" is also used herein to refer to a screw or any other kind of vertical shaft that secures an electrical circuit board to a cooling mass and a planar mechanical element as described above.

Moreover, although the mechanical design of FIG. 15 was made in reference to a Peripheral Components Interconnect Express (PCIe) form factor add-in card (having a connector with corresponding PCIe electro-mechanical interface), in other embodiments the mechanical design is applied to other form factor add-in cards such as an Open Compute Project Accelerator Module (OAM) having a Compute Express Link (CXL) interface at the card connector.

The various add-in card embodiments described above can be plugged into various electronic systems such as a computer system as described above in FIG. 1 (e.g., as any of an external graphics processor 118 or external accelerator 119). Additionally, although the various add-in card embodiments described above can include high performance semiconductor chips other than a GPU, to the extent a GPU is included, the GPU can be designed according to the teachings of any of FIGS. 2B through 13B above.

Examples of a compact form factor cooling assembly retention system follow:

Example 1: An apparatus, that includes a bolt, a first spring element, and a second spring element. The bolt is to be inserted through a first hole in a cooling mass, a second hole in a planar mechanical element and a third hole in an electronic circuit board when the first, second and third holes are aligned. The first spring element is to be coupled to the cooling mass and the bolt, the first spring element to be deformed from its nominal shape when the bolt is fastened to the electronic circuit board to draw the base of the cooling mass toward the electronic circuit board. The second spring element is to be coupled to the planar mechanical element and the bolt, the second spring element to be deformed from its nominal shape to draw the planar mechanical element toward the electronic circuit board.

Example 2: the apparatus of example 1 wherein the cooling mass is a heat sink.

Example 3: the apparatus of examples 1 or 2 wherein the planar mechanical element is a tray that supports a fan that is to blow air through fins of the heat sink.

Example 3: the apparatus of any of examples 1-3 wherein the tray is between the base of the heat sink and the electronic circuit board.

Example 4: the apparatus of any of examples 1-4 wherein the first and second spring elements are compressed by a head of the bolt.

Example 5: the apparatus of any of examples 1-5 wherein one of the first and second spring elements is between the other of the first and second spring elements and a shaft of the bolt where the first and second spring elements make contact with the head of the bolt.

Example 6: the apparatus of any of examples 1-5 wherein one of the first and second spring elements is inserted through one of the first and second holes.

Example 7: A cooling assembly that includes a bolt, a base of a cooling mass, a planar mechanical element, a first spring element and a second spring element. The bolt is fastened to an electronic circuit board. The base of the cooling mass is between a head of the bolt and the electronic circuit board, the bolt inserted through a first hole in the base of the cooling mass. The planar mechanical element is between the head of the bolt and the electronic circuit board, the bolt inserted through a second hole in the planar mechanical element, the first and second holes being aligned with a third hole in the electrical circuit board that the bolt is inserted through. The first spring element is coupled to the base of the cooling mass and the bolt, the first spring element being deformed from its nominal shape to draw the base of the cooling mass toward the electronic circuit board. The second spring element is coupled to the planar mechanical element and the bolt, the second spring element being deformed from its nominal shape to draw the planar mechanical element toward the electronic circuit board.

Example 8: the cooling assembly of example 7 that further includes matter that is in accordance with any of examples 2-6.

Example 9: An add-in card having a semiconductor chip, a bolt, a cooling mass and a planar mechanical element. The semiconductor chip is electrically coupled to an electronic circuit board. The bolt is fastened to the electronic circuit board. The cooling mass is coupled to the semiconductor chip's package, a base of the cooling mass between a head of the bolt and the electronic circuit board, the bolt inserted through a first hole in the base of the cooling mass. The planar mechanical element is between the head of the bolt and the electronic circuit board, the bolt inserted through a second hole in the planar mechanical element, the first and second holes being aligned with a third hole in the electrical circuit board that the bolt is inserted through. The first spring element is coupled to the base of the cooling mass and the bolt, the first spring element being deformed from its nominal shape to draw the base of the cooling mass toward the electronic circuit board. The second spring element is coupled to the planar mechanical element and the bolt, the second spring element being deformed from its nominal shape to draw the planar mechanical element toward the electronic circuit board.

Example 10: the add-in card of example 9 further including a PCIe connector connected to the electronic circuit board.

Example 11: the add-in card of examples 9 or 10 wherein the system on chip comprises any of: graphics processor circuitry; accelerator circuitry; neural network circuitry.

Example 12: the add-in card of any of examples 9-11 wherein the cooling mass is a heat sink.

Example 13: the add-in card of any of examples 9-12 wherein the planar mechanical element is a tray that supports a fan that is to blow air through fins of the heat sink.

Example 14: the add-in card of any of examples 9-13 wherein the tray is between the base of the heat sink and the electronic circuit board.

Diagrams describing a methodology as illustrated herein provide examples of sequences of various process actions. Such diagrams can indicate operations to be executed by a software or firmware routine, as well as physical operations. Such diagrams can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

The invention claimed is:

1. An apparatus, comprising:
a bolt to be inserted through a first hole in a cooling mass, a second hole in a planar mechanical element and a third hole in an electronic circuit board when the first, second and third holes are aligned;
a first spring element to be coupled to the cooling mass and the bolt, the first spring element to be deformed from its nominal shape when the bolt is fastened to the electronic circuit board to draw a base of the cooling mass toward the electronic circuit board; and
a second spring element to be coupled to the planar mechanical element and the bolt, the second spring element to be deformed from its nominal shape to draw the planar mechanical element toward the electronic circuit board.

2. The apparatus of claim 1 wherein the cooling mass is a heat sink.

3. The apparatus of claim 2 wherein the planar mechanical element is a tray that supports a fan that is to blow air through fins of the heat sink.

4. The apparatus of claim 3 wherein the tray is between the base of the heat sink and the electronic circuit board.

5. The apparatus of claim 1 wherein the first and second spring elements are compressed by a head of the bolt.

6. The apparatus of claim 5 wherein one of the first and second spring elements is between another of the first and second spring elements and a shaft of the bolt where the first and second spring elements make contact with the head of the bolt.

7. The apparatus of claim 5 wherein one of the first and second spring elements is inserted through one of the first and second holes.

8. A cooling assembly, comprising:
a bolt fastened to an electronic circuit board;
a base of a cooling mass between a head of the bolt and the electronic circuit board, the bolt inserted through a first hole in the base of the cooling mass;
a planar mechanical element between the head of the bolt and the electronic circuit board, the bolt inserted through a second hole in the planar mechanical element, the first and second holes being aligned with a third hole in an electronic circuit board that the bolt is inserted through;
a first spring element that is coupled to the base of the cooling mass and the bolt, the first spring element being deformed from its nominal shape to draw the base of the cooling mass toward the electronic circuit board; and,
a second spring element that is coupled to the planar mechanical element and the bolt, the second spring element being deformed from its nominal shape to draw the planar mechanical element toward the electronic circuit board.

9. The cooling assembly of claim 8 wherein the cooling mass is a heat sink.

10. The cooling assembly of claim 9 wherein the planar mechanical element is a tray that supports a fan that is to blow air through fins of the heat sink.

11. The cooling assembly of claim 10 wherein the tray is between the base of the heat sink and the electronic circuit board.

12. The cooling assembly of claim 8 wherein the first and second spring elements are compressed by a head of the bolt.

13. The cooling assembly of claim 12 wherein one of the first and second spring elements is between another of the first and second spring elements and a shaft of the bolt where the first and second spring elements make contact with the head of the bolt.

14. The cooling assembly of claim 12 wherein one of the first and second spring elements is inserted through one of the first and second holes.

15. An add-in card, comprising:
a semiconductor chip electrically coupled to an electronic circuit board;
a bolt fastened to the electronic circuit board;
a cooling mass coupled to a semiconductor chip's package, a base of the cooling mass between a head of the bolt and the electronic circuit board, the bolt inserted through a first hole in the base of the cooling mass;
a planar mechanical element between the head of the bolt and the electronic circuit board, the bolt inserted through a second hole in the planar mechanical element, the first and second holes being aligned with a third hole in the electronic circuit board that the bolt is inserted through;
a first spring element that is coupled to the base of the cooling mass and the bolt, the first spring element being deformed from its nominal shape to draw the base of the cooling mass toward the electronic circuit board; and,
a second spring element that is coupled to the planar mechanical element and the bolt, the second spring element being deformed from its nominal shape to draw the planar mechanical element toward the electronic circuit board.

16. The add-in card of claim 15 further comprising a PCIe connector connected to the electronic circuit board.

17. The add-in card of claim 15 wherein the semiconductor chip comprises any of:
graphics processor circuitry;
accelerator circuitry;
neural network circuitry.

18. The add-in card of claim 15 wherein the cooling mass is a heat sink.

19. The add-in card of claim 18 wherein the planar mechanical element is a tray that supports a fan that is to blow air through fins of the heat sink.

20. The add-in card of claim 19 wherein the tray is between the base of the heat sink and the electronic circuit board.

* * * * *